_(12)_ United States Patent
Na et al.

(10) Patent No.: US 10,390,451 B2
(45) Date of Patent: Aug. 20, 2019

(54) DISPLAY DEVICE

(71) Applicant: LG ELECTRONICS INC., Seoul (KR)

(72) Inventors: Seokhun Na, Seoul (KR); Taegon Kim, Seoul (KR); Youngkyoung Kim, Seoul (KR); Hyojin Won, Seoul (KR); Yongho Lee, Seoul (KR); Hyeyoung Hong, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/855,851

(22) Filed: Dec. 27, 2017

(65) Prior Publication Data

US 2018/0184534 A1 Jun. 28, 2018

(30) Foreign Application Priority Data

Dec. 27, 2016 (KR) .................. 10-2016-0180396
Jan. 4, 2017 (KR) .................. 10-2017-0001212

(51) Int. Cl.
*H05K 7/02* (2006.01)
*H05K 7/04* (2006.01)
*H05K 5/02* (2006.01)
*H05K 5/00* (2006.01)
*H05K 5/03* (2006.01)
*F16B 5/07* (2006.01)
*F16B 21/09* (2006.01)
*F16M 11/04* (2006.01)
(Continued)

(52) U.S. Cl.
CPC ............ *H05K 5/0234* (2013.01); *F16B 5/07* (2013.01); *F16B 17/00* (2013.01); *F16B 21/09* (2013.01); *F16M 11/041* (2013.01); *F16M 11/16* (2013.01); *F16M 13/02* (2013.01); *H05K 5/0017* (2013.01); *H05K 5/03* (2013.01); *F16M 2200/08* (2013.01); *H01L 27/3244* (2013.01); *H01L 51/5237* (2013.01)

(58) Field of Classification Search
USPC ........................................ 361/807, 809, 810
See application file for complete search history.

(56) References Cited

U.S. PATENT DOCUMENTS 3,239,178 A    3/1966 Pompa
7,768,775 B2 * 8/2010 Kim ....................... H05K 5/02
                                                          248/284.1
(Continued)

FOREIGN PATENT DOCUMENTS

EP            3029543           6/2016

OTHER PUBLICATIONS

European Patent Office Application Serial No. 17206070.9, Search Report dated May 30, 2018, 9 pages.

*Primary Examiner* — Hung S. Bui
(74) *Attorney, Agent, or Firm* — Lee, Hong, Degerman, Kang & Waimey PC

(57) ABSTRACT

A display device is disclosed. The display device includes a display panel, a module cover positioned at a rear of the display panel and coupled to the display panel, a plate positioned at a rear of the module cover, an adhesive member attached to at least a part of a front surface of the plate, a bracket positioned between the module cover and the plate and attached to the adhesive member, and a coupling unit positioned between the module cover and the bracket and fixing the module cover to the bracket.

12 Claims, 63 Drawing Sheets

(51) Int. Cl.
*F16M 11/16* (2006.01)
*F16M 13/02* (2006.01)
*F16B 17/00* (2006.01)
H01L 51/52 (2006.01)
H01L 27/32 (2006.01)

(56) References Cited

U.S. PATENT DOCUMENTS

| | | | | |
|---|---|---|---|---|
| 8,245,992 | B2* | 8/2012 | Matsui | F16M 13/02 |
| | | | | 248/224.51 |
| 8,472,191 | B2* | 6/2013 | Yamamoto | H05K 7/20963 |
| | | | | 165/104.33 |
| 2005/0127260 | A1 | 6/2005 | Dittmer | |
| 2005/0264985 | A1* | 12/2005 | Kim | H05K 5/02 |
| | | | | 361/679.21 |
| 2010/0288524 | A1* | 11/2010 | Tagawa | H01J 29/87 |
| | | | | 174/50.5 |
| 2010/0289401 | A1* | 11/2010 | Ohtomo | F16M 11/105 |
| | | | | 313/495 |
| 2014/0061409 | A1 | 3/2014 | Mayhew, Jr. | |

* cited by examiner (a)   (b)

(a)

(b)

(a)

(b)

(a)

(b)

(a)

(b)

(a)

(b)

DISPLAY DEVICE

Pursuant to 35 U.S.C. § 119(a), this application claims the benefit of earlier filing date and right of priority to Korean Patent Application Nos. 10-2016-0180396, filed on Dec. 27, 2016 and 10-2017-0001212, filed on Jan. 4, 2017, the contents of which are all hereby incorporated by reference herein in their entirety.

BACKGROUND OF THE INVENTION

Field of the Invention

The present disclosure relates to a display device.

Discussion of the Related Art

With the development of the information society, various demands for display devices have been increasing. Various display devices, such as, e.g., liquid crystal displays (LCDs), plasma display panels (PDPs), electroluminescent displays (ELDs), and vacuum fluorescent displays (VFDs), have been studied and used to meet various demands for the display devices.

Among the display devices, an organic light emitting diode (OLED) display using organic light emitting diodes has advantages of a higher luminance and a wider viewing angle than a liquid crystal display. In addition, the OLED display has an advantage of an ultra-thin profile because it does not require a backlight unit.

Recently, many studies have been made on an assembly structure of the display devices.

SUMMARY OF THE INVENTION

Accordingly, an object of the present disclosure is to address the above-described and other problems.

Another aspect of the present disclosure is to provide a display device capable of firmly fixing a plate by pressing a stand base and a stand supporter through a fixing member.

Another aspect of the present disclosure is to provide a display device capable of being assembled more easily and quickly by fastening a fixing member to a stand base and a stand supporter in an oblique direction.

Another aspect of the present disclosure is to provide a display device capable of firmly fixing a bracket to a plate by preventing a rear surface of the bracket from being stepped out when a module cover is fastened to the bracket.

Another aspect of the present disclosure is to provide a display device capable of fastening a stand to a plate without forming a separate hole in the plate.

Another aspect of the present disclosure is to provide a display device in which a fastening means is not exposed to the outside by disposing the fastening means for fastening a plate on a lower part of the plate when a stand is fastened to the plate.

Another aspect of the present disclosure is to provide a display device capable of preventing the misassembly by designing a stand so that a user easily recognizes a front-rear assembly direction of the stand when assembling the stand with a plate.

In one aspect, there is provided a display device comprising a display panel; a module cover at a rear of the display panel, the module cover being coupled to the display panel; a plate at a rear of the module cover; an adhesive member attached to at least a part of a front surface of the plate; a bracket between the module cover and the plate, the bracket being attached to the adhesive member; and a coupling unit between the module cover and the bracket, the coupling unit fixing the module cover to the bracket.

According to at least one aspect of the present disclosure, the present disclosure can firmly fix the plate by pressing the stand base and the stand supporter through the fixing member.

According to at least one aspect of the present disclosure, the present disclosure can assembly the display device more easily and quickly by fastening the fixing member to the stand base and the stand supporter in the oblique direction.

According to at least one aspect of the present disclosure, the present disclosure can firmly fix the bracket to the plate by preventing a rear surface of the bracket from being stepped out when the module cover is fastened to the bracket, thereby stably fixing the display panel to the plate.

According to at least one aspect of the present disclosure, the present disclosure can fasten the stand to the plate without forming a separate hole in the plate, and thus simplify the manufacturing process and reduce the manufacturing cost.

According to at least one aspect of the present disclosure, the present disclosure can improve a freedom of design because a separate hole does not need to be formed in the plate.

According to at least one aspect of the present disclosure, the present disclosure can further improve an appearance of the display device because a fastening means is not exposed to the outside by disposing the fastening means for fastening the plate on a lower part of the plate when the stand is fastened to the plate.

According to at least one aspect of the present disclosure, the present disclosure can prevent the misassembly of the display device by designing the stand so that a user easily recognizes a front-rear assembly direction of the stand when assembling the stand with the plate, thereby reducing an assembly time. Hence, the present disclosure can improve the convenience of the user while reducing the assembly time of the display device.

According to at least one aspect of the present disclosure, the present disclosure can properly correspond to various external environments by forming a buffer member between the stand and the plate. Hence, the present disclosure can change conditions such as a thickness and hardness of the buffer member depending on the external environments and thus firmly fix the stand to the plate, thereby improving reliability of the display device.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
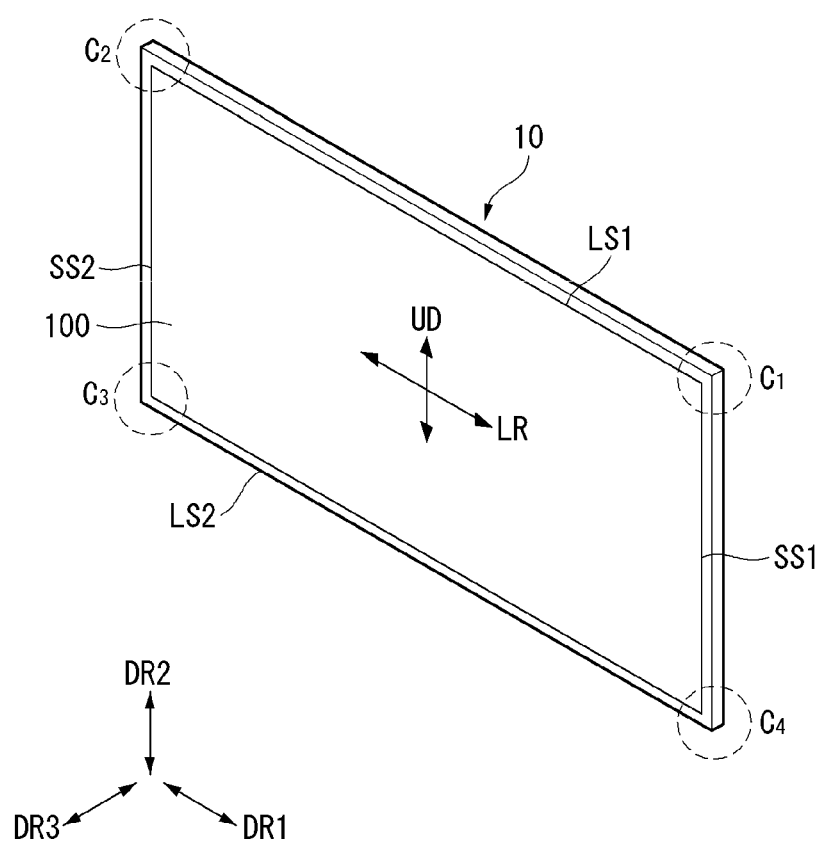
FIGS. 1 to 5 illustrate examples of a display device related to the present disclosure.

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component (s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity.

Hereinafter, embodiments of the disclosure are described using an organic light emitting diode (OLED) display panel as an example of a display panel. Other display panels may be used. For example, a plasma display panel (PDP), a field emission display (FED) panel, and a liquid crystal display panel may be used.

Referring to FIG. 1, a display panel 100 or a head 10 may include a first long side LS1, a second long side LS2 opposite the first long side LS1, a first short side SS1 adjacent to the first long side LS1 and the second long side LS2, and a second short side SS2 opposite the first short side SS1.

In embodiments disclosed herein, the first short side SS1 may be referred to as a first side area; the second short side SS2 may be referred to as a second side area opposite the first side area; the first long side LS1 may be referred to as a third side area that is adjacent to the first side area and the second side area and is positioned between the first side area and the second side area; and the second long side LS2 may be referred to as a fourth side area that is adjacent to the first side area and the second side area, is positioned between the first side area and the second side area, and is opposite to the third side area.

Embodiments of the disclosure describe and illustrate that lengths of the first and second long sides LS1 and LS2 are longer than lengths of the first and second short sides SS1 and SS2 for convenience of explanation. However, the lengths of the first and second long sides LS1 and LS2 may be almost equal to the lengths of the first and second short sides SS1 and SS2.

In the following description, a first direction DR1 may be a direction parallel to the long sides LS1 and LS2 of the display panel 100, and a second direction DR2 may be a direction parallel to the short sides SS1 and SS2 of the display panel 100. Further, a third direction DR3 may be a direction perpendicular to the first direction DR1 and/or the second direction DR2.

In another point of view, a side or a surface, on which the head 10 of a display device displays an image, may be referred to as a front side or a front surface. When the head 10 of the display device displays the image, a side or a surface, at which the image cannot be observed, may be referred to as a rear side or a rear surface. When the head 10 of the display device is observed at the front side or the front surface, the first long side LS1 may be referred to as an upper side or an upper surface. In the same manner as the first long side LS1, the second long side LS2 may be referred to as a lower side or a lower surface. Further, the first short side SS1 may be referred to as a left side or a left surface, and the second short side SS2 may be referred to as a right side or a right surface.

The first long side LS1, the second long side LS2, the first short side SS1, and the second short side SS2 may be referred to as edges of the head 10 of the display device. Positions where the first long side LS1, the second long side LS2, the first short side SS1, and the second short side SS2 meet one another may be referred to as corners. For example, a position where the first long side LS1 and the first short side SS1 meet each other may be referred to as a first corner C1; a position where the first long side LS1 and the second short side SS2 meet each other may be referred to as a second corner C2; a position where the second short side SS2 and the second long side LS2 meet each other may be referred to as a third corner C3; and a position where the second long side LS2 and the first short side SS1 meet each other may be referred to as a fourth corner C4.

In embodiments disclosed herein, a direction from the first short side SS1 to the second short side SS2 or a direction from the second short side SS2 to the first short side SS1 may be referred to as a left-right direction LR. A direction from the first long side LS1 to the second long side LS2 or from the second long side LS2 to the first long side LS1 may be referred to as an up-down direction UD.

Figure 2:
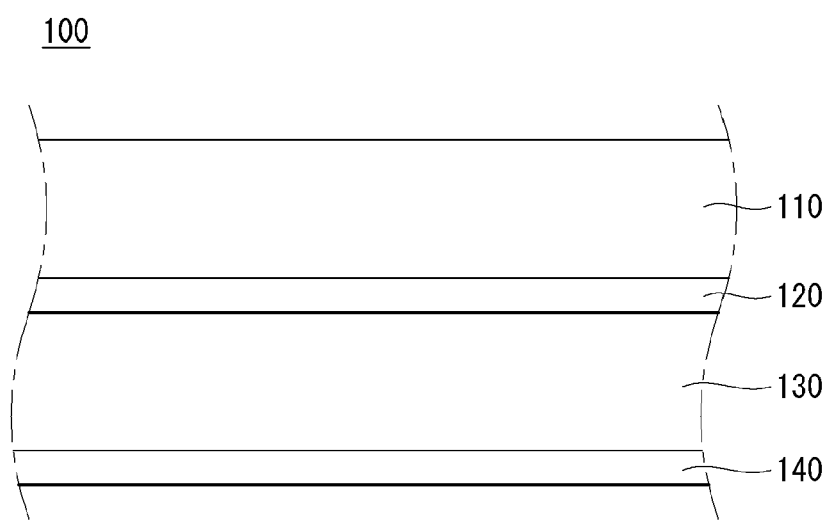

Referring to FIG. 2, the display panel 100 may include a transparent substrate 110, an upper electrode 120, an organic light emitting layer 130, and a lower electrode 140. The transparent substrate 110, the upper electrode 120, the organic light emitting layer 130, and the lower electrode 140 may be sequentially formed.

The transparent substrate 110 and the upper electrode 120 may include a transparent material, for example, indium tin oxide (ITO). The lower electrode 140 may include a non-transparent material. However, embodiments are not limited thereto. The lower electrode 140 may include a transparent material, for example, indium tin oxide (ITO). In this case, light may be emitted to a surface of the lower electrode 140.

When a voltage is applied to the upper electrode 120 and lower electrode 140, light emitted from the organic light emitting layer 130 may be transmitted by the upper electrode 120 and the transparent substrate 110 and may be emitted to the outside. In this instance, a light shielding plate may be further formed behind the lower electrode 140, in order to emit forward light emitted to the lower electrode 140.

For example, the display device according to the embodiment of the disclosure may be an organic light emitting diode (OLED) display. An active matrix OLED display includes organic light emitting diodes (OLEDs) capable of emitting light by themselves and has advantages of a fast response time, high emission efficiency, a high luminance, and a wide viewing angle.

The OLED serving as a self-emitting element includes an anode electrode, a cathode electrode, and an organic compound layer between the anode electrode and the cathode electrode. The organic compound layer a hole injection layer, a hole transport layer, an emission layer, an electron transport layer, and an electron injection layer. When a driving voltage is applied to the anode electrode and the cathode electrode, holes passing through the hole transport layer and electrons passing through the electron transport layer move to the emission layer to form hole-electron pairs, i.e., excitons. As a result, the emission layer generates visible light.

The OLED display has an advantage in reducing volume and weight because it does not separately require a light source. In addition, because the OLED display has a response time that is more than 1,000 times faster than a liquid crystal display, the OLED display may not generate image sticking when displaying an image.

Figure 3:
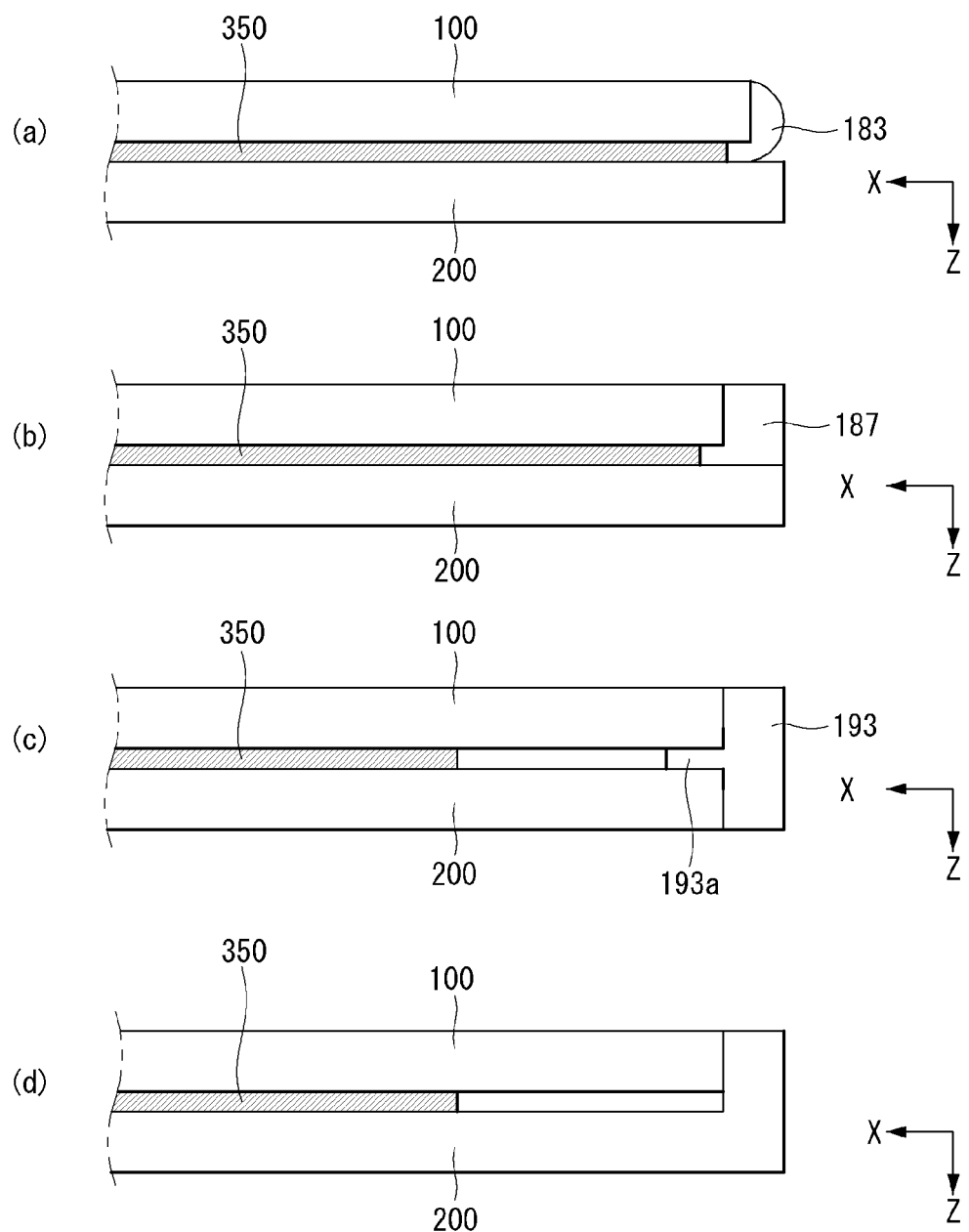

Referring to FIG. 3, the display panel 100 may be attached to a module cover 200 by an adhesive sheet 350. The adhesive sheet 350 may include a double-sided tape.

The adhesive sheet 350 may have a predetermined thickness. Thus, foreign substances or dust may enter between the display panel 100 and the module cover 200. In order to prevent this, as shown in (a) of FIG. 3, a sealing member 183 may be side-sealed to at least one side of the adhesive sheet 350. Hence, the sealing member 183 can shield at least one side of the adhesive sheet 350 and at least one side of the display panel 100 at the same time.

As another example, as shown in (b) of FIG. 3, a frame 187 may be inserted into at least one side of the adhesive sheet 350. The frame 187 may contact at least one side of the adhesive sheet 350 and may be bent so that one end of the frame 187 extends toward the display panel 100. Hence, the frame 187 can shield at least one side of the adhesive sheet 350 and at least one side of the display panel 100 at the same time.

As another example, as shown in (c) of FIG. 3, a middle cabinet 193 may be positioned between the display panel 100 and the module cover 200. The middle cabinet 193 may guide a coupling position of the display panel 100. A flange 193a of the middle cabinet 193 may be inserted between the display panel 100 and the module cover 200. A body of the middle cabinet 193 can shield at least one side of the display panel 100 and at least one side of the module cover 200 at the same time.

The flange 193a of the middle cabinet 193 may be spaced apart from the adhesive sheet 350. Thus, because the adhesive sheet 350 does not need to be entirely placed on the display panel 100, an amount of the adhesive sheet 350 required to manufacture the display device can be reduced.

As another example, as shown in (d) of FIG. 3, an edge portion of the module cover 200 may be bent toward the display panel 100. Because the edge portion of the module cover 200 is bent, at least one side of the adhesive sheet 350 can be shielded from the outside.

In this instance, another material does not need to be inserted between the display panel 100 and the module cover 200. Therefore, the manufacturing process of the display device can be simplified, and the manufacturing cost can be saved. Further, an edge of the module cover 200 can be spaced apart from the adhesive sheet 350. Thus, because the adhesive sheet 350 does not need to be entirely placed on the display panel 100, an amount of the adhesive sheet 350 required to manufacture the display device can be reduced.

In the following embodiments, structures positioned on the side of the adhesive sheet 350 are omitted for convenience of explanation. The structures positioned on the side of the adhesive sheet 350 are applicable to other embodiments.

Figure 4:
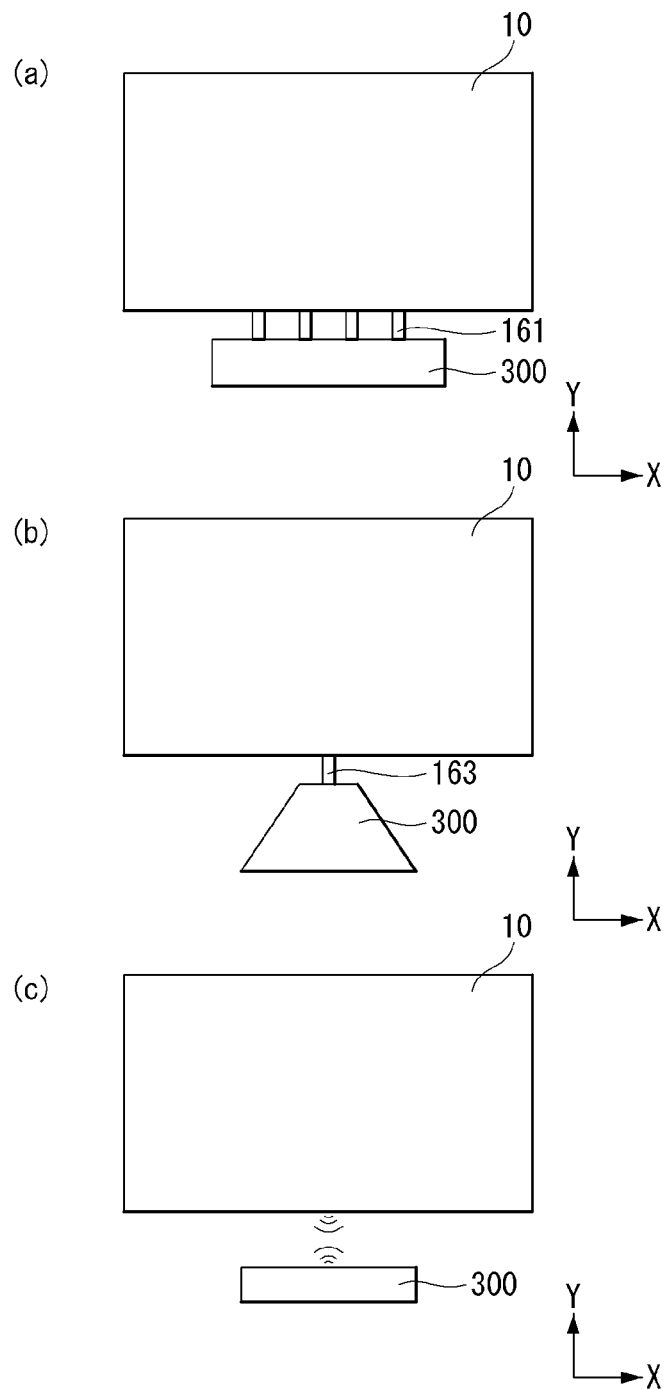

Referring to FIG. 4, the display device may include a housing 300 electrically connected to the head 10.

The housing 300 may transmit at least one driving signal to the head 10. The housing 300 may shield the components for driving the display device. For example, the housing 300 may shield at least one printed circuit board (PCB). A coupling structure and a coupling method of at least one printed circuit board will be described in detail later.

The housing 300 does not contact the head 10 and may be spaced apart from the head 10. Namely, the housing 300 may not be positioned on an image display portion of a display screen. Hence, a user can concentrate more on the display screen.

For example, as shown in (a) of FIG. 4, the housing 300 may be electrically connected to the head 10 through a plurality of flat cables 161 having a flat shape. The flat cable 161 may include a plurality of signal connection terminal pins and at least one ground terminal pin for connecting the housing 300 and the head 10. The flat cable 161 has an advantage of cheaper cost than other cables.

As another example, as shown in (b) of FIG. 4, the housing 300 may be coupled with the head 10 through one circular cable 163. Namely, unlike (a) of FIG. 4 that transmits the driving signals using the plurality of flat cables 161, the driving signals can be transmitted through one circular cable 163 in (b) of FIG. 4. Because the housing 300 and the head 10 are coupled through one circular cable 163, the user can feel that the appearance of the display device is neater.

As another example, as shown in (c) of FIG. 4, the housing 300 and the head 10 may transmit and receive the driving signals wirelessly. In this instance, the user can feel that the appearance of the display device is neater than when the housing 300 and the head 10 are coupled through the flat cables 161 shown in (a) of FIG. 4 or the circular cable 163 shown in (b) of FIG. 4. In addition, because the housing 300 and the head 10 wirelessly transmit and receive the driving signals, the structure shown in (c) of FIG. 4 can be freer with respect to constraints on a distance between the housing 300 and the head 10. Each of the housing 300 and the head 10 can be installed more freely within an allowable wireless range.

In the embodiment of the disclosure, the head 10 and the housing 300 may be spaced apart from each other. In other words, a plurality of drivers for driving the head 10 may be disposed in the housing 300, and the head 10 may be provided with a minimum number of parts for driving the screen. Hence, the thickness of the head 10 can be further reduced. As a result, the entire thickness of the display device can be further reduced by the thinner head 10.

Figure 5:
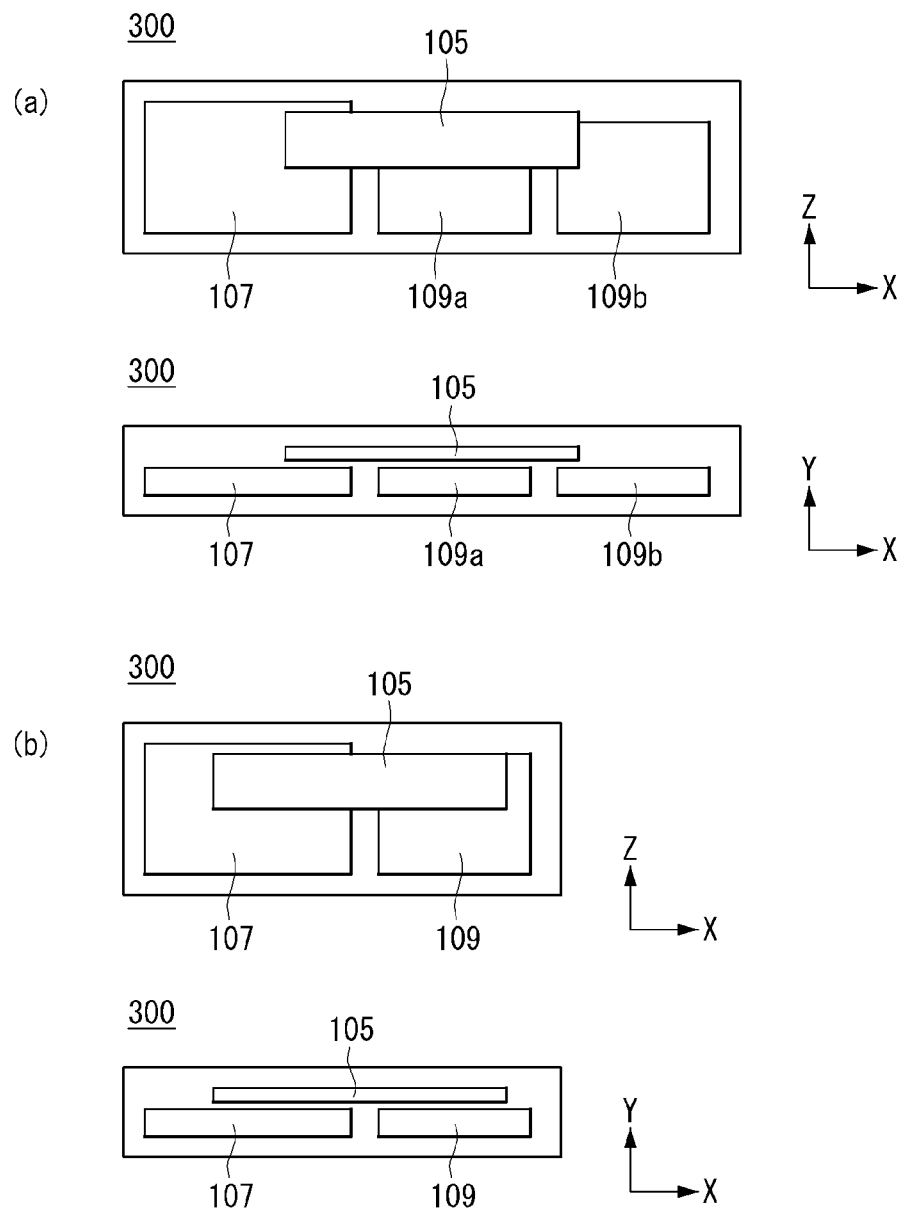

Referring to FIG. 5, at least one PCB may be positioned inside the housing 300. The PCBs inside the housing 300 may be spaced apart from each other. The PCBs inside the housing 300 may be spaced apart from each other and electrically connected to each other.

For example, at least one PCB may be a main board 109. The main board 109 may provide an interface for operating the display device. In addition, the main board 109 can check and manage operation states of the respective components of the display device and make the components in an optimum state.

As another example, at least one PCB may include a power supply 107. The power supply 107 may supply electric power to the display device. The power supply 107 is a device supplying electric power required to drive the head 10 as well as the main board 109. The power supply 107 may be supplied with AC power from the outside, convert the AC power into DC power, and supply the DC power to the main board 109 and the head 10. Thus, the power supply 107 can stably supply the DC power having a predetermined voltage or current to the main board 109 and the head 10.

As another example, at least one PCB may be a timing controller board 105. The timing controller board 105 may transmit an input driving signal to the display panel through the flat cable 161, the circular cable 163 or the like. Namely, the timing controller board 105 may transmit timing signals CLK, LOAD, and SPi and video signals R, G, and B for controlling a source PCB to the source PCB. In addition, the timing controller board 105 may control an image. The timing controller board 105 may be connected to an interface PCB via one of the flat cable 161, the circular cable 163, and the wireless transmission.

As shown in (a) of FIG. 5, at least one main board 109 may be disposed. For example, the main board 109 may include a first main board 109a and a second main board 109b. The first main board 109a may be positioned in the center of the housing 300. The second main board 109b may be spaced apart from the first main board 109a and may be positioned on the right side of the housing 300. The power supply 107 may be spaced apart from the first main board 109a and may be positioned on the left side of the housing 300.

The timing controller board 105 may be positioned on the upper surfaces of the main board 109 and the power supply 107. Because the timing controller board 105 is positioned on the upper surfaces of the main board 109 and the power supply 107, an internal space of the housing 300 can be saved.

Although not shown, a timing controller shield may be further attached at a position to mount the timing controller board 105 inside the housing 300, in order to prevent electromagnetic waves emitted from the power supply 107 and the main board 109. Namely, the timing controller board 105 may be coupled with not the power supply 107 and the main board 109 but the timing controller shield. Hence, the timing controller board 105 does not interfere with the power supply 107 or the main board 109, thereby preventing a malfunction or a noise resulting from the interference from occurring. In addition, the timing controller shield can serve as a buffer for buffering an impact generated from the outside, thereby protecting the timing controller board 105 from impact.

The timing controller board 105 may overlap the power supply 107 and the main board 109 in a height direction Y of the housing 300. Hence, the timing controller board 105 can be more easily coupled with the power supply 107 and the main board 109.

As shown in (b) of FIG. 5, one main board 109 may be mounted inside the housing 300 unlike (a) of FIG. 5. The main board 109 may be positioned on one side of the housing 300, and the power supply 107 may be positioned on the other side of the housing 300. Namely, the main board 109 and the power supply 107 may be positioned to face each other in a longitudinal direction of the housing 300.

Because the timing controller board 105 is positioned on the power supply 107 and the main board 109, the space of the display device can be saved. Hence, the entire size of the housing 300 can decrease, and the freedom of the design of the internal space of the display device can be improved.

Referring to FIGS. 6A to 10, the head 10 may include the display panel 100, the module cover 200, and a PCB cover 400. The module cover 200 may be referred to as a frame.

The display panel 100 may be provided at the front surface of the head 10 and may display an image. The display panel 100 may divide the image into a plurality of pixels and cause each pixel to emit light while adjusting color, brightness, and chroma of each pixel, thereby outputting an image.

An interface PCB 174 and at least one source PCB 172 may be positioned on at least a portion of a rear surface of the display panel 100. The interface PCB 174 may be positioned on at least one source PCB 172. At least one source PCB 172 may be connected to the interface PCB 174. The source PCBs 172 may be positioned to be spaced apart from one another.

Signal lines for transmitting driving signals such as timing control signals and digital video data received from the timing controller board 105 (see FIG. 5) of the housing may be positioned on the interface PCB 174. In embodiments disclosed herein, the signal lines may include the flat cable 161 and the circular cable 163.

At least one source PCB 172 may apply a voltage to the display panel 100 in response to a signal received from the interface PCB 174. Namely, at least one source PCB 172 may apply a driving waveform to the display panel 100 in response to an image signal. The source PCB 172 may be connected to the display panel 100 by a source chip-on film (COF) 157. The source COF 157 connected to one side of the source PCB 172 may be extended to the lower surface of the display panel 100 and may be connected to the display panel 100.

The source COF 157 may be electrically connected to the source PCB 172 and data pads of the display panel 100. The source COF 157 may include a data integrated circuit.

An adhesive sheet 350 may be positioned on the rear surface of the display panel 100 and may couple the display panel 100 and the module cover 200 to each other. The adhesive sheet 350 may have a rectangular frame shape with an empty center. Because the center of the adhesive sheet 350 is empty, at least one PCB may be positioned in an empty space.

An insulating sheet 251 may be disposed between the display panel 100 and the module cover 200. The insulating sheet 251 may be attached to the front surface of the module cover 200 and may be positioned at a portion corresponding to the source PCB 172. The insulating sheet 251 may include an insulating material so that the source PCB 172 does not interfere with another electronic device.

The module cover 200 may be provided on the rear surface of the display panel 100. The module cover 200 may be attached to the display panel 100 through the adhesive sheet 350. The module cover 200 can support the rear surface of the display panel 100. Namely, the module cover 200 can reinforce the rigidity of the display panel 100. Thus, the module cover 200 may include a lightweight and high-strength material. For example, the module cover 200 may include aluminum.

A thickness of at least a portion of the module cover 200 may different from a thickness of another portion of the module cover 200. Namely, the module cover 200 can be formed. A thickness of an edge portion of the module cover 200 may be greater than a thickness of another portion of the module cover 200. Because the module cover 200 is formed, the rigidity of the module cover 200 can be improved. Further, when the module cover 200 is coupled with a bracket 500, a portion of the bracket 500 may be shielded due to the thickness of the edge portion of the module cover 200.

The module cover 200 may have a fastening hole 271. The fastening hole 271 may be a hole penetrating the module cover 200. The fastening hole 271 may include a first fastening hole 271a and a second fastening hole 271b.

The first and second fastening holes 271a and 271b of the module cover 200 may be formed at a location corresponding to first and second fixing pins 511a and 511b when the head 10 and the bracket 500 are fastened to each other. The first fastening hole 271a may be positioned on one of the left and right sides of the module cover 200, and the second fastening hole 271b may be positioned on the other of the left and right sides of the module cover 200. However, embodiments are not limited thereto. For example, at least one pair of fastening holes 271 may be disposed in the module cover 200.

Figure 6A:
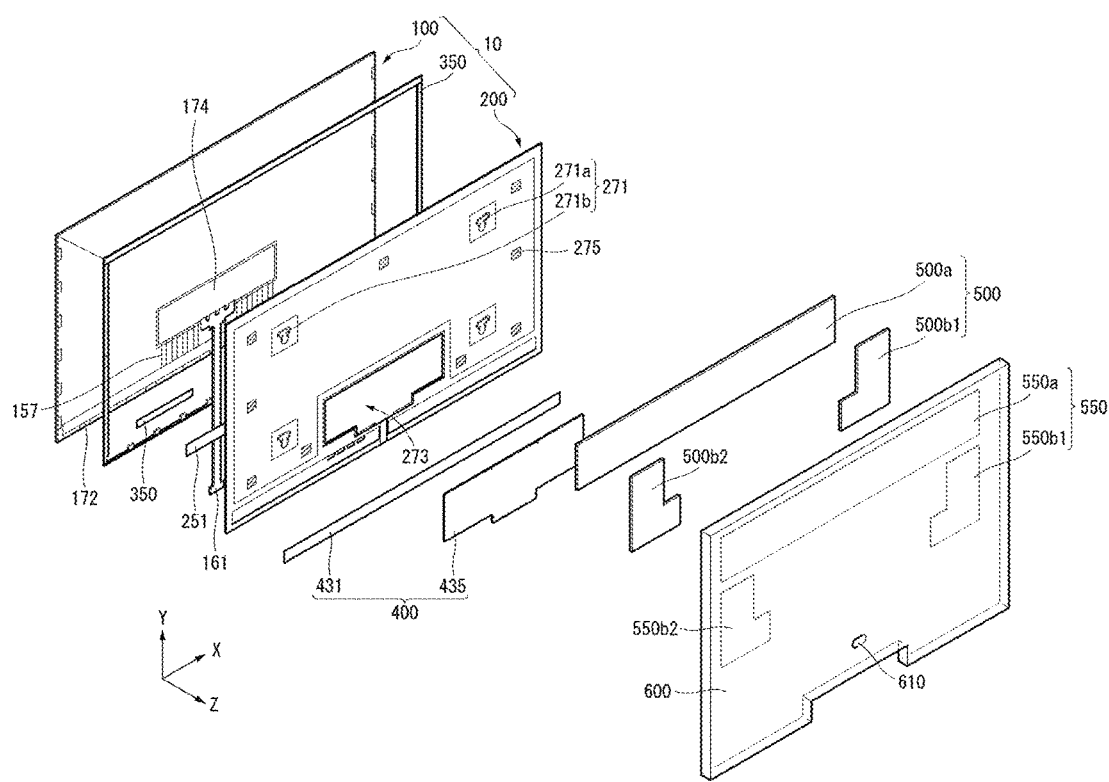
FIGS. 6A to 10 illustrate examples of a plate and a bracket according to an embodiment of the disclosure.

FIG. 6A illustrates that at least one pair of fastening holes 271 are disposed in the module cover 200, but embodiments are not limited thereto.

Figure 6B:
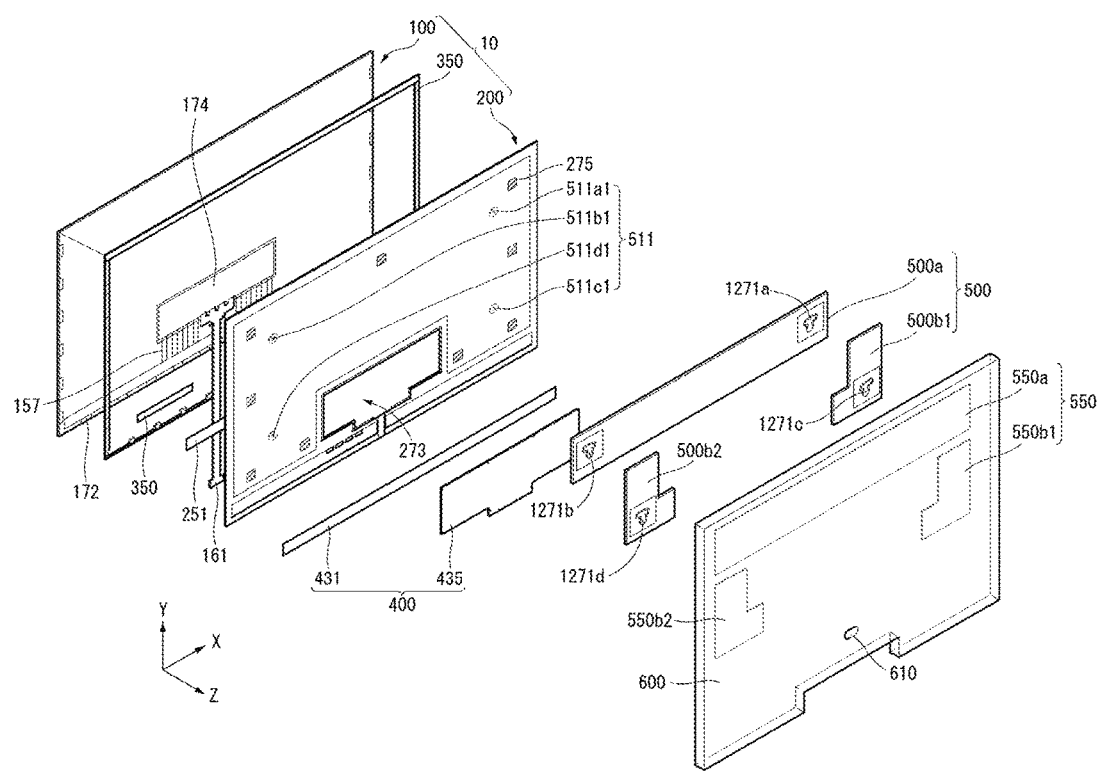
Figure 7:
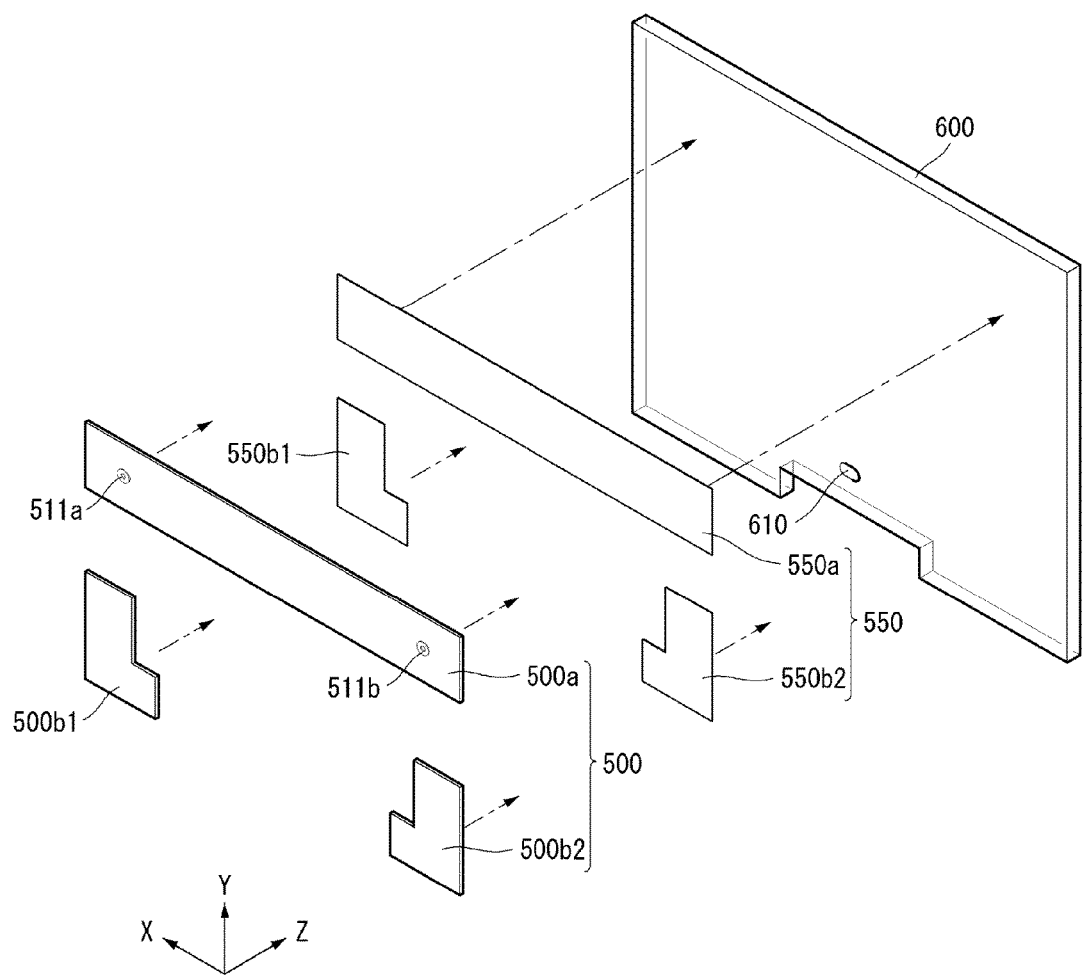
Figure 8:
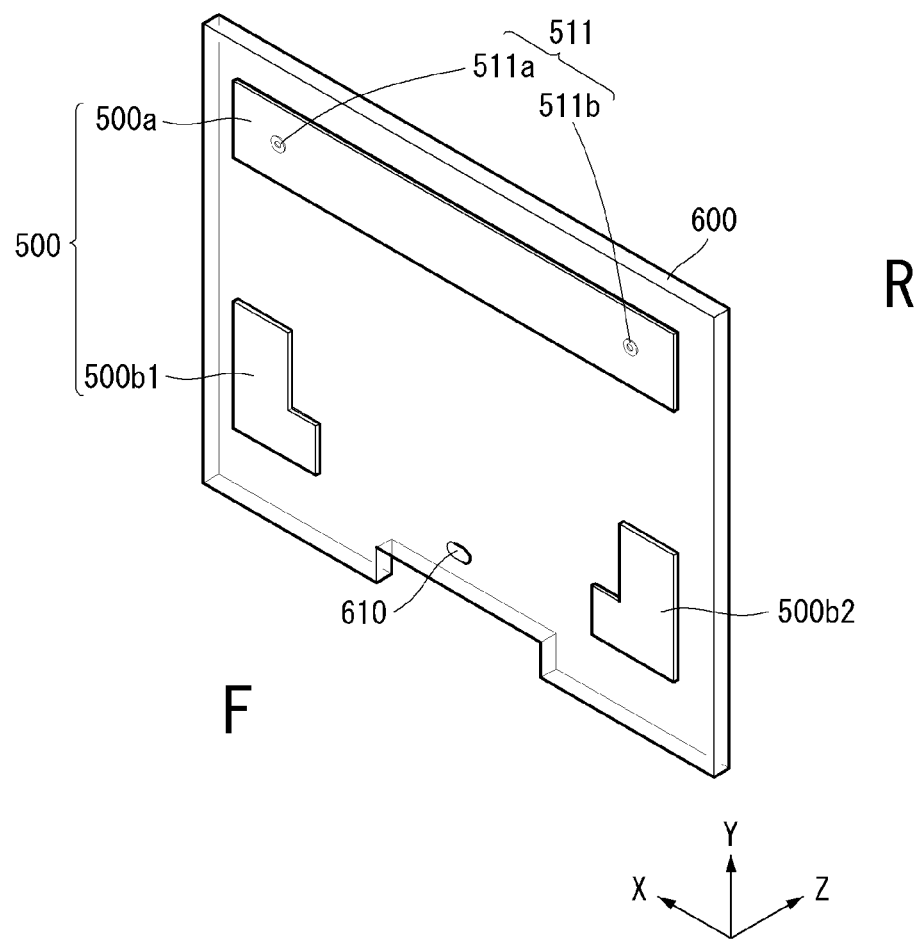
Figure 9:
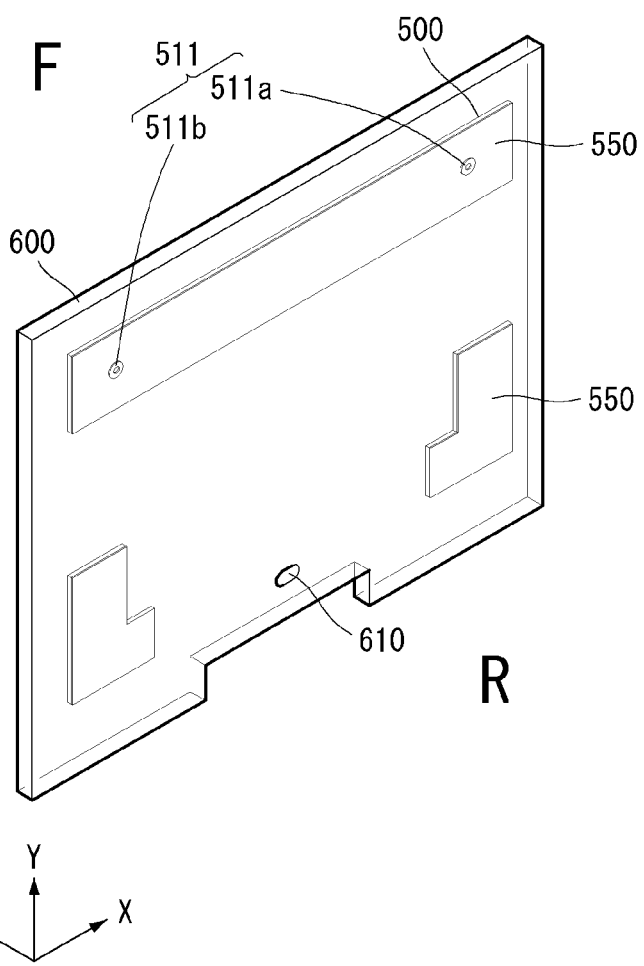
Figure 10:
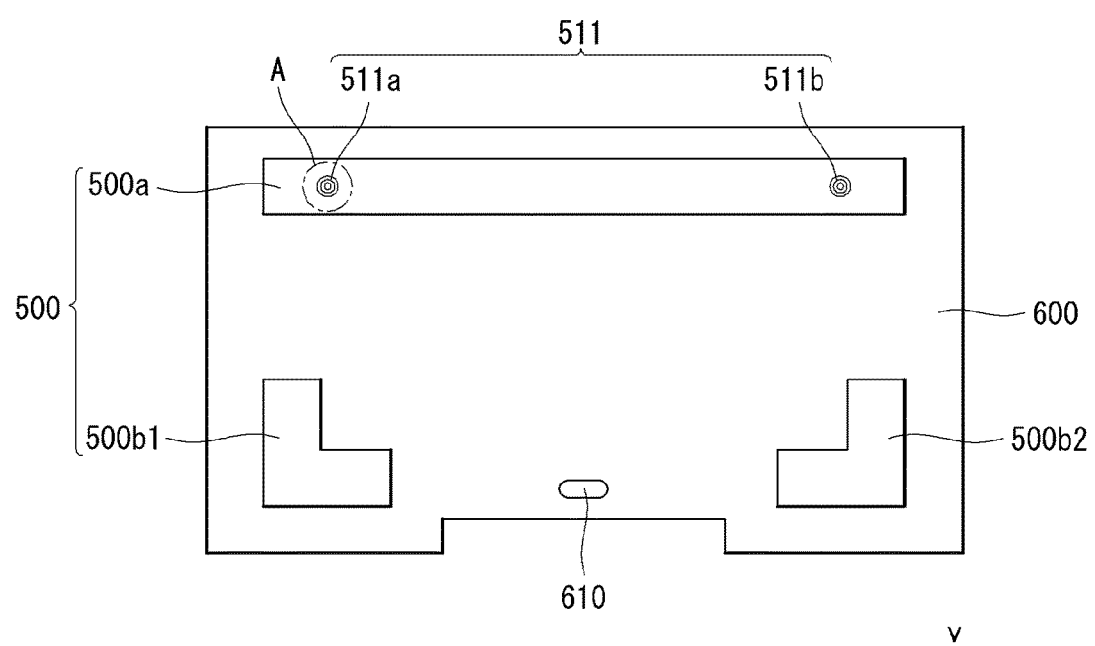

Referring to FIG. 6B, the module cover 200 may include a plurality of fixing pins 511a1 to 511d1. The fixing pin may include first to fourth fixing pins 511a1 to 511d1. The first to fourth fixing pins 511a1 to 511d1 may be spaced apart from each other in the horizontal direction or the vertical direction. A detailed description of the fixing pin will be given later.

The bracket 500 may include a plurality of fastening holes 1271. The fastening holes 1271 may be holes penetrating the bracket 500. The fastening holes 1271 may include first to fourth fastening holes 1271a to 1271d. The bracket 500 may include an upper bracket 500a and lower brackets 500b1 and 500b2.

The first to fourth fixing pins 511a1 to 511d1 may be respectively inserted into the first to fourth fastening holes 1271a to 1271d of the bracket 500 and then may be fastened. The first to fourth fixing pins 511a1 to 511d1 may be provided on the module cover 200 at a location corresponding to the first to fourth fastening holes 1271a to 1271d of the bracket 500.

The first fastening hole 1271a may be positioned on one of the left and right sides of the upper bracket 500a, and the second fastening hole 1271b may be positioned on the other of the left and right sides of the upper bracket 500a. The third fastening hole 1271c may be disposed on one of the two lower brackets 500b1 and 500b2, and the fourth fastening hole 1271d may be disposed on the other of the two lower brackets 500b1 and 500b2.

In addition, the module cover 200 may include at least two coupling auxiliary members 275. The plurality of coupling auxiliary members 275 may be positioned between the module cover 200 and the bracket 500. The plurality of coupling auxiliary members 275 may be positioned on the rear surface of the module cover 200. The coupling auxiliary members 275 may be positioned at predetermined intervals in the edge portion of the module cover 200. The coupling auxiliary members 275 may be positioned in a bezel area (not shown) of the display panel 100. The bezel area may be defined as an area (on which the screen is not displayed) disposed around an image area of the display panel 200 on which the screen is displayed.

The coupling auxiliary member 275 may include a magnetic material. For example, the coupling auxiliary member 275 may include a neodymium magnet, or the like. The coupling auxiliary member 275 may attach or fix the bracket 500 to the module cover 200 using magnetic properties.

The module cover 200 can be more firmly fixed to the bracket 500 by disposing the coupling auxiliary members 275 together with the fastening holes 271 as described above.

The embodiment of the disclosure described that the coupling auxiliary members 275 are disposed on the rear surface of the module cover 200, but is not limited thereto. For example, the coupling auxiliary members 275 may be disposed on the front surface of the bracket 500.

The module cover 200 may include a cover opening 273 at a location corresponding to the interface PCB 174 when the module cover 200 is coupled with the display panel 100. Namely, the cover opening 273 may be positioned in the center of the module cover 200. The cover opening 273 may provide a space for the interface PCB 174 in an area between the display panel 100 and the module cover 200. If the module cover 200 includes too many cover openings 273, cracks may be generated in the module cover 200 or the rigidity of the module cover 200 may be reduced. Hence, the cover opening 273 may be formed only in a necessary portion of the module cover 200.

A PCB cover 400 may be provided on a rear surface of a formation area of the PCB. The PCB cover 400 may include a first PCB cover 431 and a second PCB cover 435. The first PCB cover 431 may be positioned at a portion corresponding to the source PCB 172, and the second PCB cover 435 may be positioned in a portion corresponding to the interface PCB 174. Namely, the second PCB cover 435 may cover the cover opening 273. The PCB cover 400 can prevent the source PCB 172 and the interface PCB 174 from being exposed to the outside. Thus, the PCB cover 400 may be opaque so that the source PCB 172 and the interface PCB 174 are not exposed to the outside.

The PCB cover 400 may include an insulating material so that the source PCB 172 and the interface PCB 174 do not interfere with another electronic device. For example, the PCB cover 400 may include a plastic material. Thus, the PCB cover 400 can protect the source PCB 172 and the interface PCB 174 from a leakage current.

In addition, in the head 10 of the display device, the display panel 100 can be supported only by the module cover 200. Namely, the head 10 may not have any cover other than the module cover 200. Hence, the head 10 can be made thinner than heads of related art flat panel displays.

The bracket 500 may be disposed in the rear of the display panel 100 or in the rear of the head 10. The bracket 500 may be fixed to a plate 600. For example, the plate 600 may be made of glass, tempered glass, transparent plastic, and the like. Namely, the bracket 500 may be fixed to glass, tempered glass, and the like, and thus a movement of the bracket 500 may be restricted.

The bracket 500 may include the upper bracket 500a and the lower brackets 500b1 and 500b2. The upper bracket 500a may be disposed on the upper side of the head 10 and extended in a longitudinal direction. Namely, the upper bracket 500a may be extended along the first long side of the head 10. The upper bracket 500a may have a predetermined width.

The lower brackets 500b1 and 500b2 may be disposed adjacent to both edges or both corners of the lower side of the head 10. More specifically, the lower brackets 500b1 and 500b2 may be respectively disposed around the third corner C3, at which the second short side SS2 and the second long side LS2 meet each other at the lower side of the head 10, and around the fourth corner C4, at which the second long side LS2 and the first short side SS1 meet each other at the lower side of the head 10. Each of the lower brackets 500b1 and 500b2 may have a predetermined width and may be bent at least once.

The embodiment of the disclosure described that the bracket 500 is divided into the upper bracket 500a and the lower brackets 500b1 and 500b2, but is not limited thereto. For example, the bracket 500 is not divided into the upper bracket 500a and the lower brackets 500b1 and 500b2 and may have a rectangular frame shape with an empty center.

The bracket 500 may be fixed to one surface of the plate 600 through an adhesive member 550 such as an adhesive material or an adhesive sheet. The adhesive member 550 may be disposed between the bracket 500 and the plate 600 to firmly attach and fix the bracket 500 to the plate 600.

The adhesive member 550 may be formed to have substantially the same shape as a shape of a contact portion of the bracket 500 and the plate 600. Hence, the adhesive member 550 may include an upper adhesive member 550a and lower adhesive members 550b1 and 550b2.

For example, the adhesive member 550 may be a double-sided tape, of which both surfaces can be used for the adhesion. As another example, the adhesive member 550 may be a strong glue, and the like.

The upper adhesive member 550a may be positioned between the upper bracket 500a and the plate 600. Namely, the upper adhesive member 550a may be disposed at substantially the same position as the upper bracket 500a. The upper adhesive member 550a may be disposed on the upper side of the head 10 and extended in a longitudinal direction. Namely, the upper adhesive member 550a may be extended along the first long side of the head 10. The upper adhesive member 550a may have a predetermined width.

The lower adhesive members 550b1 and 550b2 may be positioned between the lower brackets 500b1 and 500b2 and the plate 600. Namely, the lower adhesive members 550b1 and 550b2 may be disposed at substantially the same positions as the lower brackets 500b1 and 500b2. The lower adhesive members 550b1 and 550b2 may be disposed adjacent to both edges or both corners of the lower side of the head 10. More specifically, the lower adhesive members 550b1 and 550b2 may be respectively disposed around the third corner C3, at which the second short side SS2 and the second long side LS2 meet each other at the lower side of the head 10, and around the fourth corner C4, at which the second long side LS2 and the first short side SS1 meet each other at the lower side of the head 10. Each of the lower adhesive members 550b1 and 550b2 may have a predetermined width and may be bent at least once.

As described above, the adhesive member 550 may have substantially the same cross-sectional shape as the bracket 500 and may be disposed to correspond to the same position as the bracket 500, thereby firmly attaching and fixing the bracket 500 to the plate 600. In this instance, an area of the adhesive member 550 may be substantially equal to or smaller than an area of the bracket 500.

In addition, at least two fixing pins 511 may be disposed on the front surface of the bracket 500. The fixing pin 511 may include a first fixing pin 511a and a second fixing pin 511b.

The first fixing pin 511a may be positioned on one of the left side and the right side of the bracket 500, and the second fixing pin 511b may be positioned on the other of the left side and the right side of the bracket 500. For example, when the first fixing pin 511a is positioned on the left side of the bracket 500, the second fixing pin 511b may be positioned on the right side of the bracket 500.

The first and second fixing pins 511a and 511b positioned as described above can support the load of the head 10 fastened to the bracket 500. In the embodiment of the disclosure, as the first and second fixing pins 511a and 511b are respectively positioned at the left upper end and the right upper end of the bracket 500 and are spaced apart from each other, the first and second fixing pins 511a and 511b can efficiently distribute the load of the head 10. The first and second fixing pins 511a and 511b will be described in detail later.

The plate 600 may be disposed in the rear of the head 10 or in the rear of the display panel 100. The plate 600 may be a glass using silicon dioxide ($SiO_2$), which constitutes a sand or a crystal, as a main component. The plate 600 may include soda, lime glass, borosilicate glass, acrylic resin, sugar glass, mica or aluminum oxynitride, and the like.

The plate 600 may have a predetermined thickness. The plate 600 may be formed to be thicker than the thickness of the head 10. The plate 600 can stably support the head 10 mounted on the bracket 500 by fixing the bracket 500 using the adhesive member 550. Thus, the plate 600 can restrain the movement of the head 10 by fixing the bracket 500.

The plate 600 may have a line hole 610 near the bottom of a central area. The line hole 610 may be formed to penetrate the plate 600 in a front-rear direction. The line hole 610 may penetrate the flat cable 161 (see (a) of FIG. 4) or the circular cable 163 (see (b) of FIG. 4). Hence, the flat cable 161 (see (a) of FIG. 4) or the circular cable 163 (see (b) of FIG. 4) may be disposed on a rear surface of the plate 600 and can be simply arranged.

Figure 11:
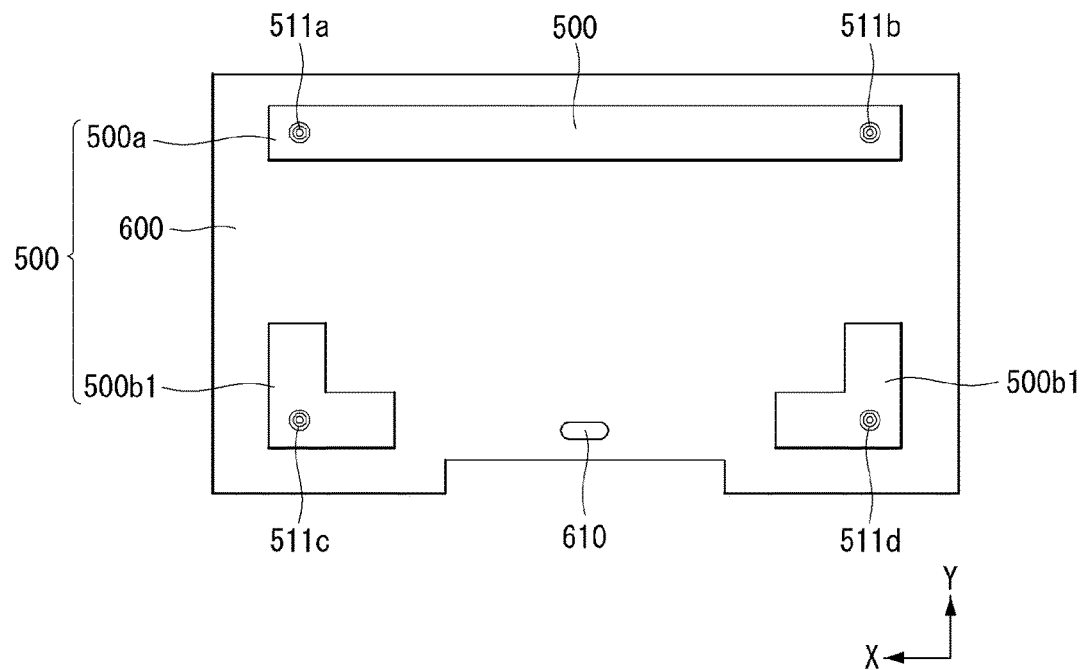
FIG. 11 illustrates another example of a plate and a bracket according to an embodiment of the disclosure.

Referring to FIG. 11, at least two fixing pins 511 may be disposed on the front surface of the bracket 500. The fixing pins 511 may include first to fourth fixing pins 511a to 511d.

The first fixing pin 511a may be positioned at one of a left upper end and a right upper end of the bracket 500, and the second fixing pin 511b may be positioned on the other of the left upper end and the right upper end of the bracket 500. The third fixing pin 511c may be positioned at one of a left lower end and a right lower end of the bracket 500, and the fourth fixing pin 511d may be positioned at the other of the left lower end and the right lower end of the bracket 500.

For example, the first fixing pin 511a and the second fixing pin 511b may be respectively disposed on the left side and the right side of the upper bracket 500a. The third fixing pin 511c may be disposed on the lower bracket 500b1 positioned near the third corner C3 (see FIG. 1) of the plate 600. The fourth fixing pin 511d may be disposed on the lower bracket 500b2 positioned near the fourth corner C4 (see FIG. 1) of the plate 600.

The first to fourth fixing pins 511a to 511d can distribute and support the load of the head 10 fastened to the bracket 500. The first to fourth fixing pins 511a to 511d may be disposed on the bracket 500 and may be respectively disposed at the edges of the plate 600, thereby more efficiently distributing the load of the head 10.

Figure 12:
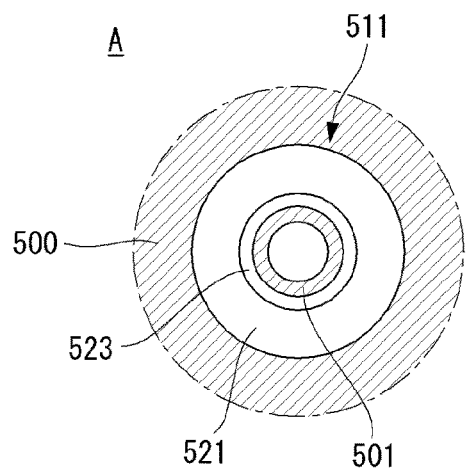
FIGS. 12 and 13 illustrate examples of a fixing pin according to an embodiment of the disclosure.
Figure 13:
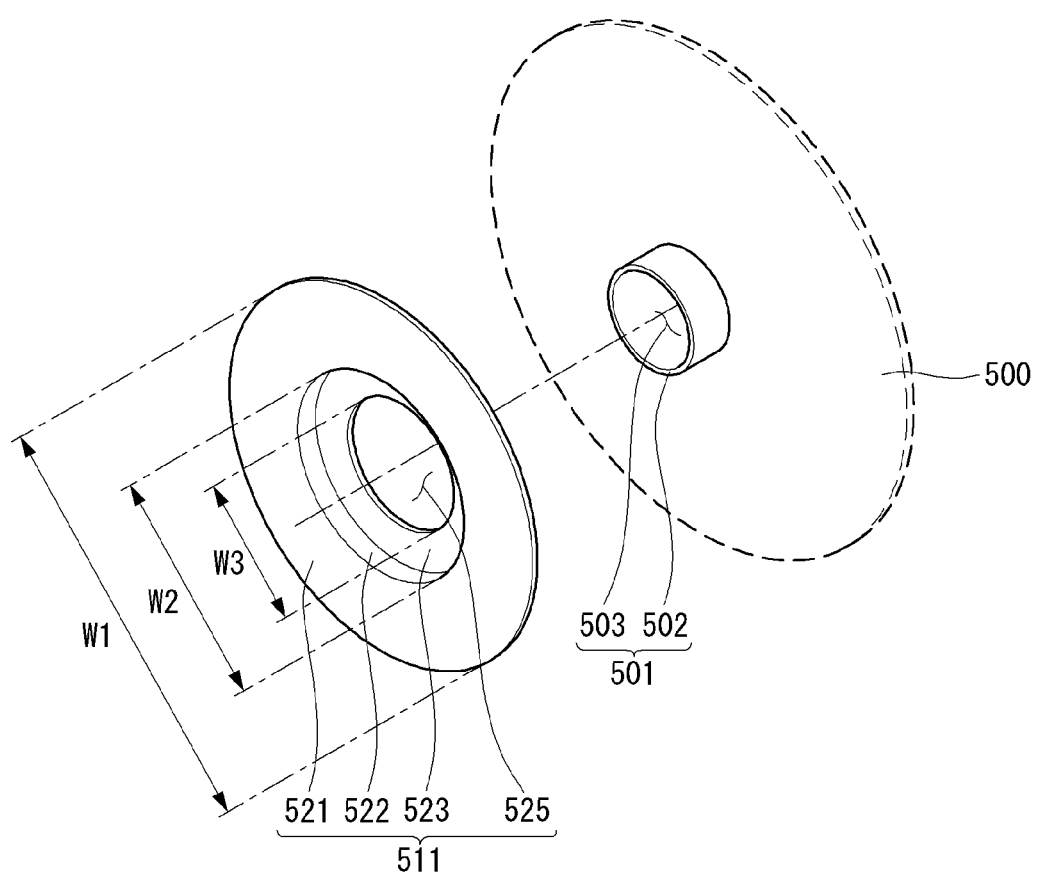

Referring to FIGS. 12 and 13, the fixing pin 511 may include a pin head 521, a pin neck 523, and a fixing hole 525. Namely, the pin head 521 may have a flange shape or a donut shape having a first diameter W1, and the pin neck 523 may have a donut shape that is extended from the pin head 521 and has a second diameter W2 less than the first diameter W1. The fixing pin 511 can be easily fastened to one side of the fastening hole 271 (see FIG. 19A) through the pin head 521 and the pin neck 523 each having the different diameter.

The pin head 521 may be spaced apart from the pin neck 523. Namely, the pin head 521 may be stepped out toward the front of the display device from the pin neck 523 and may be spaced apart from the pin neck 523. A connection portion 522 may be disposed between the pin head 521 and the pin neck 523. The connection portion 522 may be extended from an inner diameter of the pin head 521 to an outer diameter of the pin neck 523. For example, the connection portion 522 may have a cylinder shape.

The fixing pin 511 may include at least one fixing hole 525. The fixing hole 525 may have a third diameter W3 and may be disposed to penetrate the pin head 521 and the pin neck 523. The third diameter W3 may be less than the second diameter W2.

The fixing pin 511 may be coupled to a fixed protrusion member 501 protruding from the bracket 500. The fixed protrusion member 501 may be inserted into the fixing pin 511 and coupled to the fixing pin 511. Namely, the fixing pin 511 may be fixed to the bracket 500 while closely contacting the fixed protrusion member 501.

FIGS. 12 and 13 illustrate the fixing pin 511 of the donut shape by way of example. However, embodiments are not limited thereto. For example, the fixing pin 511 may be formed in a donut shape having a polygonal bottom. For example, when the fixing pin 511 is formed in a shape of a polygonal column, a shape of the fastening hole 271 and a shape of the fixed protrusion member 501 to be described later may be changed in accordance with the polygonal column shape of the fixing pin 511.

Referring to FIGS. 14 to 17, the fixing pin 511 may be coupled to the fixed protrusion member 501 protruding from the bracket 500. The fixed protrusion member 501 may be inserted into the fixing hole 525 having the third diameter W3. The fixed protrusion member 501 may have an opening 503 and a pipe wall 502.

The opening 503 may penetrate a portion of the bracket 500. At least one opening 503 may be formed to penetrate the bracket 500.

The pipe wall 502 may protrude toward the front of the bracket 500 around the opening 503. The pipe wall 502 may protrude toward the module cover 200 around the opening 502. For example, the pipe wall 502 may have a cylinder shape.

The fixed protrusion member 501 may protrude from the front surface of the bracket 500. At least one fixed protrusion member 501 may be disposed on the front surface of the bracket 500. Although not shown, the fixed protrusion member 501 may include a first fixed protrusion member and a second fixed protrusion member. For example, the first fixed protrusion member may be formed on one of the left upper end and the right upper end of the bracket 500, and the second fixed protrusion member may be formed on the other of the left upper end and the right upper end of the bracket 500. Namely, the first fixed protrusion member 501 and the second fixed protrusion member 501 may be respectively disposed on the left and right sides of the upper bracket 500*a* (see FIG. 10).

Although not shown, the fixed protrusion member 501 may further include a third fixed protrusion member and a fourth fixed protrusion member. The third fixed protrusion member may be disposed on the lower bracket 500*b*1 (see FIG. 10) positioned near the third corner C3 (see FIG. 1) of the plate 600. The fourth fixed protrusion member may be disposed on the lower bracket 500*b*2 (see FIG. 10) positioned near the fourth corner C4 (see FIG. 1) of the plate 600.

The fixed protrusion member 501 may protrude from the front surface of the bracket 500, so that the fixed protrusion member 501 is inserted into the fixing hole 525 included in the fixing pin 511. Therefore, a diameter of the fixed protrusion member 501 may be formed in a cylinder shape having a smaller diameter than the third diameter W3.

Figure 14:
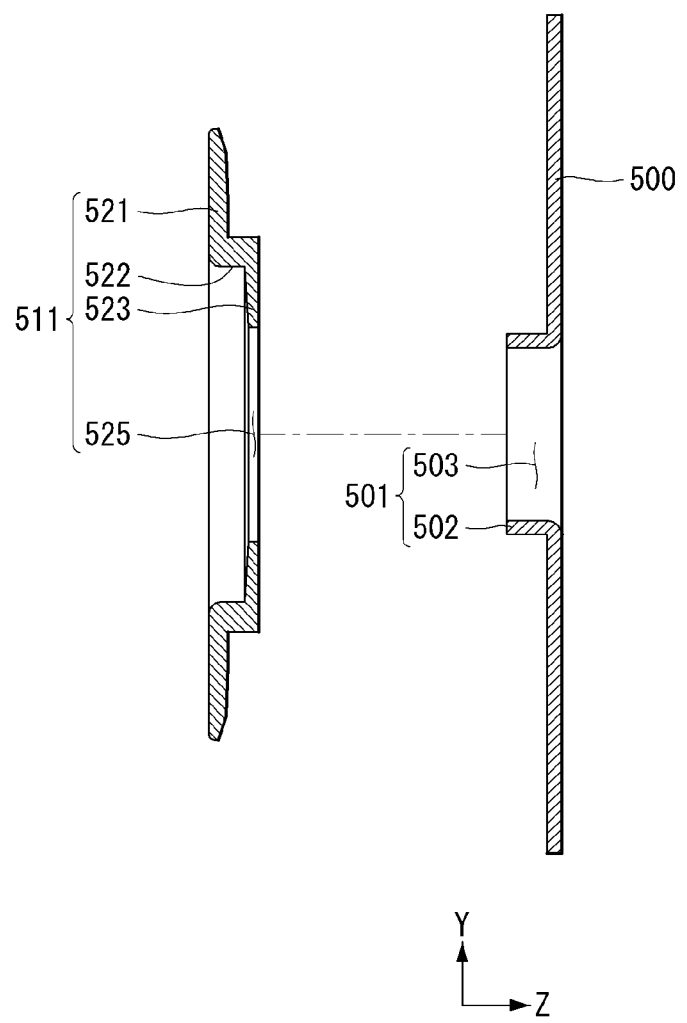
FIGS. 14 to 17 illustrate examples of a process for fastening a fixing pin to a fixed protrusion member in accordance with an embodiment of the disclosure.

FIG. 14 illustrates a state before the fixed protrusion member 501 is inserted into the fixing pin 511. The fixed protrusion member 501 may be formed to protrude from the bracket 500. The fixing pin 511 may be disposed at a location corresponding to the fixed protrusion member 501. For example, the first fixing pin 511*a* (see FIG. 10) may be disposed at a location corresponding to the first fixed protrusion member; the second fixing pin 511*b* (see FIG. 10) may be disposed at a location corresponding to the second fixed protrusion member; the third fixing pin 511*c* (see FIG. 11) may be disposed at a location corresponding to the third fixed protrusion member; and the fourth fixing pin 511*d* (see FIG. 11) may be disposed at a location corresponding to the fourth fixed protrusion member.

Figure 15:
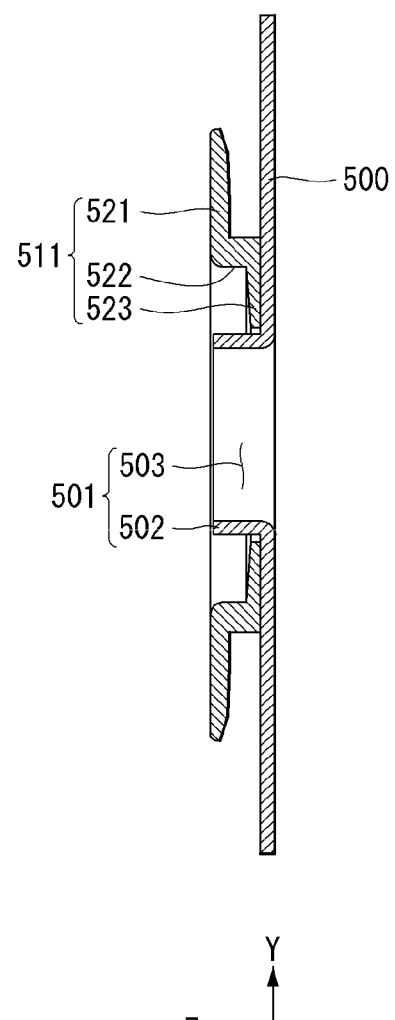

FIG. 15 illustrates a state after the fixed protrusion member 501 is inserted into the fixing pin 511. The fixed protrusion member 501 may be inserted into the fixing pin 511. For example, the first fixing pin 511*a* (see FIG. 10) may be inserted into the first fixed protrusion member; the second fixing pin 511*b* (see FIG. 10) may be inserted into the second fixed protrusion member; the third fixing pin 511*c* (see FIG. 11) may be inserted into the third fixed protrusion member; and the fourth fixing pin 511*d* (see FIG. 11) may be inserted into the fourth fixed protrusion member.

Figure 16:
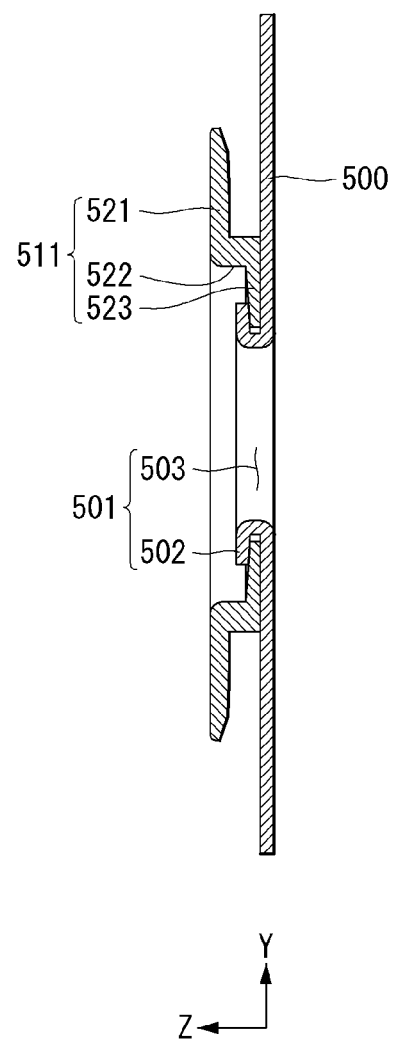
Figure 17:
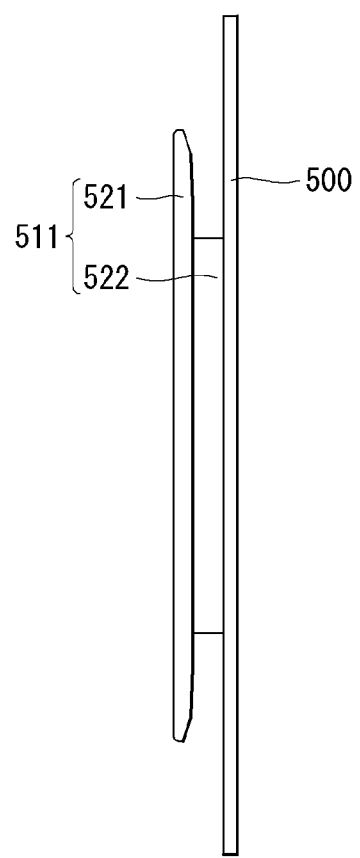

FIGS. 16 and 17 illustrate that the fixed protrusion member 501 and the fixing pin 511 are coupled to each other after the fixed protrusion member 501 is inserted into the fixing pin 511. After the fixed protrusion member 501 is inserted into the fixing pin 511, the upper end of the fixed protrusion member 501 may be bent and attached to the bottom surface of the fixing pin 511. An upper outer circumferential surface of the fixed protrusion member 501 may contact an upper surface of the pin neck 523. For example, after the fixed protrusion member 501 is inserted into the fixing pin 511, the fixed protrusion member 501 may be coupled to the fixing pin 511 through a caulking operation. As the fixed protrusion member 501 is inserted into the fixing pin 511 and then is coupled to the fixing pin 511 through the caulking operation, the rear surface of the bracket 500 may not be stepped out.

The embodiment of the disclosure may protrude the fixed protrusion member 501 from the front surface of the bracket 500 and dispose the fixing pin 511 on the front surface of the bracket 500 through the caulking operation, thereby preventing the rear surface of the bracket 500 from being stepped out. Hence, the embodiment of the disclosure can firmly fix the bracket 500 to the plate 600 using the adhesive member 550 (see FIG. 7).

In other words, because the rear surface of the bracket 500 is not stepped out, an adhesive area between the bracket 500 and the plate 600 can increase even if not a screw but the adhesive member 550 is used. Further, the bracket 500 and the plate 600 can be more closely adhered to each other.

Referring to FIGS. 18A to 20, the head 10 may be coupled to the upper bracket 500*a* mounted with the fixing pin 511. The fixing pin 511 may be easily fastened to at least one side of the fastening hole 271 through the pin head 521 and the pin neck 523 having each the different diameter.

Figure 18A:
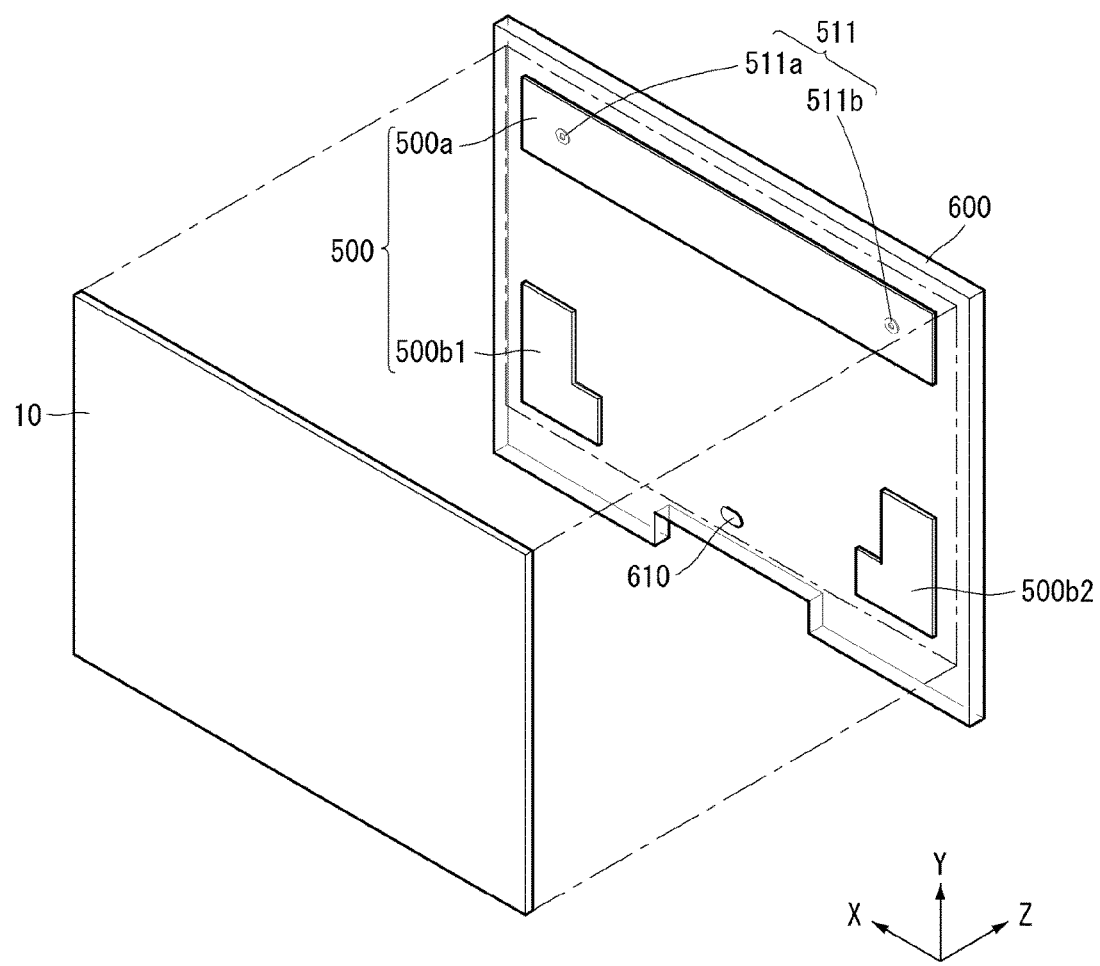
FIGS. 18A to 20 illustrate examples of a process for mounting a head on a bracket provided with a fixing pin in accordance with an embodiment of the disclosure.
Figure 18B:
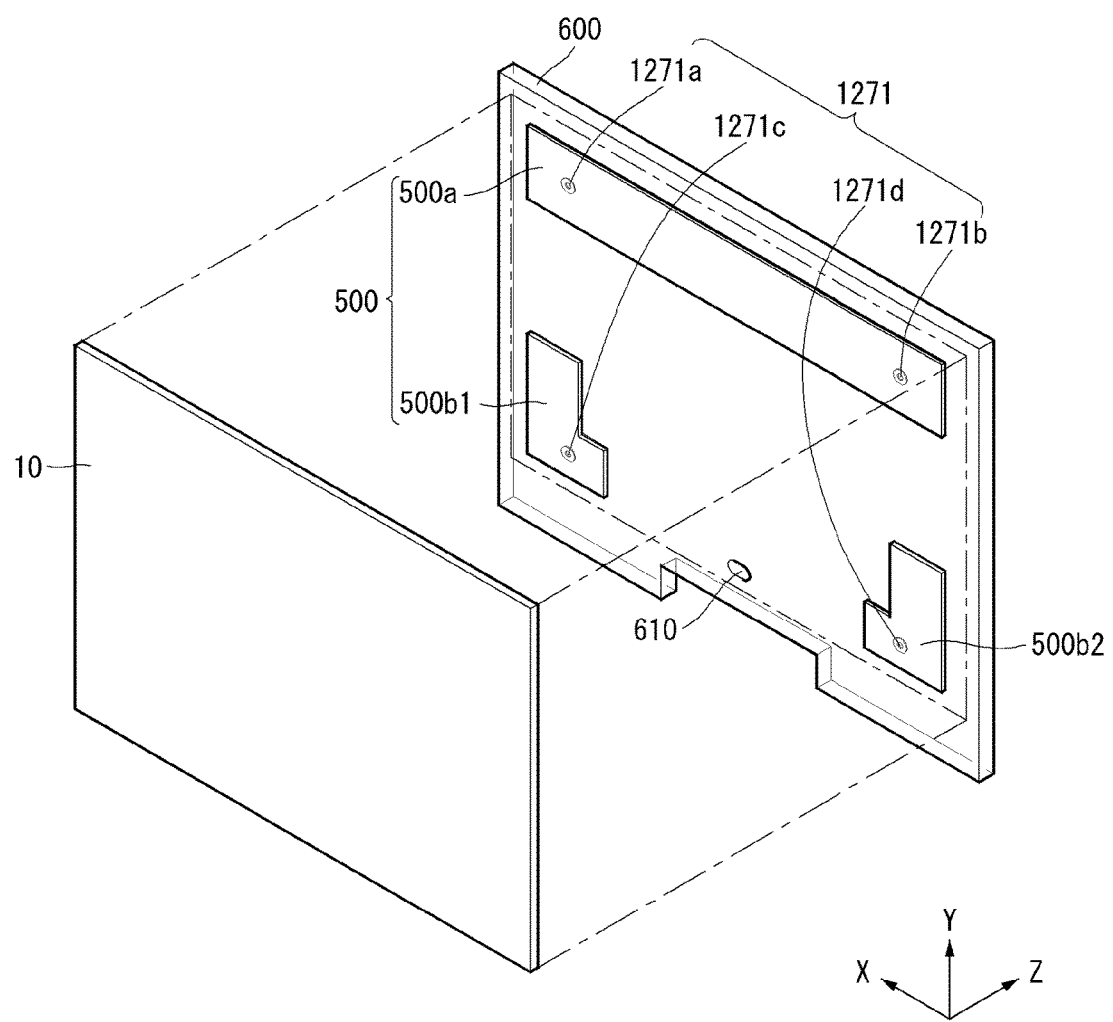

FIG. 18A illustrates that the head 10 is coupled to the upper bracket 500*a* mounted with the fixing pin 511 by way of example. However, embodiments are not limited thereto. For example, as shown in FIG. 18B, the head 10 may be coupled to the upper bracket 500*a* mounted with the first and second fastening holes 1271*a* and 1271*b* and the lower bracket 500*b* mounted with the third and fourth fastening holes 1271*c* and 1271*d*. The head 10 includes the first to fourth fixing pins 511*a*1 to 511*d*1 (see FIG. 6B) disposed at locations corresponding to the first to fourth fastening holes 1271*a* to 1271*d*.

Figure 19A:
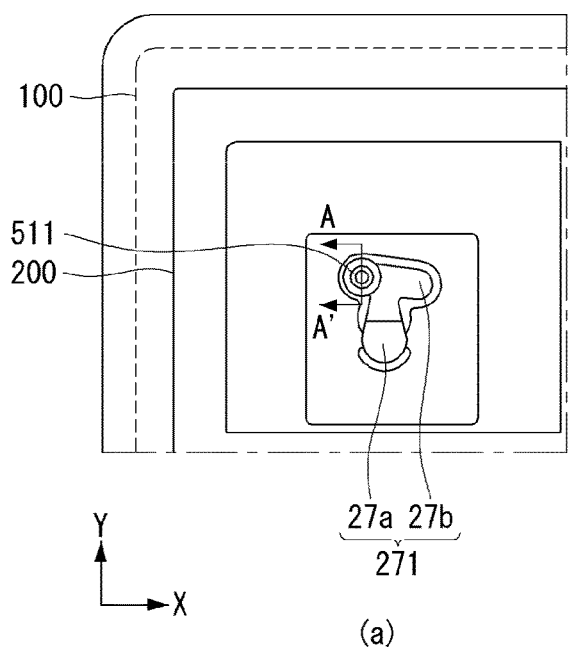
Figure 19A:
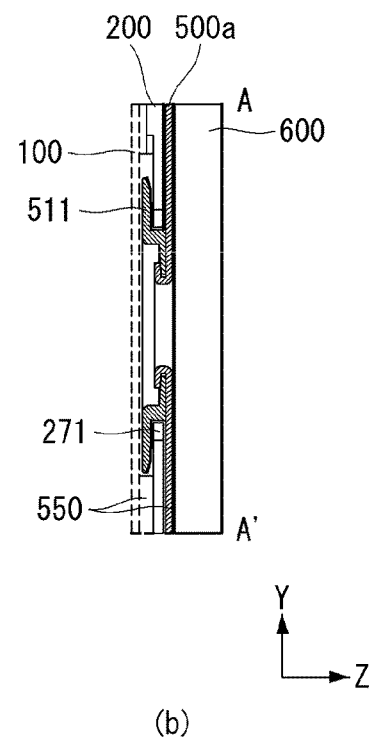

As shown in (a) of FIG. 19A, the first fixing pin 511*a* may be fastened to the first fastening hole 271*a* disposed on the module cover 200. (a) of FIG. 19A illustrates the display device when viewed from the front. More specifically, (a) of FIG. 19A illustrates the first fastening hole 271*a* and the first fixing pin 511*a* when it is assumed that the display panel 100 disposed in front of the module cover 200 is transparent, by way of example. However, embodiments are not limited thereto. A description of the first fastening hole 271*a* and the first fixing pin 511*a* may be applied to the second fastening hole 271*b* (see FIG. 6A) and the second fixing pin 511*b* (see FIG. 7). (b) of FIG. 19A is a cross-sectional view taken along line A-A' of (a) of FIG. 19A.

The first fastening hole 271*a* may include a lead-in area 27*a* where the first fixing pin 511*a* is drawn in or out, and a seating area 27*b* on which the first fixing pin 511*a* is seated. The lead-in area 27*a* may be disposed at a lower part of the first fastening hole 271*a* and may have a sufficient hole area capable of drawing in and out both the pin head 521 and the pin neck 523. Namely, the lead-in area 27*a* may have the hole area larger than the first diameter W1 of the pin head 521.

After the first fixing pin 511a drawn in the lead-in area 27a is guided, the first fixing pin 511a may be fixed in the seating area 27b. The seating area 27b may be disposed at an upper part of the first fastening hole 271a. The seating area 27b may have a width less than the first diameter W1 (see FIG. 13) of the pin head 521, so that the pin head 521 drawn in the lead-in area 27a is not drawn out arbitrarily. Namely, the pin head 521 may be restricted from being drawn in and out the first fastening hole 271a in the seating area 27b.

The seating area 27b may have a width greater than the second diameter W2 of the pin neck 523, so that the first fixing pin 511a drawn in the lead-in area 27a can be seated while easily moving along the shape of the first fastening hole 271a. Namely, the width of the seating area 27b may be less than the first diameter W1 and may be greater than the second diameter W2. Hence, the first fixing pin 511a may not be drawn out of the seating area 27b.

The first fixing pin 511a seated in the seating area 27 b may maintain a current state unless an external force equal to or greater than a predetermined value is provided. Namely, the first fixing pin 511a may be fixed to the seating area 27b as long as a predetermined external force is not provided.

In other words, when a predetermined external force is applied, the module cover 200 may be tilted or shifted in one direction, and the first fixing pin 511a may relatively move along the shape of the fastening hole 271 in accordance with the tilting or the shift of the module cover 200. A relative movement direction of the first fixing pin 511a may be guided along a shape of the seating area 27b of the first fastening hole 271a. In embodiments disclosed herein, the expression of "the fixing pin 511 relatively moves" means that the movement of the first fixing pin 511a fixed to the bracket 500 is really restricted, but the first fixing pin 511a appear to move inside the first fastening hole 271a in accordance with the movement of the module cover 200.

Accordingly, the embodiment of the disclosure can prevent the first fixing pin 511a seated in the seating area 27b from moving to the lead-in area 27a by an external force unintentionally provided, thereby preventing the first fixing pin 511a from being released from the first fastening hole 271a.

The fixing pin 511 and the fastening hole 271, the first fixing pin 511a and the first fastening hole 271a, or the second fixing pin 511b and the second fastening hole 271b may be expressed as or referred to as a coupling unit. The coupling unit may be positioned between the module cover 200 and the bracket 500.

Further, the coupling auxiliary member 275 (see FIG. 6A) may be disposed between the module cover 200 and the bracket 500. The coupling auxiliary member 275 can more firmly fix the module cover 200 to the bracket 500 together with the coupling unit. For example, the coupling auxiliary member 275 may be a magnet.

Figure 19B:
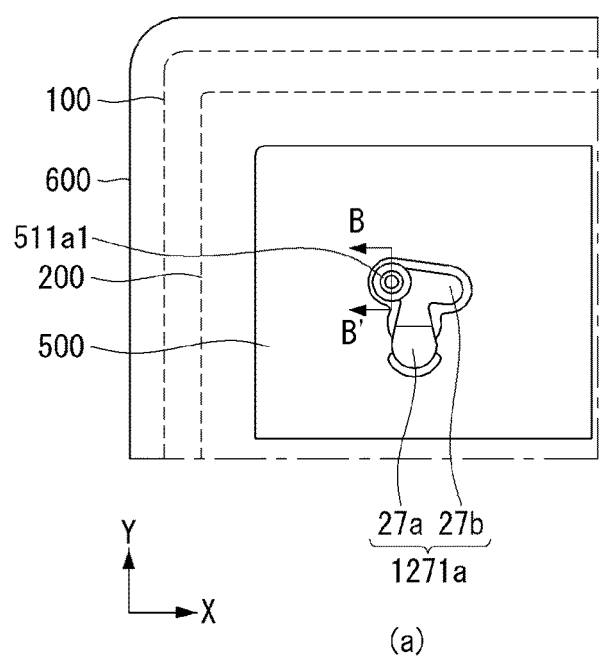
Figure 19B:
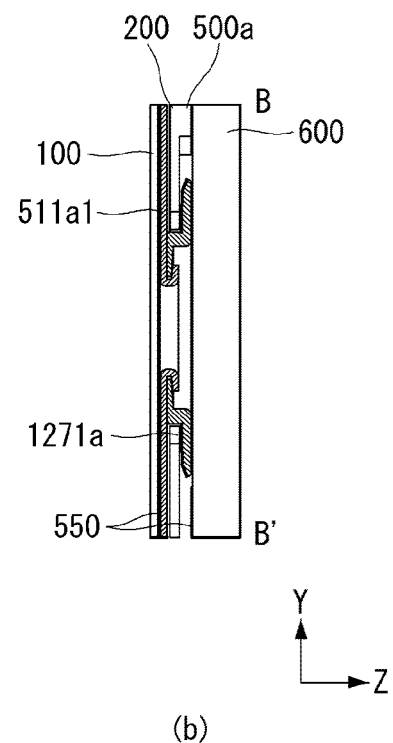
Figure 20:
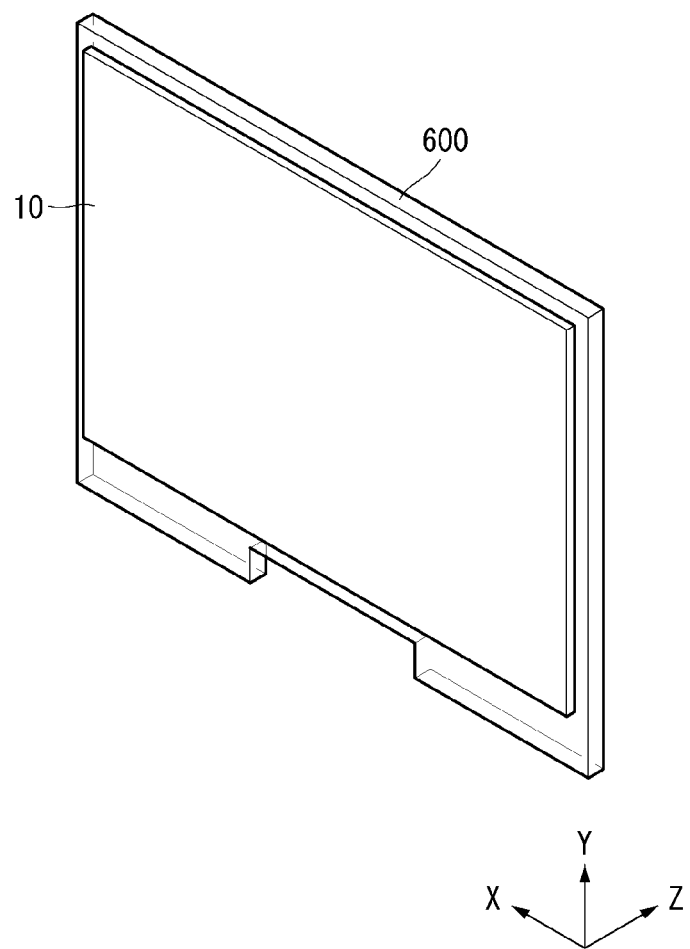

As shown in (a) of FIG. 19B, the first fixing pin 511a1 may be fastened to the first fastening hole 1271a disposed in the bracket 500. (a) of FIG. 19B illustrates the display device when viewed from the rear. More specifically, (a) of FIG. 19B illustrates the first fastening hole 1271a and the first fixing pin 511a1 when it is assumed that the plate 600 disposed in the rear of the bracket 500 is transparent. (b) of FIG. 19B is a cross-sectional view taken along line B-B' of (a) of FIG. 19B.

The description of the fastening or the coupling of the first fastening hole 1271a and the first fixing pin 511a1 can be sufficiently deduced from the contents described in FIG. 19A, and thus is omitted.

Although not shown in FIG. 19B, a method of fastening or coupling the second fastening hole 1271b and the second fixing pin 511b1, the third fastening hole 1271c and the third fixing pin 511c1, or the fourth fastening hole 1271d and the fourth fixing pin 511d1 may be the same as a method of fastening or coupling the first fastening hole 1271a and the first fixing pin 511a1.

Figure 21:
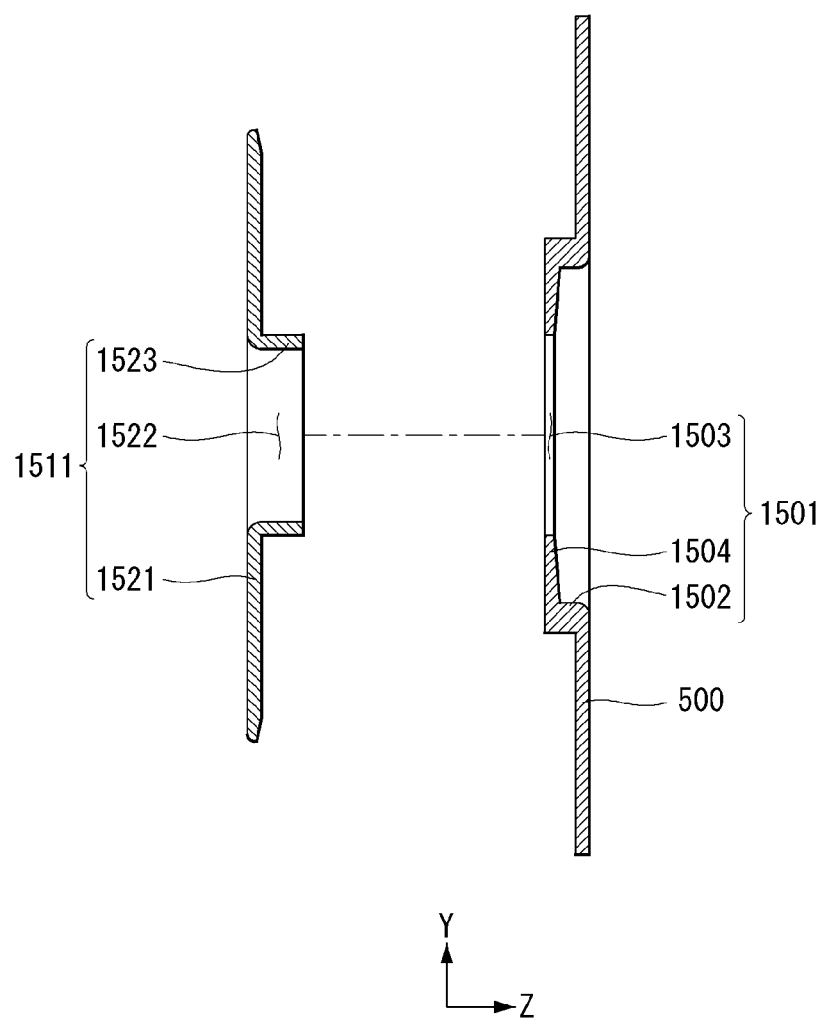
FIGS. 21 to 26 illustrate other examples of a process for mounting a head on a bracket provided with a fixing pin in accordance with an embodiment of the disclosure.

Referring to FIG. 21, a fixing pin 1511 may include a pin head 1521, a fixing hole 1522, and a pin pipe wall 1523.

The pin head 1521 may have a circular shape.

The fixing hole 1522 may be formed to penetrate a central portion of the pin head 1521. The pin pipe wall 1523 may be formed around the fixing hole 1522 and protrude toward the rear of the fixing pin 1511.

The pin pipe wall 1523 may protrude from the periphery of the fixing hole 1522 toward the bracket 500. For example, the pin pipe wall 1523 may have a cylinder shape. The fixing pin 1511 can be easily fastened to one side of a fastening hole 271 (see FIG. 26) through the pin head 1521, the pin pipe wall 1523, and the fixing hole 1522.

FIG. 21 illustrates the fixing pin 1511 of the circular shape by way of example. However, embodiments are not limited thereto. For example, the fixing pin 1511 may be formed in a shape having a polygonal bottom. For example, when the fixing pin 1511 is formed in a shape of a polygonal column, a shape of the fastening hole 271 and a shape of a fixed insertion member 1501 to be described later may be changed in accordance with the polygonal column shape of the fixing pin 1511.

The fixed insertion member 1501 may be formed on the front surface of the bracket 500. At least one fixed insertion member 1501 may be formed on the front surface of the bracket 500. The fixed insertion member 1501 may include an insertion hole 1503, an insertion neck 1504, and an insertion connection portion 1502.

The insertion hole 1503 may penetrate a portion of the bracket 500. At least one insertion hole 1503 may be formed to penetrate the bracket 500.

The insertion neck 1504 may be extended from the insertion hole 1503 and may have a diameter less than the insertion hole 1503. The insertion neck 1504 may be spaced apart from the bracket 500. Namely, the insertion neck 1504 may be stepped out toward the front of the display device from the bracket 500 and may be spaced apart from the bracket 500.

The insertion connection portion 1502 may be disposed between the insertion hole 1503 and the insertion neck 1504. Namely, the insertion connection portion 1502 may be extended from the periphery of the insertion hole 1503 to an outer diameter of the insertion neck 1504. For example, the insertion connection portion 1502 may have a cylinder shape.

Although not shown, the fixed insertion member 1501 may include a first fixed insertion member and a second fixed insertion member. For example, the first fixed insertion member may be formed on one of the left upper end and the right upper end of the bracket 500, and the second fixed insertion member may be formed on the other of the left upper end and the right upper end of the bracket 500. Namely, the first fixed insertion member and the second fixed insertion member may be respectively disposed on the left and right sides of the upper bracket 500a (see FIG. 10).

Although not shown, the fixed insertion member 1501 may further include a third fixed insertion member and a fourth fixed insertion member. The third fixed insertion member may be disposed on the lower bracket 500b1 (see FIG. 10) positioned near the third corner C3 (see FIG. 1) of the plate 600. The fourth fixed insertion member may be disposed on the lower bracket 500b2 (see FIG. 10) positioned near the fourth corner C4 (see FIG. 1) of the plate 600.

FIG. 21 illustrates a state before the fixing pin 511 is inserted into the fixed insertion member 1501. The fixed insertion member 1501 may be formed on the bracket 500. The fixed insertion member 1501 may include the first to fourth fixed insertion members (not shown). The fixing pin 1511 may include first to fourth fixing pins (not shown). The first to fourth fixing pins may be respectively disposed at locations corresponding to the first to fourth fixed insertion members. Since the components were sufficiently described with reference to FIGS. 10 to 14, a description thereof is omitted.

Figure 22:
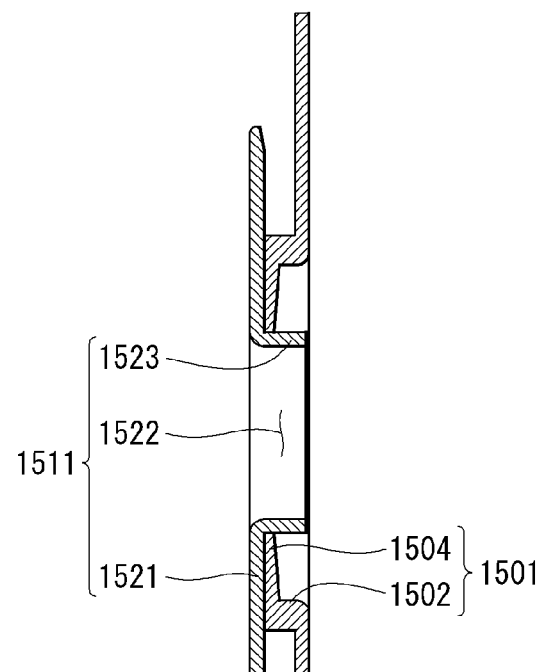

FIG. 22 illustrates a state after the fixing pin 1511 is inserted into the fixed insertion member 1501. The fixing pin 1511 may be inserted into the fixed insertion member 1501. For example, the first fixing pin may be inserted into the first fixed insertion member; the second fixing pin may be inserted into the second fixed insertion member; the third fixing pin may be inserted into the third fixed insertion member; and the fourth fixing pin may be inserted into the fourth fixed insertion member.

Figure 23:
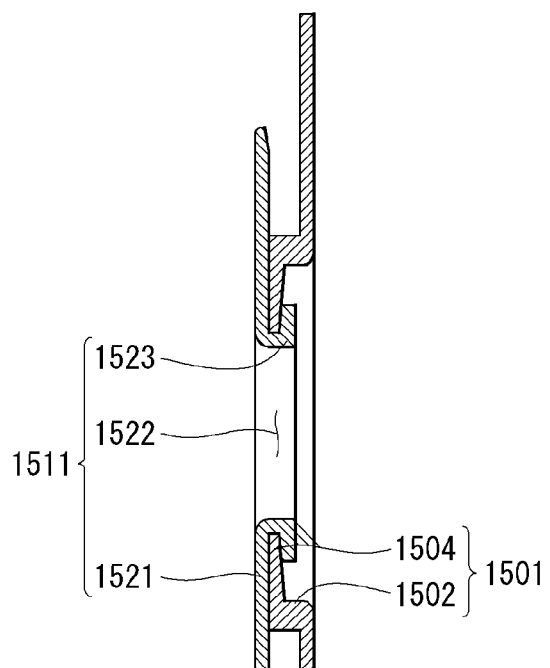
Figure 23:
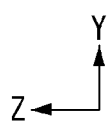
Figure 24:
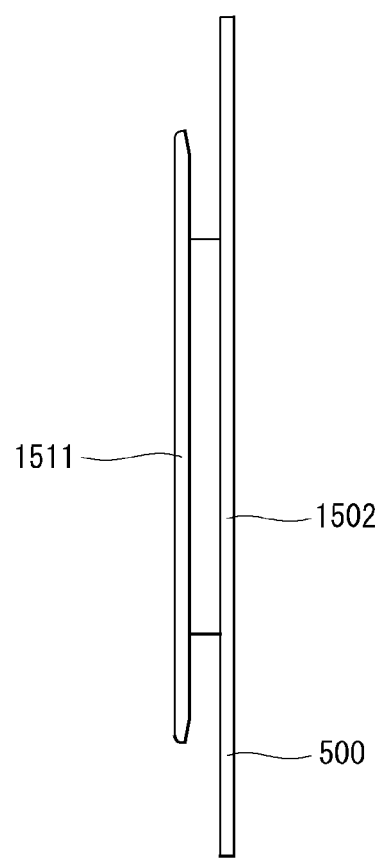

FIGS. 23 and 24 illustrate that the fixed insertion member 1501 and the fixing pin 1511 are coupled to each other after the fixing pin 1511 is inserted into the fixed insertion member 1501. After the fixing pin 1511 is inserted into the fixed insertion member 1501, an upper end of the fixing pin 1511 may be bent and attached to a lower surface of the insertion neck 1504 of the fixed insertion member 1501. Namely, an outer circumferential surface of the pin pipe wall 1523 of the fixing pin 1511 may contact the lower surface of the insertion neck 1504. For example, after the fixing pin 1511 is inserted into the fixed insertion member 1501, the fixing pin 1511 may be coupled to the fixed insertion member 1501 through a caulking operation. As the fixing pin 1511 is inserted into the fixed insertion member 1501 and then is coupled to the fixed insertion member 1501 through the caulking operation, the rear surface of the bracket 500 may not be stepped out.

The embodiment of the disclosure may protrude the fixed insertion member 1501 from the front surface of the bracket 500 and dispose the fixing pin 1511 on the front surface of the bracket 500 through the caulking operation, thereby preventing the rear surface of the bracket 500 from being stepped out. Hence, the embodiment of the disclosure can firmly fix the bracket 500 to the plate 600 using the adhesive member 550 (see FIG. 7).

In other words, because the rear surface of the bracket 500 is not stepped out, an adhesive area between the bracket 500 and the plate 600 can increase even if not a screw but the adhesive member 550 is used. Further, the bracket 500 and the plate 600 can be more closely adhered to each other.

Figure 25:
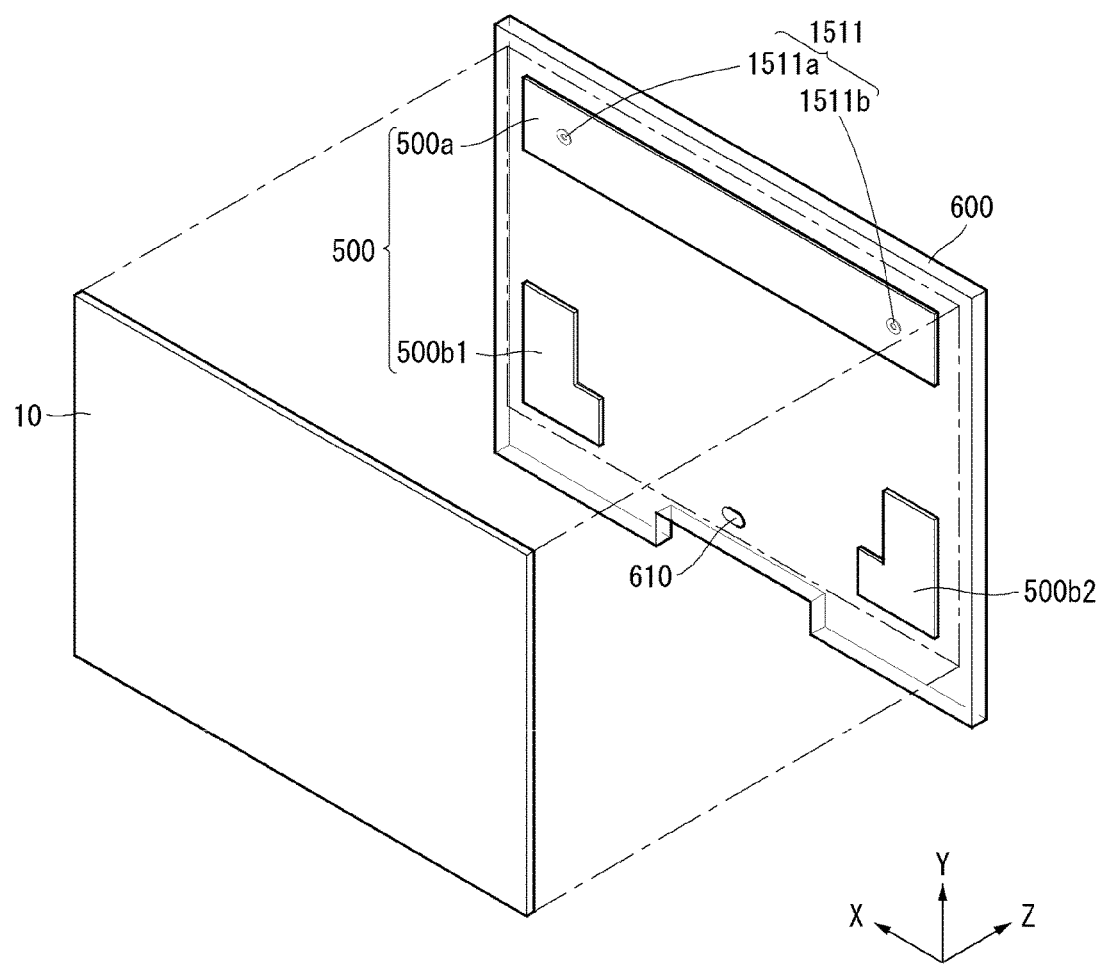
Figure 26:
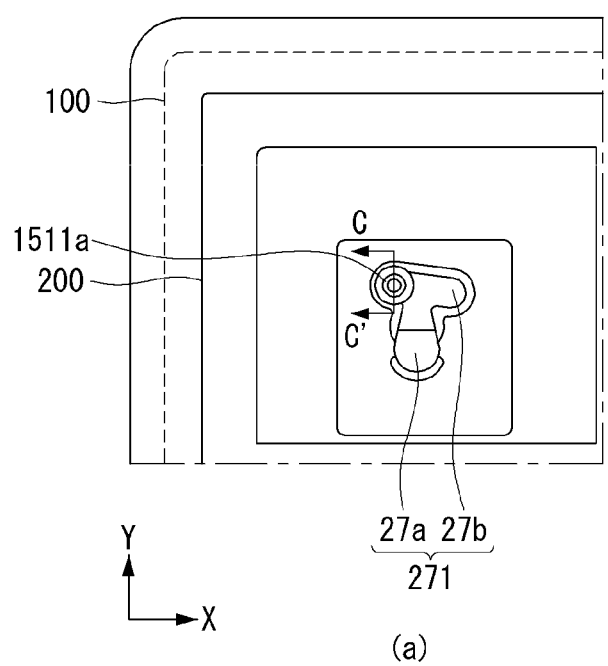
Figure 26:
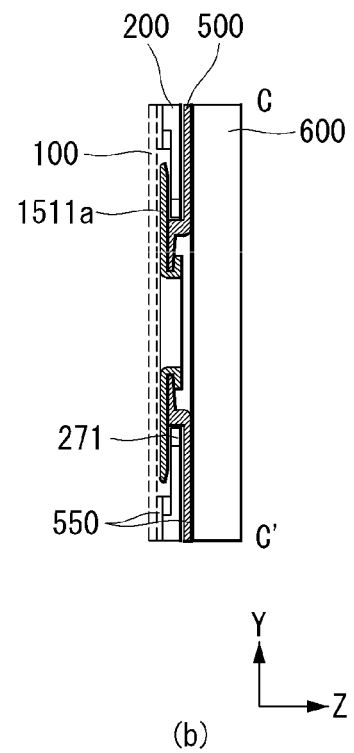

Referring to FIGS. 25 and 26, the head 10 may be coupled to the upper bracket 500a mounted with the fixing pin 1511. The fixing pin 1511 may be easily fastened to at least one side of the fastening hole 271 (see FIG. 6A) through the pin head 1521, the fixing hole 1522, and the pin pipe wall 1523.

FIG. 26 illustrates the first fastening hole 271a (see FIG. 6A) and the first fixing pin 1511 by way of example. As shown in (a) of FIG. 26, the first fixing pin 1511 may be fastened to the first fastening hole 271a disposed on the module cover 200. (a) of FIG. 26 illustrates the first fastening hole 271a and the first fixing pin 1511a when it is assumed that the display panel 100 disposed in front of the module cover 200 is transparent. (b) of FIG. 26 is a cross-sectional view taken along line C-C' of (a) of FIG. 26.

The first fastening hole 271a may include a lead-in area 27a where the first fixing pin 1511a is drawn in or out, and a seating area 27b on which the first fixing pin 1511a is seated. The lead-in area 27a may be disposed at a lower part of the first fastening hole 271a and may have a sufficient hole area capable of drawing in and out all the pin head 1521, the fixing hole 1522, and the pin pipe wall 1523. Namely, the lead-in area 27a may have the hole area larger than a diameter of the pin head 1521.

After the first fixing pin 1511a drawn in the lead-in area 27a is guided, the first fixing pin 1511a may be fixed in the seating area 27b. The seating area 27b may be disposed at an upper part of the first fastening hole 271a. The seating area 27b may have a diameter less than the diameter of the pin head 1521, so that the pin head 1521 drawn in the lead-in area 27a is not drawn out arbitrarily. Namely, the pin head 1521 may be restricted from being drawn in and out the first fastening hole 271a in the seating area 27b.

The seating area 27b may have a diameter greater than a diameter of the pin pipe wall 1523, so that the first fixing pin 1511a drawn in the lead-in area 27a can be seated while easily moving along the shape of the first fastening hole 271a. Namely, the diameter of the seating area 27b may be less than the diameter of the pin head 1521 and may be greater than the diameter of the pin pipe wall 1523. Hence, the first fixing pin 1511a may not be drawn out of the seating area 27b. The first fixing pin 1511a seated in the seating area 27b may maintain a current state unless an external force equal to or greater than a predetermined value is provided. Namely, the first fixing pin 1511a may be fixed to the seating area 27b as long as a predetermined external force is not provided.

In other words, when a predetermined external force is applied, the module cover 200 may be tilted or shifted in one direction, and the first fixing pin 1511a may relatively move along the shape of the first fastening hole 271a in accordance with the tilting or the shift of the module cover 200.

Accordingly, the embodiment of the disclosure can prevent the first fixing pin 1511a seated in the seating area 27b from moving to the lead-in area 27a by an external force unintentionally provided, thereby preventing the first fixing pin 1511a from being released from the first fastening hole 271a.

The fixing pin 1511 and the fastening hole 271, the first fixing pin 1511a and the first fastening hole 271a, or the second fixing pin 1511b and the second fastening hole 271b may be expressed as or referred to as a coupling unit. The coupling unit may be positioned between the module cover 200 and the bracket 500.

The coupling auxiliary member 275 (see FIG. 6A) may be positioned between the module cover 200 and the bracket 500. Since the coupling auxiliary member 275 was described in detail above, a description thereof is omitted.

Figure 27:
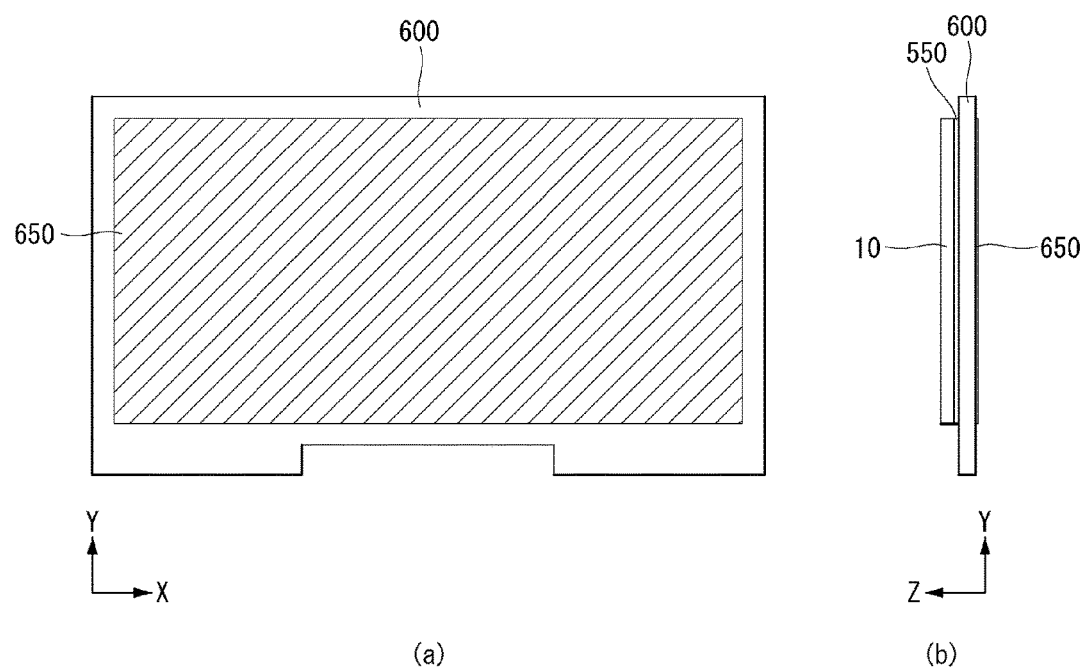
FIG. 27 illustrates an example of mounting a reinforced film on a rear surface of a plate in accordance with an embodiment of the disclosure.

Referring to FIG. 27, a reinforced film 650 may be disposed on the rear surface of the plate 600. The reinforced film 650 on the rear surface of the plate 600 can protect the plate 600. For example, the reinforced film 650 can prevent scratches generated when the plate 600 moves or scratches generated by a collision between objects. In addition, the reinforced film 650 can protect the plate 600 by distributing an external impact when the external impact is applied to the plate 600.

The reinforced film 650 may include an opaque material. The reinforced film 650 can shield various light that can be transmitted by the front of the plate 600 through the rear of the plate 600. Namely, when the user watches the display panel 100 disposed in front of the plate 600, the reinforced film 650 can block an object seen from the rear of the plate 600 and light transmitted by the rear of the plate 600. Hence, the user can concentrate more on the display screen.

Figure 28:
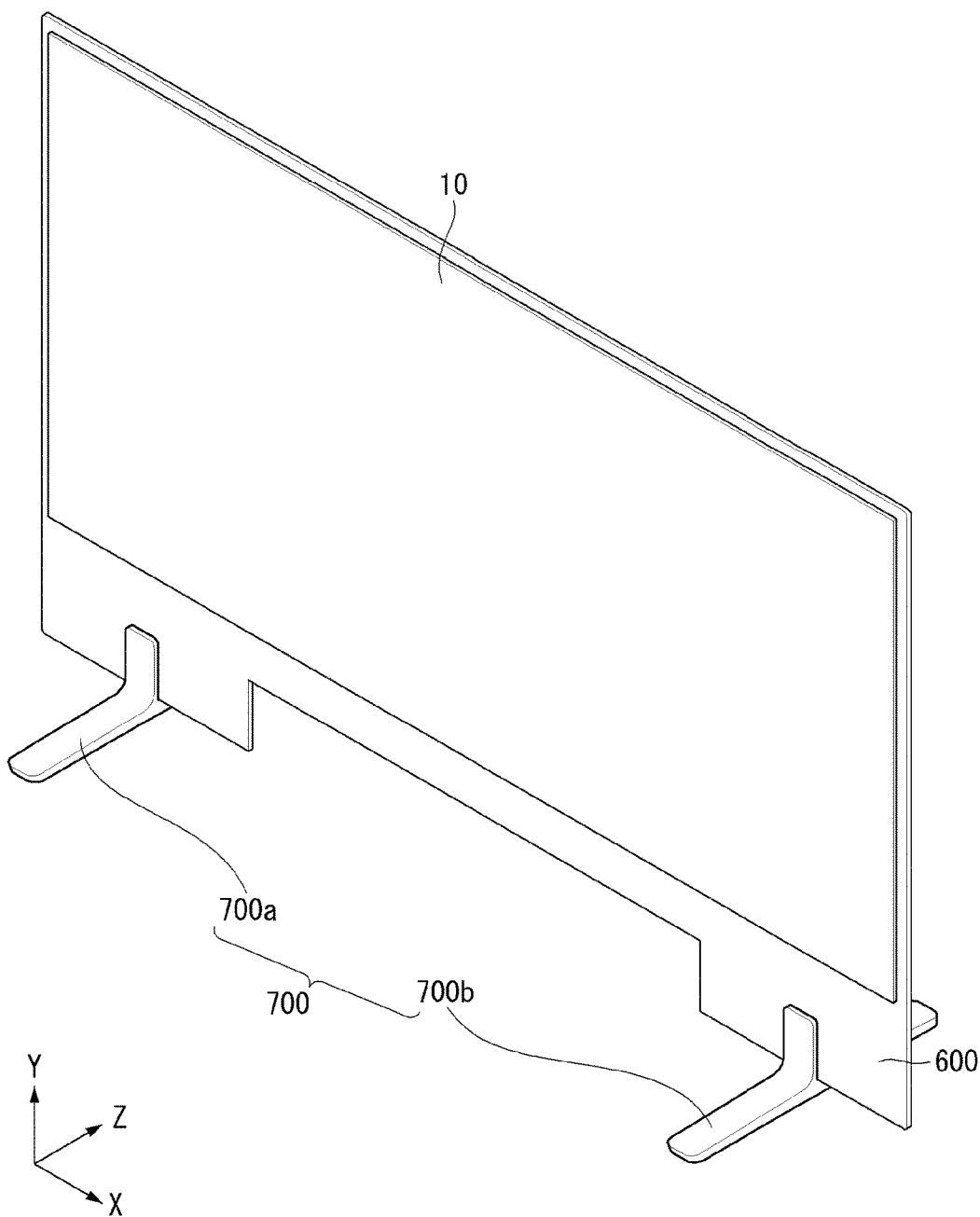
FIG. 28 illustrates an example of mounting a stand on a plate in accordance with an embodiment of the disclosure.

Referring to FIG. 28, a stand 700 may be positioned below the display panel 100 (see FIG. 1).

The stand 700 may be mounted behind the head 10 or below the plate 600 positioned behind the display panel 100 (see FIG. 1). At least one stand 700 may be positioned at the lower part of the plate 600. For example, the stand 700 may include a first stand 700a and a second stand 700b. The first stand 700a may be positioned on the left side of the lower part of the plate 600, and the second stand 700b may be positioned on the right side of the lower part of the plate 600 and may be spaced apart from the first stand 700a in a left-right direction (for example, the X-axis direction).

The first and second stands 700a and 700b may be extended in a front-back direction (for example, the Z-axis direction) of the display panel 100. The first and second stands 700a and 700b may be respectively positioned on the left and right sides of the lower part of the plate 600 and can support the lower part of the plate 600. Hence, the first and second stands 700a and 700b can firmly support the plate 600 so that the plate 600 does not swing back and forth in the front-back direction Z.

Since the first stand 700a and the second stand 700b have substantially the same configuration and the same function, the stand 700 will be described later for easier explanation.

Figure 29:
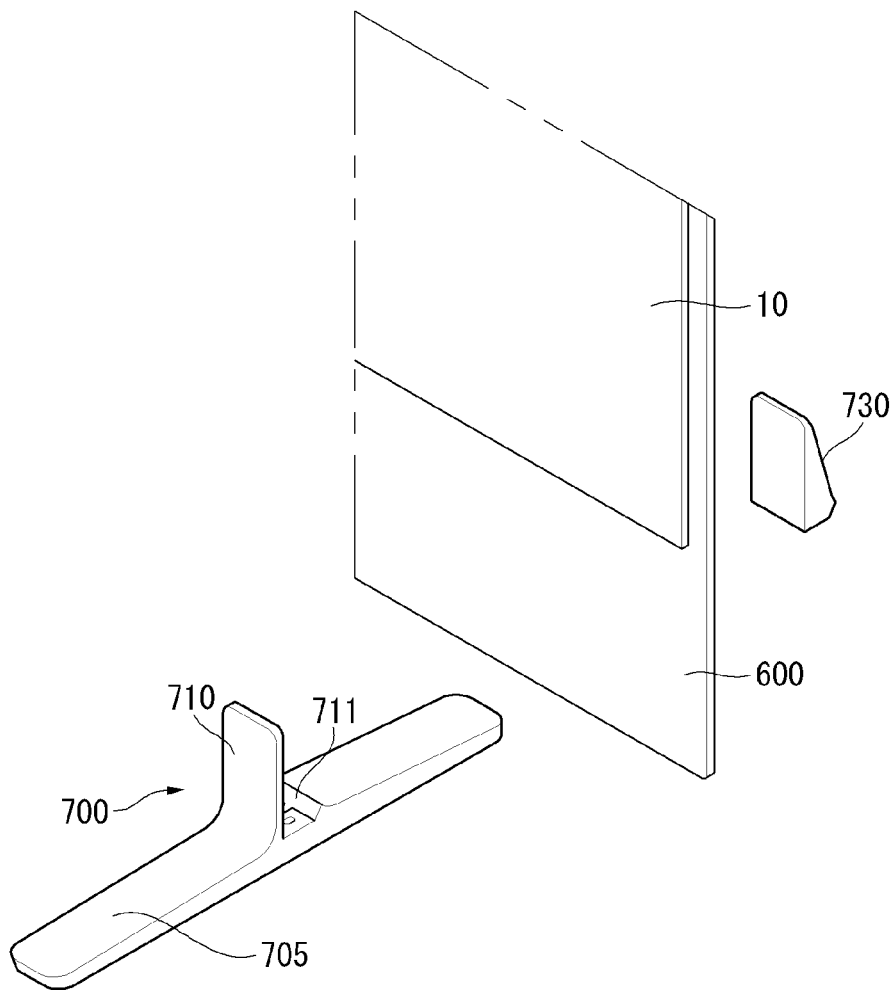
FIG. 29 illustrates an example of disassembling a stand according to an embodiment of the disclosure.

Referring to FIG. 29, a body 705 of the stand 700 may be extended in the front-back direction Z of the head 10. Namely, the body 705 may be extended in a thickness direction of the head 10 or a thickness direction of the plate 600. The body 705 may have a predetermined width and a predetermined thickness. The body 705 may be thinner as it goes from the center of the body 705 to the front or the rear of the body 705.

A support portion 710 and a support guide portion 711 may be formed on an upper surface of the body 705.

The support portion 710 may be extended from a central portion of the upper surface of the body 705 in an upward direction (for example, the Y-axis direction). The support portion 710 may be extended from the upper surface of the body 705 in the upward direction Y and may have a predetermined width and a predetermined thickness. For example, the width of the support portion 710 may be substantially the same as the width of the body 705, and the thickness of the support portion 710 may be less than the thickness of the body 705.

A front surface and a rear surface of the support portion 710 may be flat. The rear surface of the support portion 710 can support the front surface of the plate 600 while being in contact with the front surface of the plate 600.

The support guide portion 711 may be spaced apart from the support portion 710 and protrude from the upper surface of the body 705. The support guide portion 711 may protrude from the upper surface of the body 705 so as to form an inclined surface 711a (see FIG. 31) that faces the plate 600.

A support adjustment member 730 may be disposed on the upper surface of the body 705 and spaced apart from the support portion 710. The support adjustment member 730 may be positioned behind the plate 600 and may be in contact with or adjacent to the rear surface of the plate 600. The support adjustment member 730 may be fastened to or separated from the upper surface of the body 705. A detailed description thereof will be described later.

Figure 30:
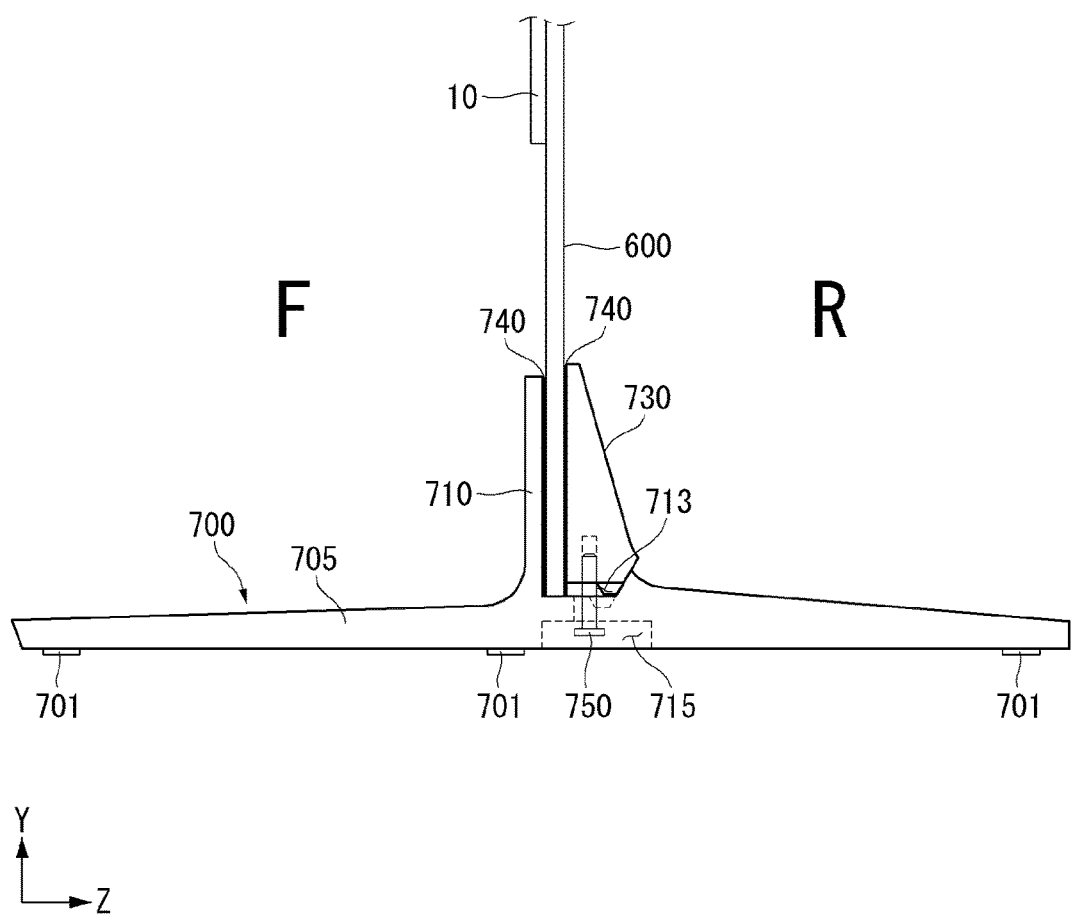
FIG. 30 illustrates an example of a side of FIG. 28.

Referring to FIG. 30, a fastening adjustment groove 713 and the support guide portion 711 may be formed on the upper surface of the body 705, and a fastening fixing groove 175 and a non-skid portion 701 may be formed on the lower surface of the body 705.

The fastening adjustment groove 713 may be positioned between the support portion 710 and the support guide portion 711. The fastening adjustment groove 713 may contact the lower surface of the plate 600. A portion of the fastening adjustment groove 713 may contact the lower surface of the plate 600, and a remaining portion may contact the lower surface of the support adjustment member 730.

A fastening fixing groove 715 may be positioned on the lower surface of the body 705 at a location corresponding to the fastening adjustment groove 713 formed on the upper surface of the body 705. The fastening fixing groove 715 may be recessed upward from the lower surface of the body 705.

A fixing member 750 may pass through a fastening adjustment hole 717 (see FIG. 31) formed in the fastening fixing groove 715 and may be fastened to the support adjustment member 730. The fixing member 750 may have a long bar shape having a screw-shaped groove (or a screw thread). For example, the fixing member 750 may be a screw, a bolt, or etc.

At least one non-skid portion 701 may be disposed. For example, the non-skid portions 701 may be respectively formed around the front side, the rear side, and the central portion of the lower surface of the body 705. The non-skid portion 701 can prevent the body 705 from sliding arbitrarily.

Further, a buffer member 740 may be positioned between the support portion 710 and the support adjustment member 730. The buffer members 740 may be positioned between the rear surface of the support portion 710 and the front surface of the plate 600 and between the rear surface of the plate 600 and the front surface of the support adjustment member 730. Thus, even when the plate 600 swings in the front-back direction Z, the buffer members 740 can further adhere the support portion 710, the plate 600, and the support adjustment member 730 to one another and can buffer an impact generated during the swing of the plate 600.

Figure 31:
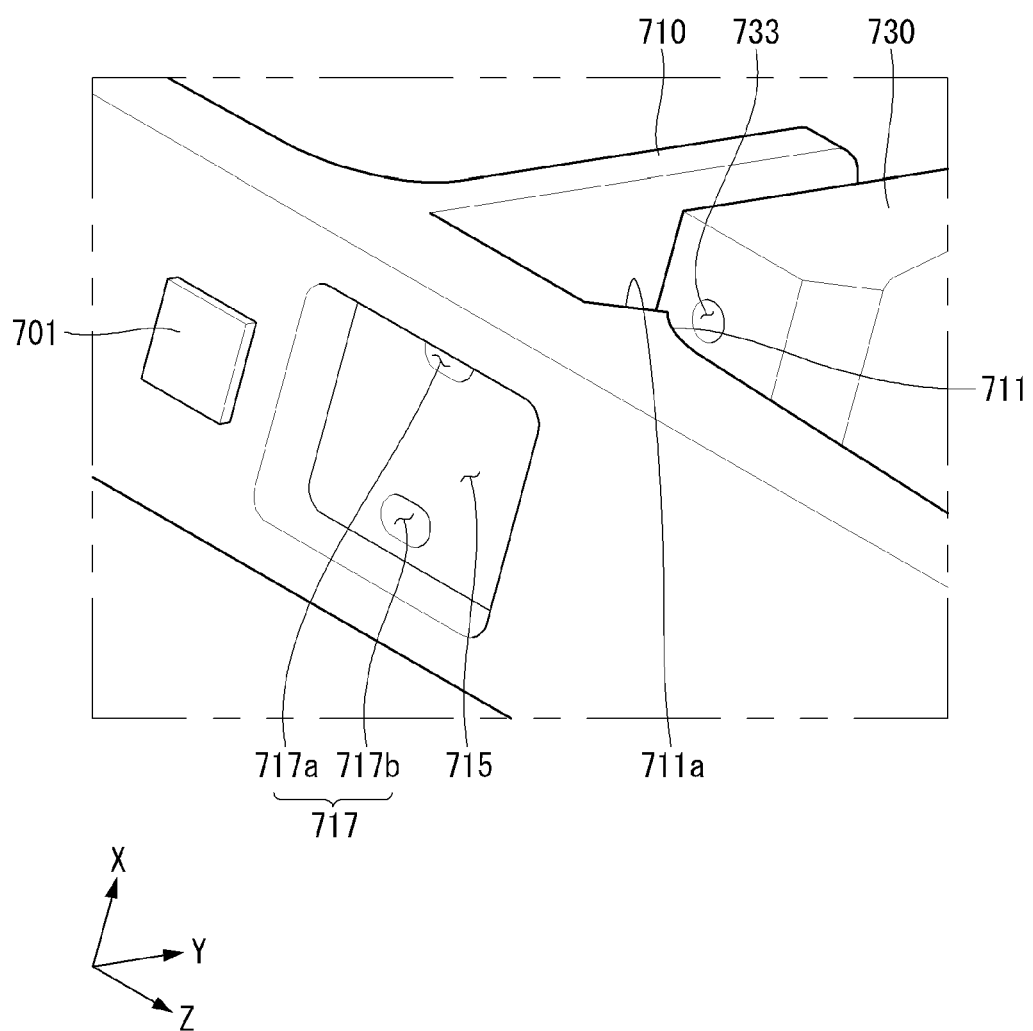
FIG. 31 illustrates an example of a lower surface of a body according to an embodiment of the disclosure.

Referring to FIG. 31, the fastening fixing groove 715 may be provided with a fastening adjustment hole 717 on a concave bottom surface. One or more fastening adjustment holes 717 may be spaced apart from each other in a left-right direction (for example, the X-axis direction). For example, the fastening adjustment hole 717 may include a first fastening adjustment hole 717a and a second fastening adjustment hole 717b. The first fastening adjustment hole 717a and the second fastening adjustment hole 717b may be spaced apart from each other in the left-right direction X.

The fastening adjustment hole 717 may be formed to penetrate the body 705. Namely, the fastening adjustment hole 717 may be formed to penetrate the fastening fixing groove 715 and the fastening adjustment groove 713. The fastening adjustment hole 717 may be formed in an oval shape.

A fixing groove 733 in which the fixing member 750 (see FIG. 30) is inserted may be formed on the lower surface of the support adjustment member 730. The fixing groove 733 may be positioned corresponding to the fastening adjustment hole 717. The fixing groove 733 may include a first fixing groove and a second fixing groove. The first fixing groove may correspond to the first fastening adjustment hole 717a, and the second fixing groove may correspond to the second fastening adjustment hole 717b. An adhesive base material having a screw thread may be formed inside the fixing groove 733.

The fixing member 750 (see FIG. 30) can adjust a distance between the support adjustment member 730 and the fastening adjustment groove 713. The support adjustment member 730 may move so as to come into contact with the fastening adjustment groove 713 through the fixing member 750.

The support guide portion 711 may protrude from the upper surface of the body 705 so as to form the inclined surface 711a facing the plate 600. The inclined surface 711a may be away from the support portion 710 as the inclined surface 711a is away from the fastening adjustment groove 713 (see FIG. 32).

The support adjustment member 730 may be partly adjacent to the inclined surface 711a and may move up and down along the inclined surface 711a in accordance with a rotation operation of the fixing member 750 (see FIG. 30). Thus, the support adjustment member 730 can more strongly press the rear surface of the plate 600 as a distance between the support adjustment member 730 and the fastening adjustment groove 713 decreases.

Figure 32:
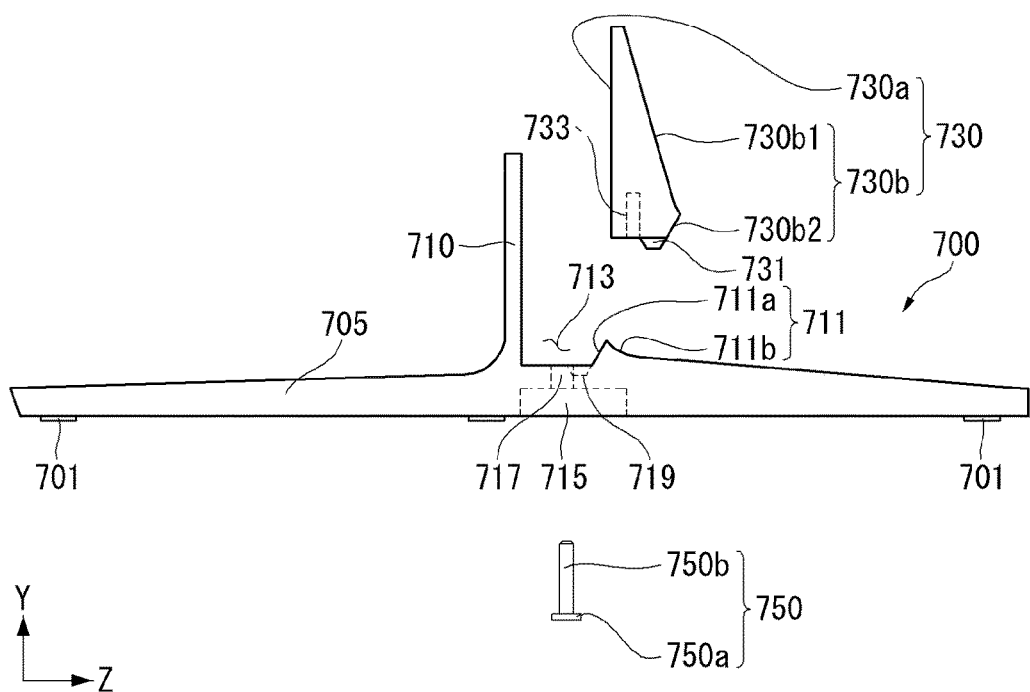
FIG. 32 is an exemplary exploded view of a side of FIG. 30.

Referring to FIG. 32, the support guide portion 711 may protrude from the upper surface of the body 705. The support guide portion 711 may be formed in the rear of the support portion 710 and may be connected to the fastening adjustment groove 713. The support guide portion 711 may be configured such that it rises from the upper surface of the fastening adjustment groove 713 at a first slope and then falls onto the upper surface of the body 705 at a second slope. The first slope may be different from the second slope. The support guide portion 711 may include a rising surface 711a rising at the first slope and a falling surface 711b falling at the second slope. In embodiments disclosed herein, the rising surface 711a may be referred to as the inclined surface 711a.

The support adjustment member 730 may have a flat front surface 730a and a rear surface 730b whose a portion protrudes backward. The front surface 730a and the rear surface 730b of the support adjustment member 730 may be formed in a wedge shape. The front surface 730a of the support adjustment member 730 may face the rear surface of the plate 600, and the rear surface 730b of the support adjustment member 730 may partially face the inclined surface 711a. The support adjustment member 730 may have a different thickness depending on a location. The thickness of the support adjustment member 730 may be defined as a distance between the front surface 730a and the rear surface 730b of the support adjustment member 730. The front surface 730a of the support adjustment member 730 may be referred to as a first surface 730a.

A distance between the front surface 730a and the rear surface 730b of the support adjustment member 730 may increase as the rear surface 730b goes from the upper side to the lower side of the front surface 730a, and the distance between the front surface 730a and the rear surface 730b may decrease around the lower side of the front surface 730a. Namely, the rear surface 730b of the support adjustment member 730 may have a first rear surface 730b1 having a third slope and a second rear surface 730b2 having a fourth slope. The second rear surface 730b2 may be referred to as a second surface 730b.

A lower surface of the support adjustment member 730 may have a larger area than an upper surface of the support adjustment member 730.

A guide protrusion 731 may be formed on the lower surface of the support adjustment member 730. The guide protrusion 731 may be extended downward from the second rear surface 730b2 of the support adjustment member 730. The guide protrusion 731 may be formed at a location where the lower surface and the second rear surface 730b2 of the support adjustment member 730 meet. The guide protrusion 731 may be positioned between the fixing groove 733 and the second rear surface 730b2 of the support adjustment member 730. Because the guide protrusion 731 is extended from the second rear surface 730b2, the guide protrusion 731 may have the fourth slope.

Figure 33:
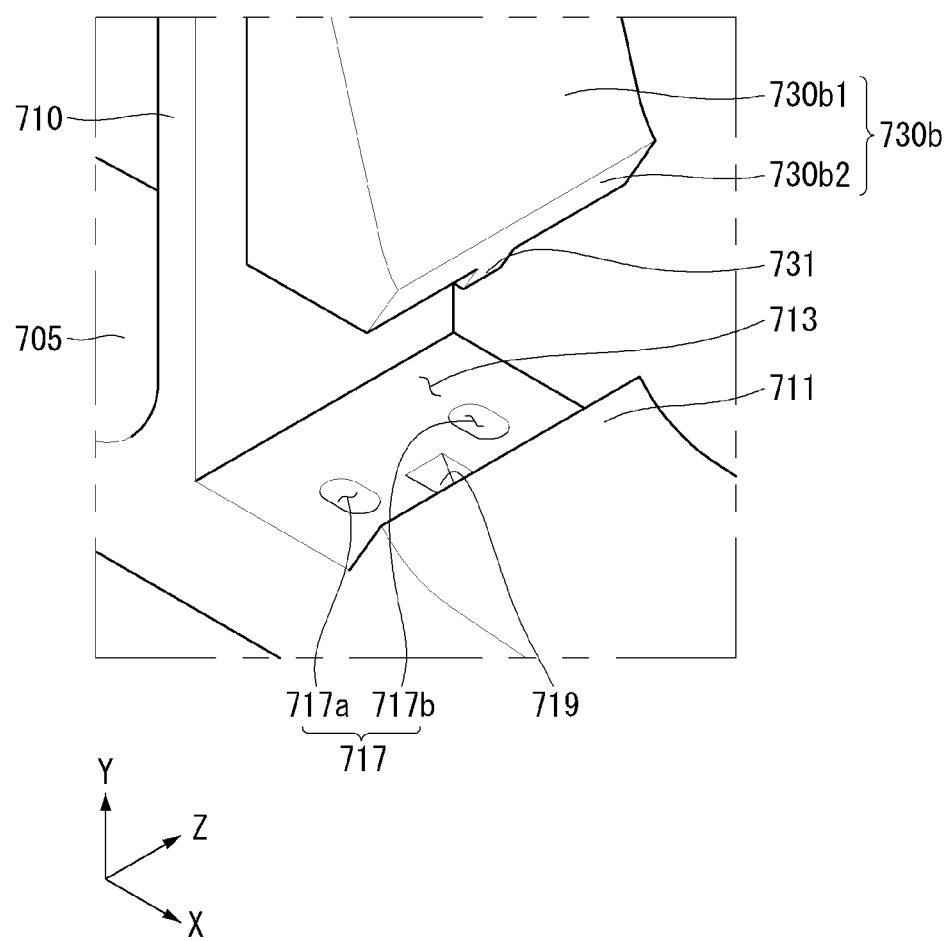
FIG. 33 illustrates an example of a support adjustment member mounted on a body according to an embodiment of the disclosure.

Referring to FIG. 33, a guide groove 719 may be formed inside the fastening adjustment groove 713. The guide groove 719 may be recessed so that the guide protrusion 731 is inserted into the guide groove 719. The guide groove 719 may be formed at a location contacting the inclined surface 711a of the support guide portion 711. The guide groove 719 may be positioned between the fastening adjustment holes 717 formed in the fastening adjustment groove 713. For example, the fastening adjustment hole 717 may include a first fastening adjustment hole 717a and a second fastening adjustment hole 717b. Hence, the guide groove 719 may be formed between the first fastening adjustment hole 717a and the second fastening adjustment hole 717b at a location contacting the rising surface 711a (see FIG. 26) of the support guide portion 711.

As a result, the guide groove 719 can prevent misassembly during the assembly of the support adjustment member 730 and the body 705.

Figure 34:
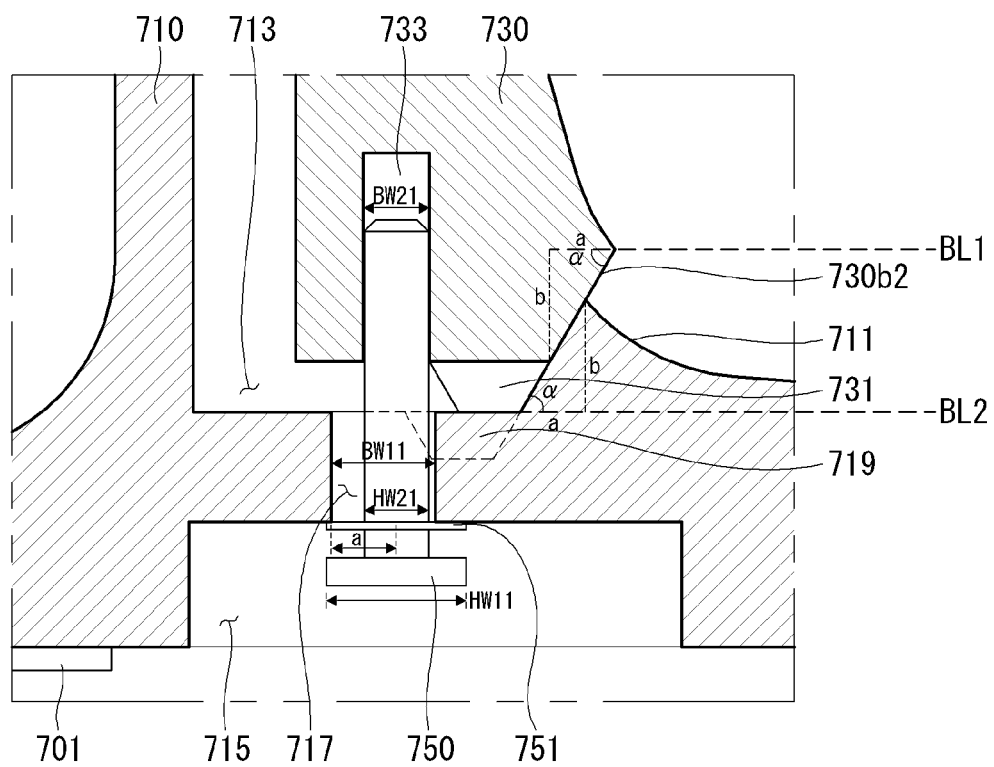
FIG. 34 illustrates an example of a relationship between a support adjustment member and a support guide portion according to an embodiment of the disclosure.

Referring to FIG. 34, the second rear surface 730b2 of the support adjustment member 730 may face the inclined surface 711a of the support guide portion 711. The second rear surface 730b2 of the support adjustment member 730 may approach the fastening adjustment groove 713 while gradually sliding along the inclined surface 711a of the support guide portion 711.

In embodiments disclosed herein, the second rear surface 730b2 of the support adjustment member 730 may have a fourth slope. The fourth slope may be defined as a slope at which the second rear surface 730b2 is inclined with respect to a first reference line BL1, wherein the first reference line BL1 is set as a line extended from a location, at which the first rear surface 730b1 and the second rear surface 730b2 contact each other, in a horizontal direction.

The inclined surface 711a of the support guide portion 711 may have a first slope. The first slope may be defined as a slope at which the support guide portion 711 in the fastening adjustment groove 713 is inclined with respect to a second reference line BL2. The first slope may be substantially the same as the fourth slope.

In addition, the guide protrusion 731 extended from the second rear surface 730b2 of the support adjustment member 730 may have the same slope as the guide groove 719 extended from the inclined surface 711a of the support guide portion 711. Namely, the guide protrusion 731 and the guide groove 719 may have the first slope or the fourth slope.

The support adjustment member 730 may be gradually away from or gradually close to the fastening adjustment groove 713 in accordance with a rotation operation of the fixing member 750 in a state where the support adjustment member 730 is in contact with the support guide 711 or faces the support guide 711. Namely, the support adjustment member 730 may move up or down along the inclined surface 711a of the support guide portion 711. In this instance, when the support adjustment member 730 gradually rises or falls between a lowest point and a highest point of the inclined surface 711a of the support guide portion 711, the support adjustment member 730 may move in the horizontal direction by a distance "a". Further, the support adjustment member 730 may move by a distance "b" in a vertical direction.

Figure 35:
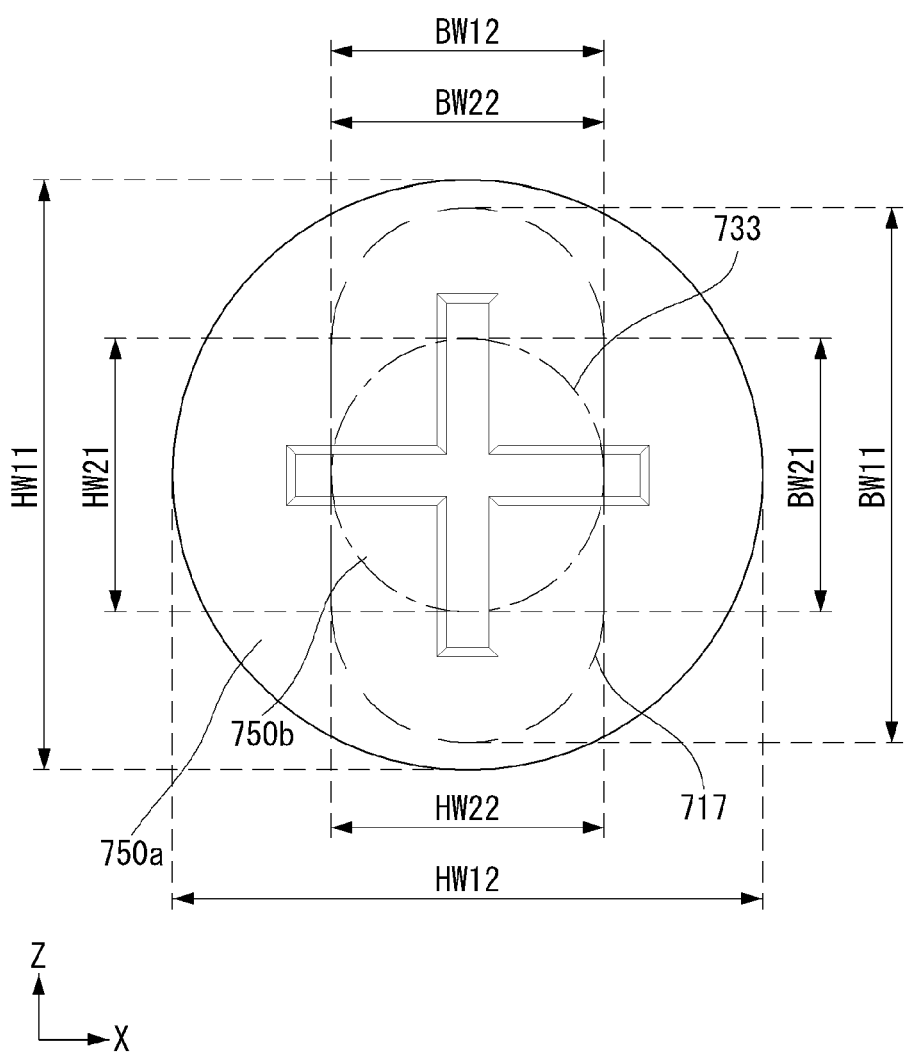
FIG. 35 illustrates an example of widths of a fixing member, a fastening adjustment hole, and a fixing groove in accordance with an embodiment of the disclosure.

Referring to FIG. 35, the fixing member 750 may include a head region 750a (see FIG. 32) and a body region 750b (see FIG. 32). A first width HW11 of the head region 750a may be greater than a first width HW21 of the body region 750b, and a second width HW12 of the head region 750a may be greater than a second width HW22 of the body region 750b. The first widths HW11 and HW21 may be defined as a length measured based on the front-back direction Z of the body 705, and the second widths HW12 and HW22 may be defined as a length measured based on the left-right direction X of the body 705.

A first width BW11 of the fastening adjustment hole 717 may be less than the first width HW11 of the head region 750a and may be greater than the first width HW21 of the body region 750b. A first width BW21 of the fixing groove 733 may be substantially the same as the first width HW21 of the body region 750b. The first width BW11 of the fastening adjustment hole 717 may be greater than the first width BW21 of the fixing groove 733.

A second width BW12 of the fastening adjustment hole 717 may be less than the second width HW12 of the head region 750a and may be substantially the same as the second width HW22 of the body region 750b. A second width BW22 of the fixing groove 733 may be substantially the same as the second width HW22 of the body region 750b. Hence, the second width BW12 of the fastening adjustment hole 717 may be substantially the same as the second width BW22 of the fixing groove 733.

The first width BW11 of the fastening adjustment hole 717 may be longer than the distance "a" (see FIG. 34). Hence, the fixing member 750 may be inserted into the fastening adjustment hole 717 and may move in the horizontal direction by the distance "a" within the first width BW11 of the fastening adjustment hole 717.

Namely, an advance size of the fixing member 750 inserted into the fastening adjustment hole 717 may be dependent on sizes "a" and "b" of the inclined surface and an inclination angle "a (alpha)".

Figure 36:
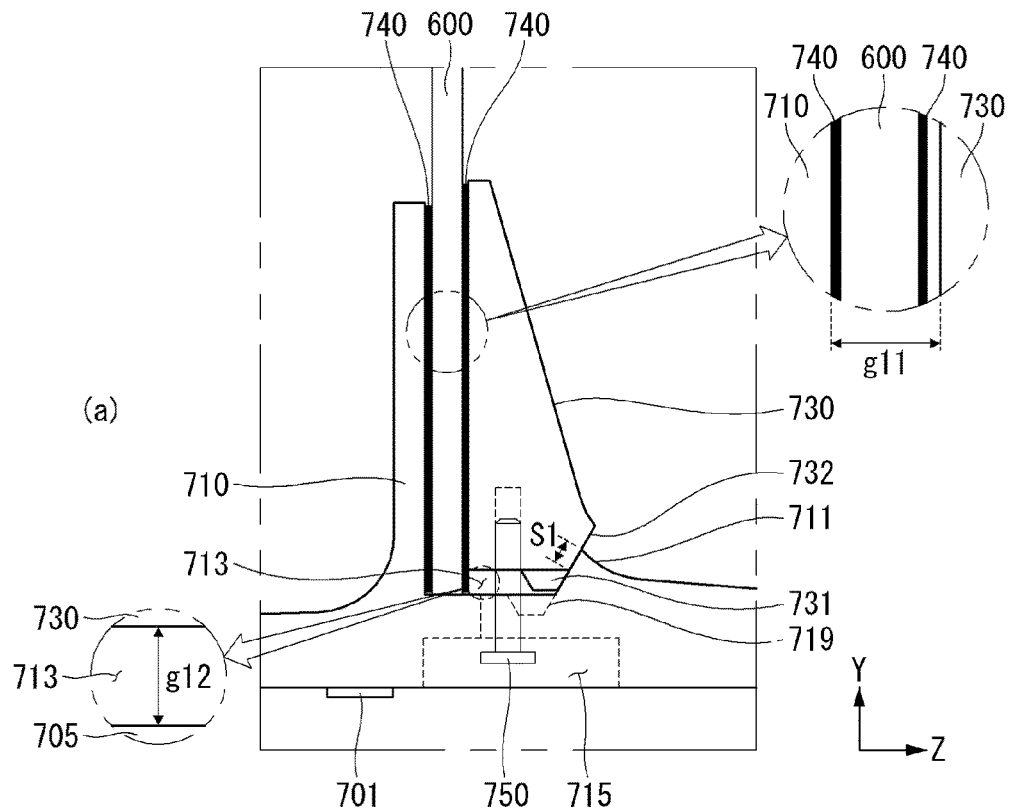
FIGS. 36 to 38 illustrate examples of an operation for mounting a stand on a plate in accordance with an embodiment of the disclosure.
Figure 36:
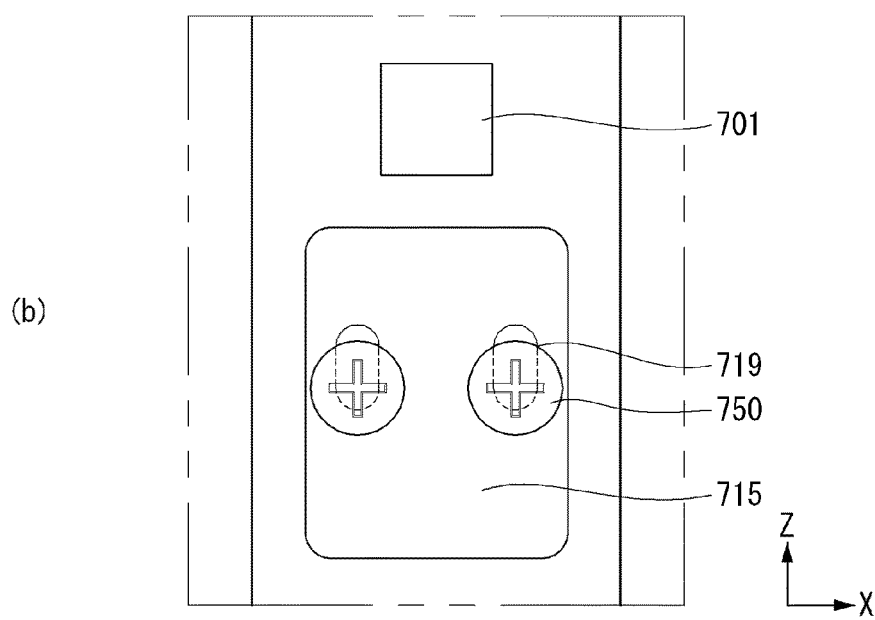
Figure 37:
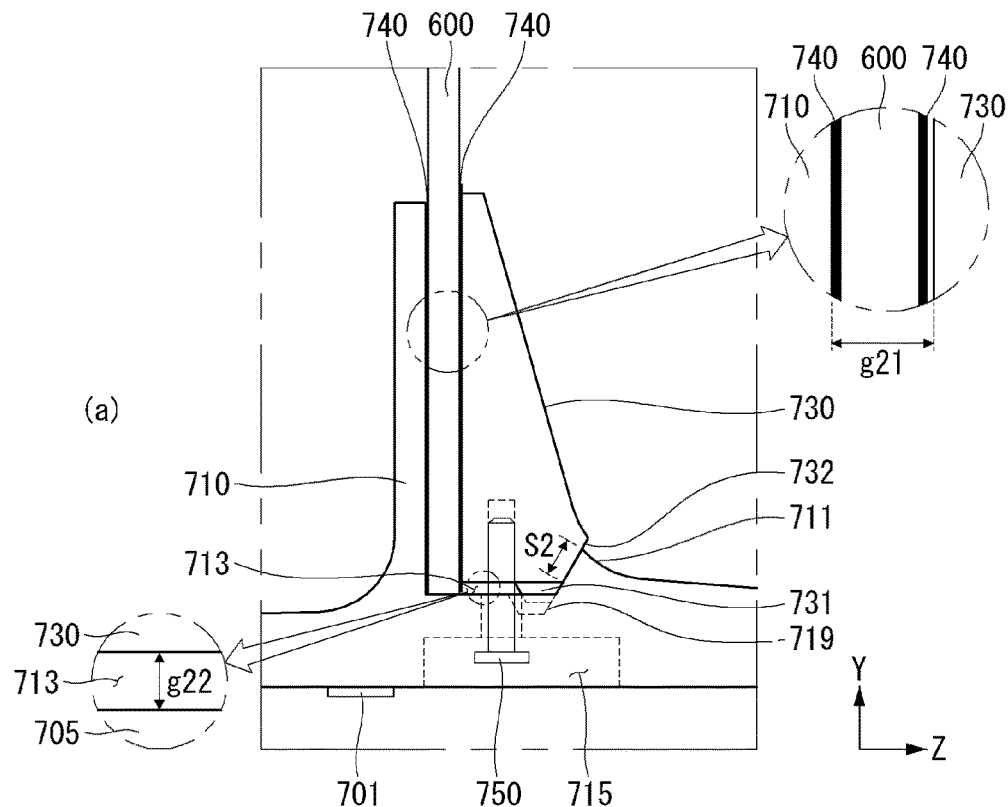
Figure 37:
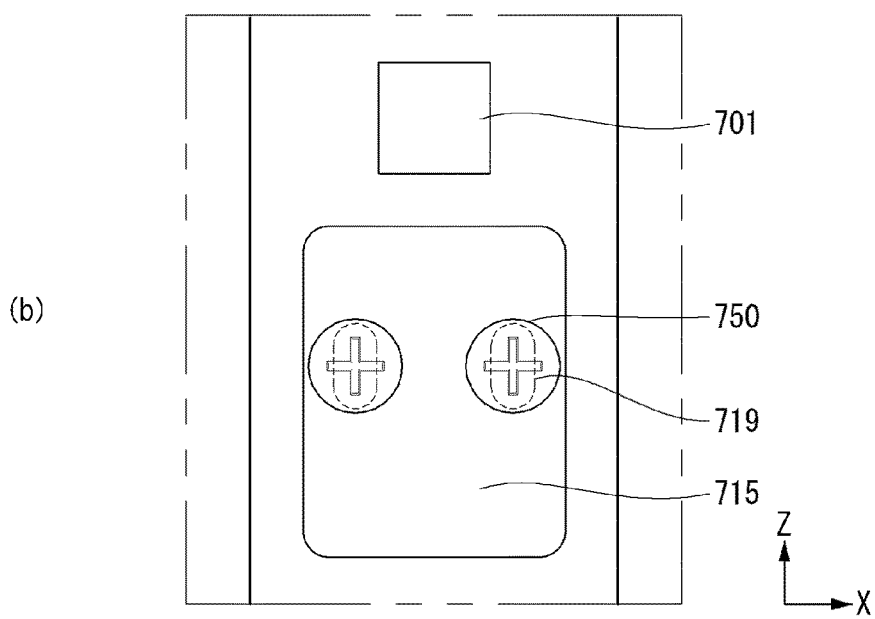
Figure 38:
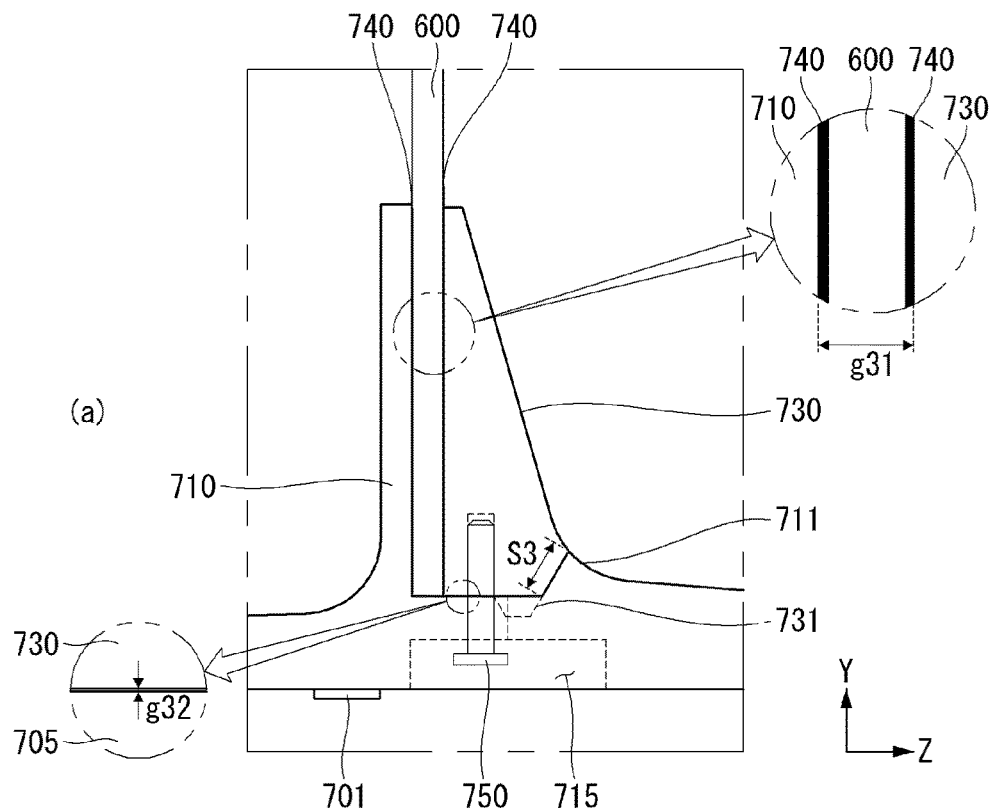
Figure 38:
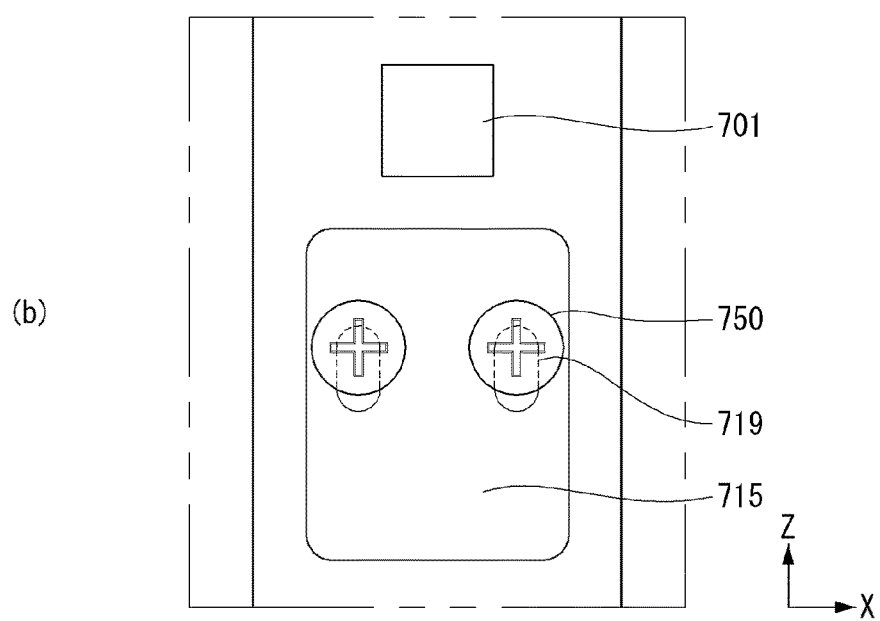

Referring to FIGS. 36 to 38, the fixing member 750 may be inserted into the fastening adjustment hole 717 and may be positioned at one of first to third locations. For example, one side of the fastening adjustment hole 717 may be the third location close to the support portion 710, and the other side of the fastening adjustment hole 717 may be the first location close to the support guide portion 711. A central portion of the fastening adjustment hole 717 may be the second location between the first location and the third location.

Referring to (a) and (b) of FIG. 36, the fixing member 750 may be inserted into the fastening adjustment hole 717 and positioned at the first location. In this instance, an end of the body region 750b of the fixing member 750 may be inserted into the fixing groove 733 of the support adjustment member 730. Thus, when the fixing member 750 is positioned at the first location, the support adjustment member 730 may be positioned to contact or face the inclined surface 711a of the support guide portion 711. At the first location, the guide protrusion 731 may be in a state before being inserted into the guide groove 719.

When the fixing member 750 is positioned at the first location, there may be an eleventh gap g11 between the support adjustment member 730 and the support portion 710. Further, there may be a twelfth gap g12 between the lower surface of the support adjustment member 730 and the fastening adjustment groove 713. A contact area of the support adjustment member 730 and the support guide portion 711 may be a first area s1.

Afterward, when the fixing member 750 rotates clockwise, the fixing member 750 may move to the second location of the fastening adjustment hole 717.

Referring to (a) and (b) of FIG. 37, the fixing member 750 may move from the first location to the second location in the front-back direction Z. In this instance, the end of the body region 750b of the fixing member 750 may be inserted to the middle of the fixing groove 733 of the support adjustment member 730. When the fixing member 750 is positioned at the second location, the support adjustment member 730 may be positioned to continuously contact or face the inclined surface 711a of the support guide portion 711. Further, the guide protrusion 731 may be in a state being partly inserted into the guide groove 719.

In this instance, there may be a 21th gap g21 between the support adjustment member 730 and the support portion 710. The 21th gap g21 may be less than the eleventh gap g11. Further, there may be a 22th gap g22 between the lower surface of the support adjustment member 730 and the fastening adjustment groove 713. The 22th gap g22 may be less than the twelfth gap g12. A contact area of the support adjustment member 730 and the support guide portion 711 may be a second area s2. The second area s2 may be greater than the first area s1.

Afterward, when the fixing member 750 continuously rotates clockwise, the fixing member 750 may move to the third location of the fastening adjustment hole 717.

Referring to (a) and (b) of FIG. 38, the fixing member 750 may move from the second location to the third location in the front-back direction Z. In this instance, the body region 750b of the fixing member 750 may be entirely inserted to the fixing groove 733 of the support adjustment member 730. When the fixing member 750 is positioned at the third location, the lower surface of the support adjustment member 730 may be in contact with the fastening adjustment groove 713. Further, the guide protrusion 731 may be in a state being entirely inserted into the guide groove 719.

In this instance, there may be a 31th gap g31 between the support adjustment member 730 and the support portion 710. The 31th gap g31 may be less than the 21th gap g21. Further, there may be a 32th gap g32 between the lower surface of the support adjustment member 730 and the fastening adjustment groove 713. The 32th gap g32 may be less than the 22th gap g22. A contact area of the support adjustment member 730 and the support guide portion 711 may be a third area s3. The third area s3 may be greater than the second area s2.

When the fixing member 750 moves from the first location to the third location in the horizontal direction while rotating, a distance between the fixing adjusting member 730 and the fastening adjustment groove 713 may gradually decrease. Hence, the fixing adjusting member 730 may be fixed to the fastening adjustment groove 713. Namely, when the support adjustment member 730 is fastened to the body 705 through the fixing member 750, the fixing member 750 may press the support adjustment member 730 to the plate 600 while advancing forward from the rear along the fastening adjustment hole 717. When the support adjustment member 730 is closely adhered to the fastening adjustment groove 713 as described above, the fixing member 750 can firmly fix the support portion 710 and the plate 600.

Figure 39:
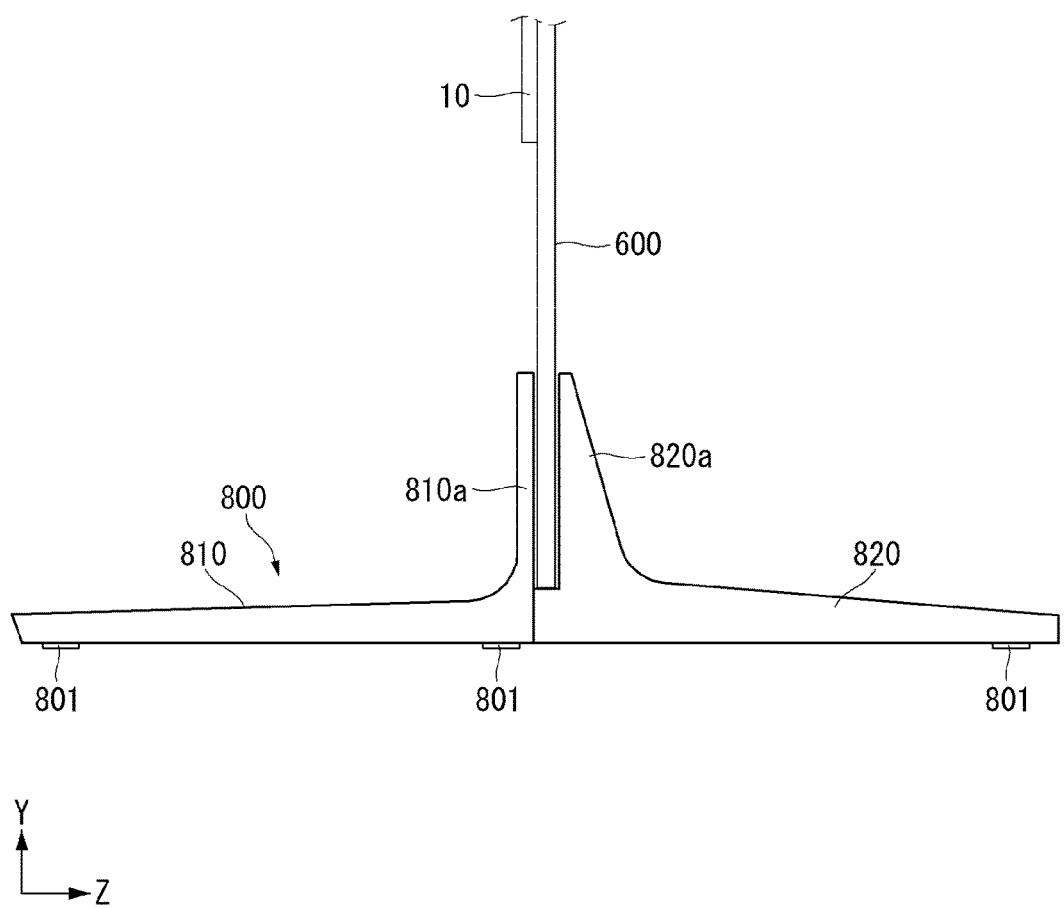
FIG. 39 illustrates an example where a stand is mounted on a plate in accordance with an embodiment of the disclosure.

Referring to FIG. 39, a stand 800 may be positioned below the head 10. The stand 800 may be extended in the thickness direction of the plate 600. The stand 800 may include a front stand 810 and a rear stand 820. The front stand 810 may be disposed in front of the head 10, and the rear stand 820 may be disposed in rear of the head 10.

The plate 600 may be disposed between the front stand 810 and the rear stand 820. The front stand 810 and the rear stand 820 may be fastened to each other and can support the plate 600 in a fastened state.

The front stand 810 may include a front support 810a. The front support 810a may be extended from the rear or back side of an upper surface of the front stand 810 in the upward direction Y. The front support 810a may be extended from the upper surface of the front stand 810 in the upward direction Y and may have a predetermined width and a predetermined thickness. The front support 810a may have a flat rear surface contacting the plate 600. In embodiments disclosed herein, the rear surface of the front support 810a may be referred to as a rear surface of the front stand 810.

The rear stand 820 may include a rear support 820a. The rear support 820a may be extended from the front or front side of an upper surface of the rear stand 820 in the upward direction Y. The rear support 820a may be extended from the upper surface of the rear stand 820 in the upward direction Y and may have a predetermined width. An upper side and a lower side of the rear support 820a may have different thicknesses. A thickness of the upper side may be less than a thickness of the lower side. In other words, the thickness of the rear support 820a may gradually increase as it goes from the upper side to the lower side.

A compression adjustment portion 813 (see FIG. 40) may be formed on the front surface of the rear support 820a contacting the plate 600, and a compression member 830 (see FIG. 40) may be inserted into the compression adjustment portion 813. In embodiments disclosed herein, the front surface of the rear support 820a may be referred to as a front surface of the rear stand 820.

At least one non-skid portion 801 may be formed on a lower surface of the stand 800. For example, the non-skid portion 801 may be disposed on the lower surface of the front stand 810 or the lower surface of the rear stand 820 and around a region in which the front stand 810 and the rear stand 820 are fastened. The non-skid portion 801 can prevent the stand 800 from sliding arbitrarily.

As shown in FIG. 28, at least one stand 800 may be disposed at the lower part of the plate 600. For example, the stand 800 may include a first stand and a second stand. The first stand may be disposed on the left side of the lower part of the plate 600, and the second stand may be disposed on the right side of the lower part of the plate 600 and spaced apart from the first stand in the left-right direction X.

The first and second stands may be respectively disposed on the left and right sides of the lower part of the plate 600 to support the lower part of the plate 600, thereby firmly supporting the plate 600 so that the plate 600 does not swing back and forth in the front-back direction Z.

Figure 40:
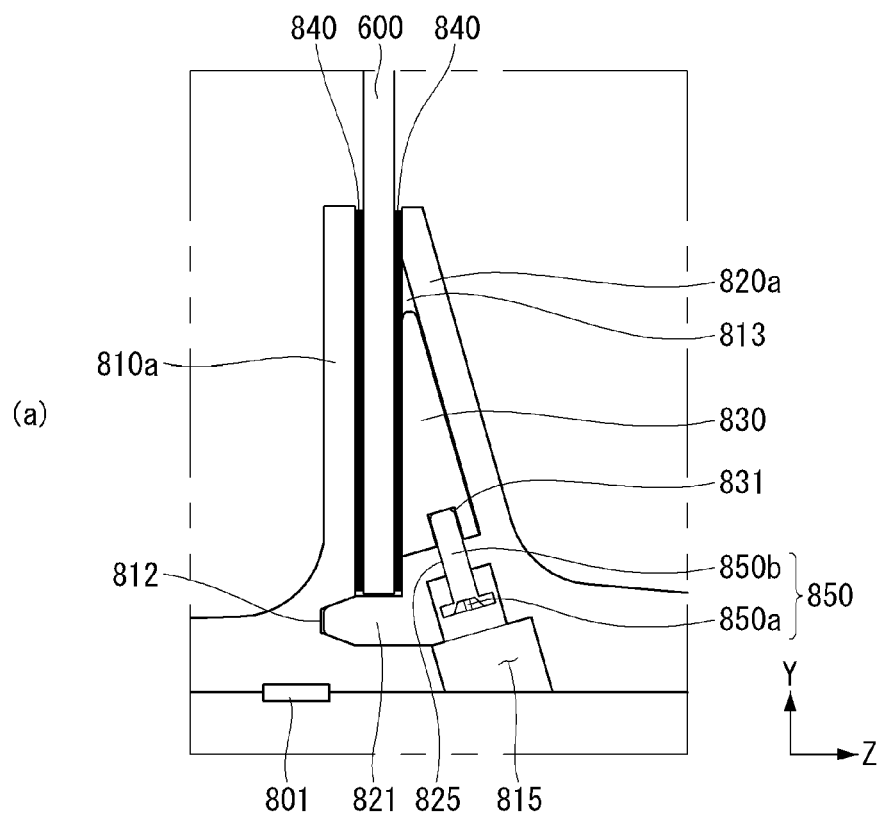
FIGS. 40 to 42 illustrate other examples of an operation for mounting a stand on a plate in accordance with an embodiment of the disclosure.
Figure 40:
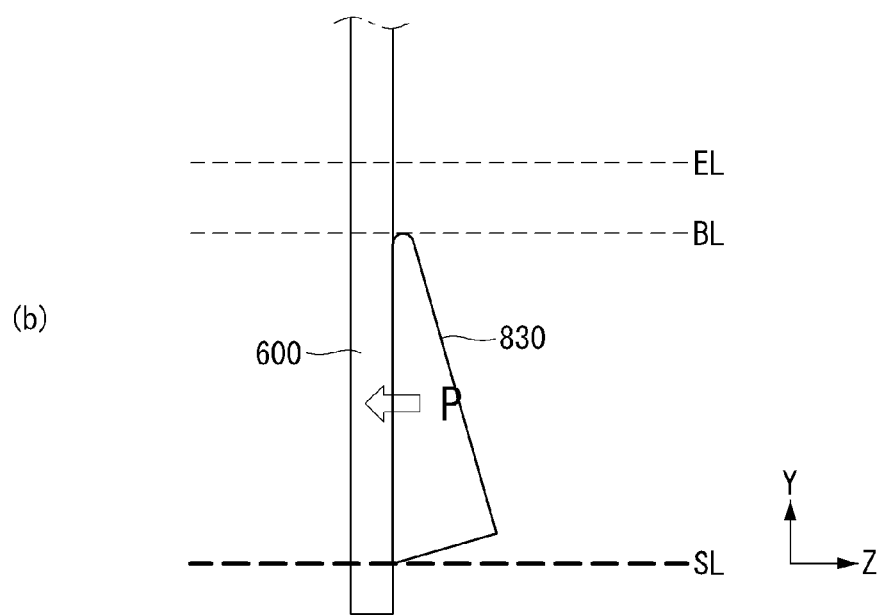

Referring to (a) of FIG. 40, a fixed fastening groove 815 may be positioned on the lower surface of the rear stand 820. The fixed fastening groove 815 may be positioned below the rear support 820a. The fixed fastening groove 815 may be positioned below the rear support 820a in an oblique direction facing the plate 600.

The compression adjustment portion 813 may be positioned on the front surface of the rear support 820a and may be formed in a concave shape toward the rear. A depth of the compression adjustment portion 813 may increase as it goes from the upper side to the lower side of the rear support 820a. For example, the compression adjustment portion 813 may be formed such that a cross section cut in the left-right direction X has a right triangle shape. A hypotenuse of the right triangle in the compression adjustment portion 813 of the right triangle shape may be formed on the front surface of the rear support 820a.

A compression adjustment hole 825 connected to the fixed fastening groove 815 may be formed on the lower surface of the compression adjustment portion 813. The compression adjustment hole 825 may be positioned between the compression adjustment portion 813 and the fixed fastening groove 815 and may be formed to penetrate the compression adjustment portion 813 and the fixed fastening groove 815. The compression adjustment hole 825 may have substantially the same diameter as the diameter of the body region 850b of the fixing member 850. The fixing member 850 may pass through the compression adjustment hole 825 and may be fastened to the compression member 830.

The compression member 830 may be positioned inside the compression adjustment portion 813. The compression member 830 may have substantially the same shape as the compression adjustment portion 813 and may have a smaller size than the compression adjustment portion 813. For example, the compression member 830 may be formed such that a cross section cut in the front-back direction Z has a right triangle shape. A hypotenuse of the right triangle in the compression member 830 of the right triangle shape may be positioned on the front surface of the rear support 820a and may be attached to the rear surface of the plate 600. The compression member 830 may be positioned at different locations in accordance with a rotation operation of the fixing member 850. Namely, the compression member 830 may operate to press the rear surface of the plate 600 in response to the rotation operation of the fixing member 850.

A buffer member 840 may be formed between the front support 810a and the rear support 820a. The buffer members 840 may be disposed between the rear surface of the front support 810a and the front surface of the plate 600 and between the rear surface of the plate 600 and the front surface of the rear support 820a. Hence, even when the plate 600 swings in the front-back direction Z, the buffer members 840 can further adhere the front support 810a, the plate 600, and the rear support 820a to one another and can buffer an impact generated during the swing of the plate 600.

A fastening groove 812 may be formed on the lower side of the rear surface of the front stand 810 and may be recessed toward the front or the front side. Corresponding to the fastening groove 812, the rear stand 820 may have a fastening protrusion 821 that is formed on the lower side of the front surface of the rear stand 820 and protrudes toward the front. The fastening protrusion 821 of the rear stand 820 may be inserted into the fastening groove 812 of the front stand 810 and fastened to each other. At least one fastening protrusion 821 and at least one fastening groove 812 may be spaced apart from each other.

Referring to (b) of FIG. 40, the compression member 830 positioned inside the compression adjustment portion 813 may be positioned between a starting line SL and a reference line BL. Namely, the upper side of the compression member 830 may be positioned in contact with the reference line BL, and the lower side of the compression member 830 may be positioned in contact with the starting line SL. The lower surface of the compression member 830 may be in contact with the lower surface of the compression adjustment portion 813, and the upper side of the compression member 830 may be spaced apart from the upper side of the compression adjustment portion 813.

In this instance, an end of the body region 850*b* of the fixing member 850 may be in contact with the bottom surface of the fixing hole 831 of the compression member 830. Namely, the fixing member 850 may be inserted into the fixing hole 831, and a first separation distance may be provided between the fixing member 850 and the fixing hole 831. The first separation distance may be a value substantially close to zero.

In embodiments disclosed herein, the starting line SL may be a line extended in the horizontal direction from a location where the fixing member 850 fastened to the compression member 830 meets the lower side of the compression member 830 before the rotation operation. The reference line BL may be a line extended in the horizontal direction from a location where the fixing member 850 fastened to the compression member 830 meets the upper side of the compression member 830 before the rotation operation.

The compression member 830 may be positioned between the starting line SL and the reference line BL in an initial state before the fixing member 850 rotates. The compression member 830 may apply a first pressure to the plate 600 contacting the compression member 830.

Figure 41:
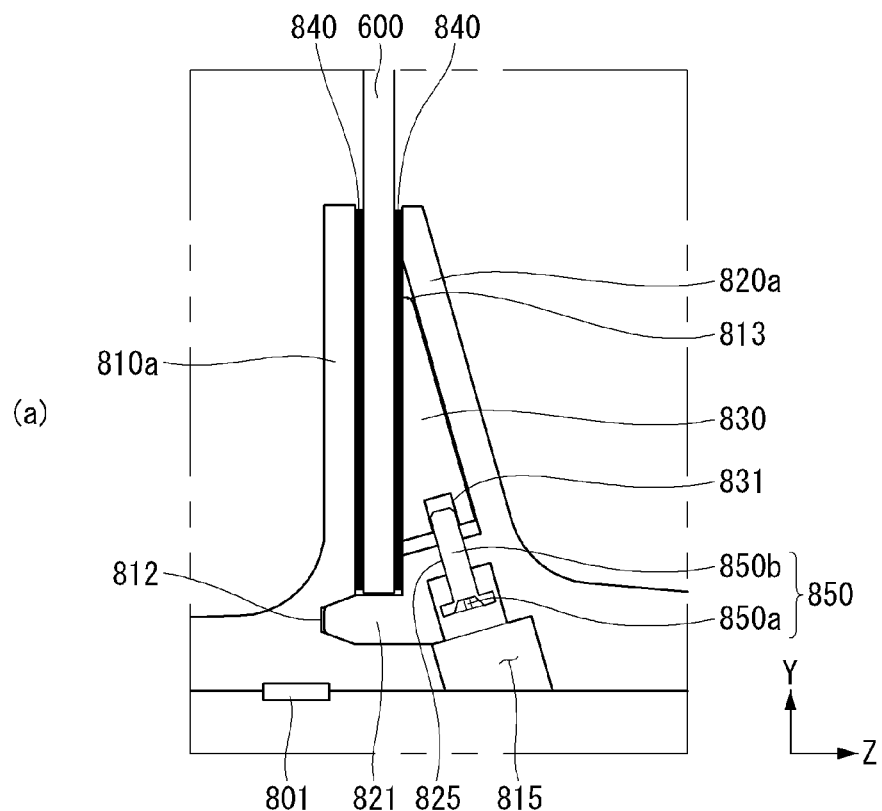
Figure 41:
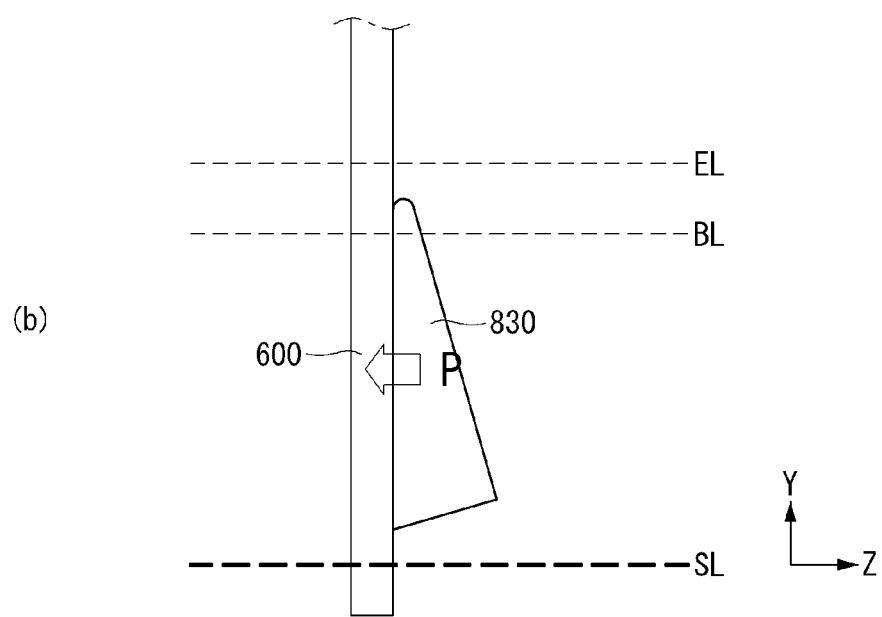

Referring to (a) and (b) of FIG. 41, the fixing member 850 may perform the rotation operation. The fixing member 850 may convert a rotary motion into a linear motion through the rotation operation and can move the compression member 830. Hence, the compression member 830 may be positioned between the starting line SL and an end line EL by the rotation operation of the fixing member 850. In this instance, the lower surface of the compression member 830 may be spaced apart from the lower surface of the compression adjustment portion 813, and the upper side of the compression member 830 may be spaced apart from the upper side of the compression adjustment portion 813. Namely, the upper side of the compression member 830 may be positioned between the reference line BL and the end line EL, and the lower side of the compression member 830 may be positioned between the reference line BL and the starting line SL.

In this instance, the end of the body region 850*b* of the fixing member 850 may be spaced apart from the bottom surface of the fixing hole 831 of the compression member 830. Namely, the fixing member 850 may be inserted into the fixing hole 831, and a second separation distance may be provided between the fixing member 850 and the fixing hole 831. The second separation distance may be greater than the first separation distance.

In embodiments disclosed herein, the end line EL may be a line extended in the horizontal direction from a maximum location at which the compression member 830 can be moved by the fixing member 850. Namely, the compression member 830 cannot move over the end line EL. The compression member 830 can move between the reference line BL and the end line EL.

The compression member 830 may apply a second pressure to the plate 600 contacting the compression member 830. The second pressure may be a pressure higher than the first pressure. When the second pressure is applied to the plate 600 between the front support 810*a* and the rear support 820*a* as described above, the movement of the plate 600 may be confined between the front support 810*a* and the rear support 820*a*.

Figure 42:
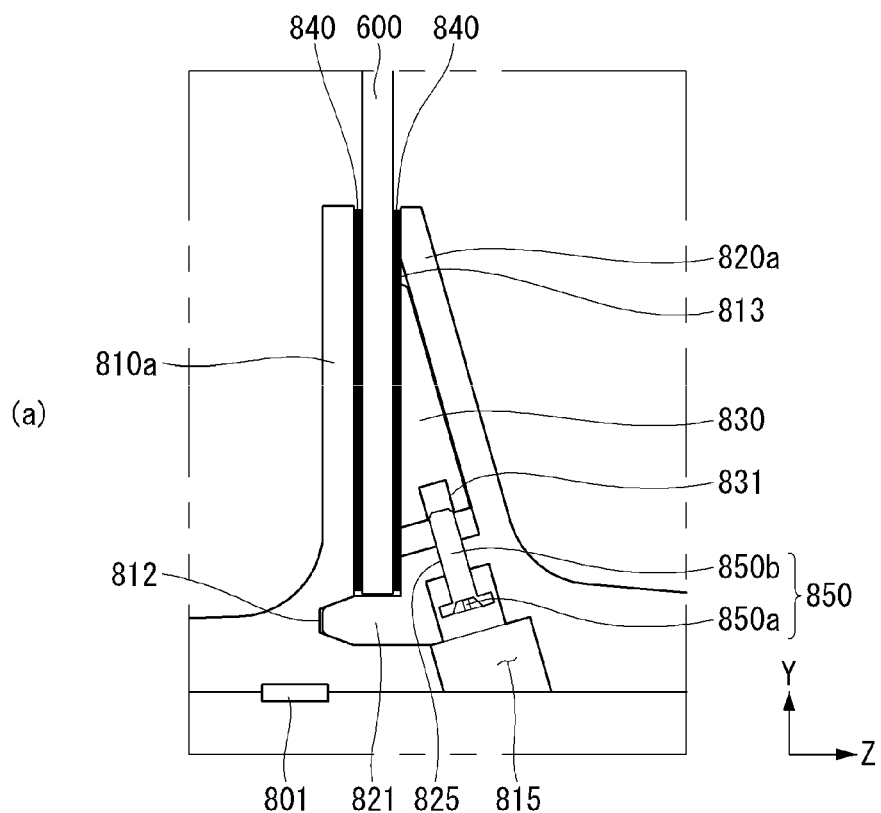
Figure 42:
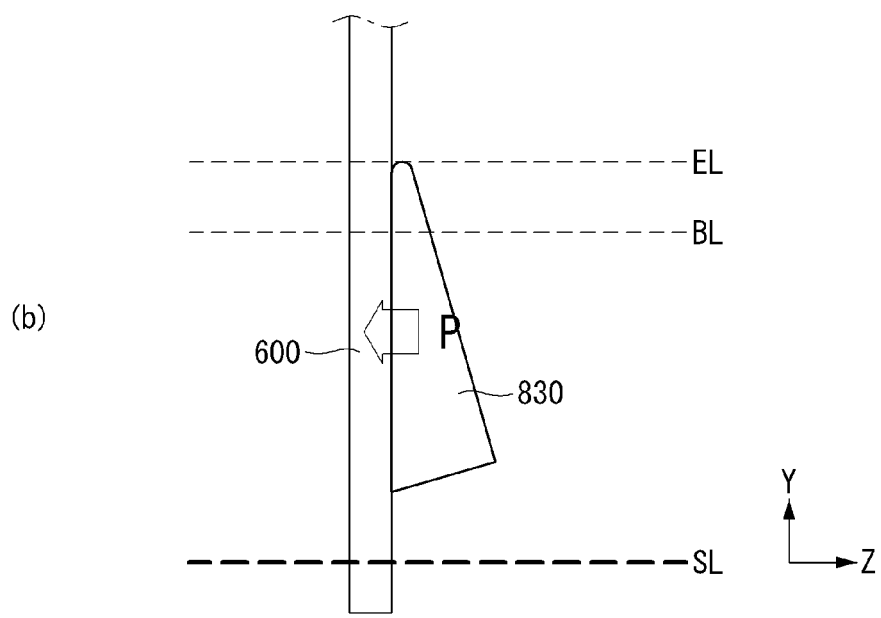

Referring to (a) and (b) of FIG. 42, the rotation operation of the fixing member 850 may be completed. The compression member 830 may be positioned near the end line EL by the rotation operation of the fixing member 850. In this instance, the lower surface of the compression member 830 may be spaced apart from the lower surface of the compression adjustment portion 813, and the upper side of the compression member 830 may be substantially in contact with the upper side of the compression adjustment portion 813. Namely, the upper side of the compression member 830 may be positioned at the end line EL, and the lower side of the compression member 830 may be positioned between the reference line BL and the starting line SL.

In this instance, the end of the body region 850*b* of the fixing member 850 may be spaced apart from the bottom surface of the fixing hole 831 of the compression member 830. Namely, the fixing member 850 may be inserted into the fixing hole 831, and a third separation distance may be provided between the fixing member 850 and the fixing hole 831. The third separation distance may be greater than the second separation distance.

The compression member 830 may apply a third pressure to the plate 600 contacting the compression member 830. The third pressure may be higher than the first and second pressures. When the third pressure is applied to the plate 600 between the front support 810*a* and the rear support 820*a* as described above, the movement of the plate 600 may be confined and fixed between the front support 810*a* and the rear support 820*a*.

Figure 43:
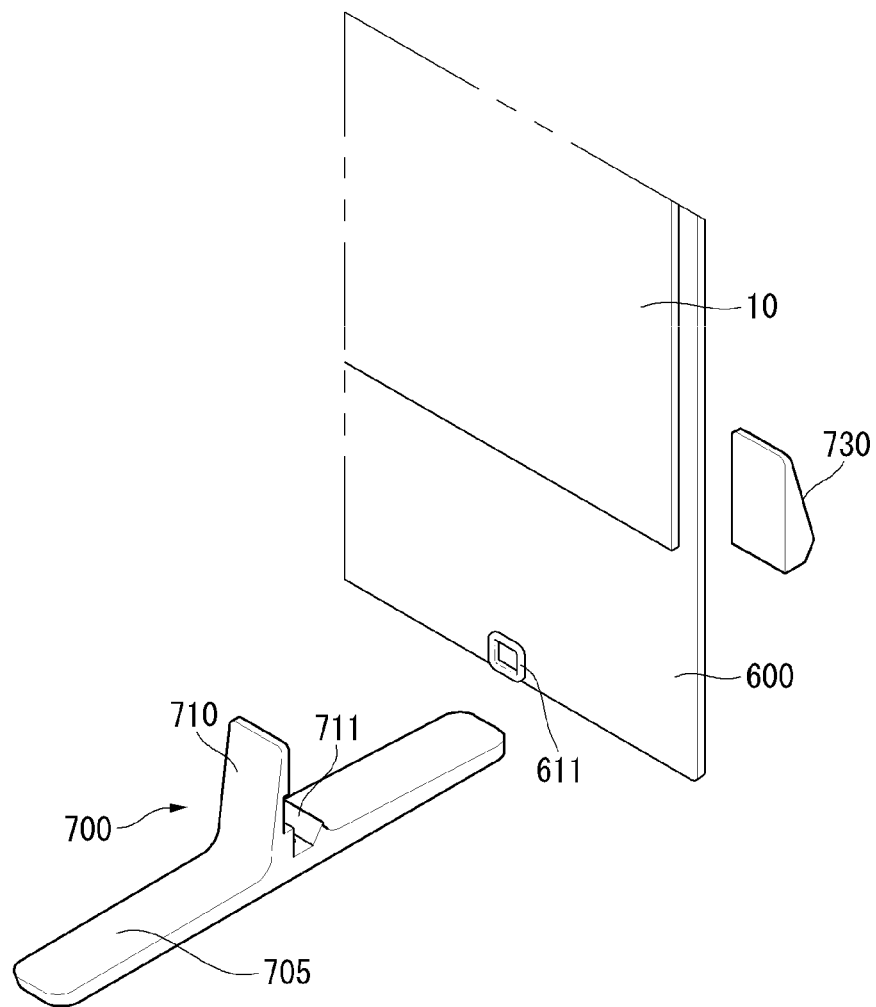
FIG. 43 illustrates another example where a stand is mounted on a plate in accordance with an embodiment of the disclosure.

Referring to FIG. 43, a misassembly prevention portion 611 may be positioned on the lower side of the plate 600. The misassembly prevention portion 611 may be formed to partially protrude from the front surface and the rear surface of the plate 600. The misassembly prevention portion 611 is configured so that the user can accurately recognize the direction of the stand 700. Hence, the misassembly prevention portion 611 may be formed on the front surface or the rear surface of the plate 600.

Figure 44:
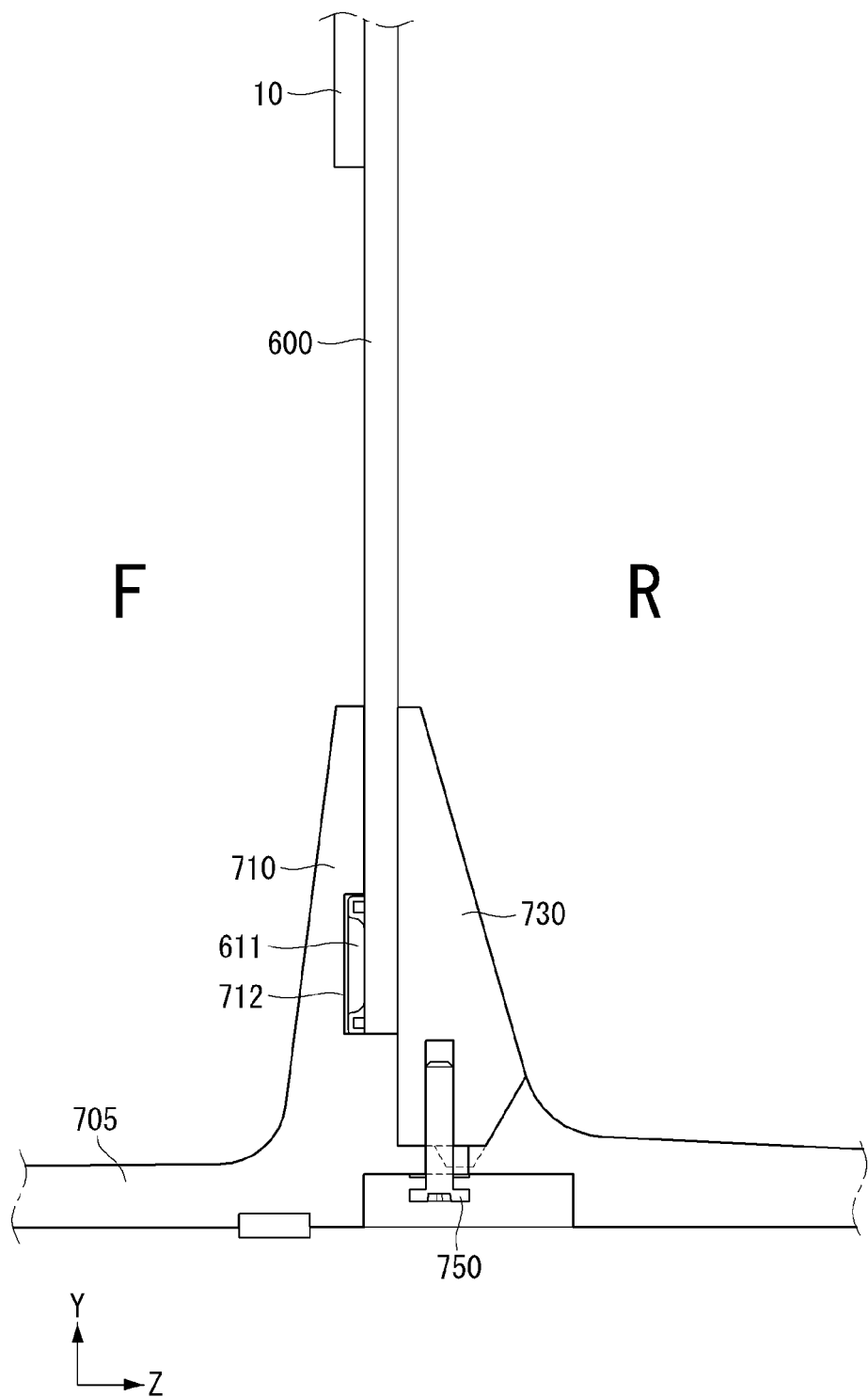
FIG. 44 illustrates an example of a side when a stand is mounted on a plate in accordance with an embodiment of the disclosure.

Referring to FIG. 44, the support portion 710 of the stand 700 may include a receiving member 712 corresponding to the misassembly prevention portion 611. The receiving member 712 may be formed on the rear surface of the support portion 710. Alternatively, the receiving member 712 may be formed on the rear surface of the stand 700.

For example, the misassembly prevention portion 611 may include first to fourth misassembly prevention portions 611*a* to 611*d*. Namely, the first misassembly prevention portion 611*a* may be positioned corresponding to the rear surface of the support portion 710 of the first stand 700*a*; the second misassembly prevention portion 611*b* may be positioned corresponding to the rear surface of the support portion 710 of the second stand 700*b*; the third misassembly prevention portion 611*c* may be positioned corresponding to the front surface of the support adjustment member 730 of the first stand 700*a*; and the fourth misassembly prevention portion 611*d* may be positioned corresponding to the front surface of the support adjustment member 730 of the second stand 700*b*.

Figure 45:
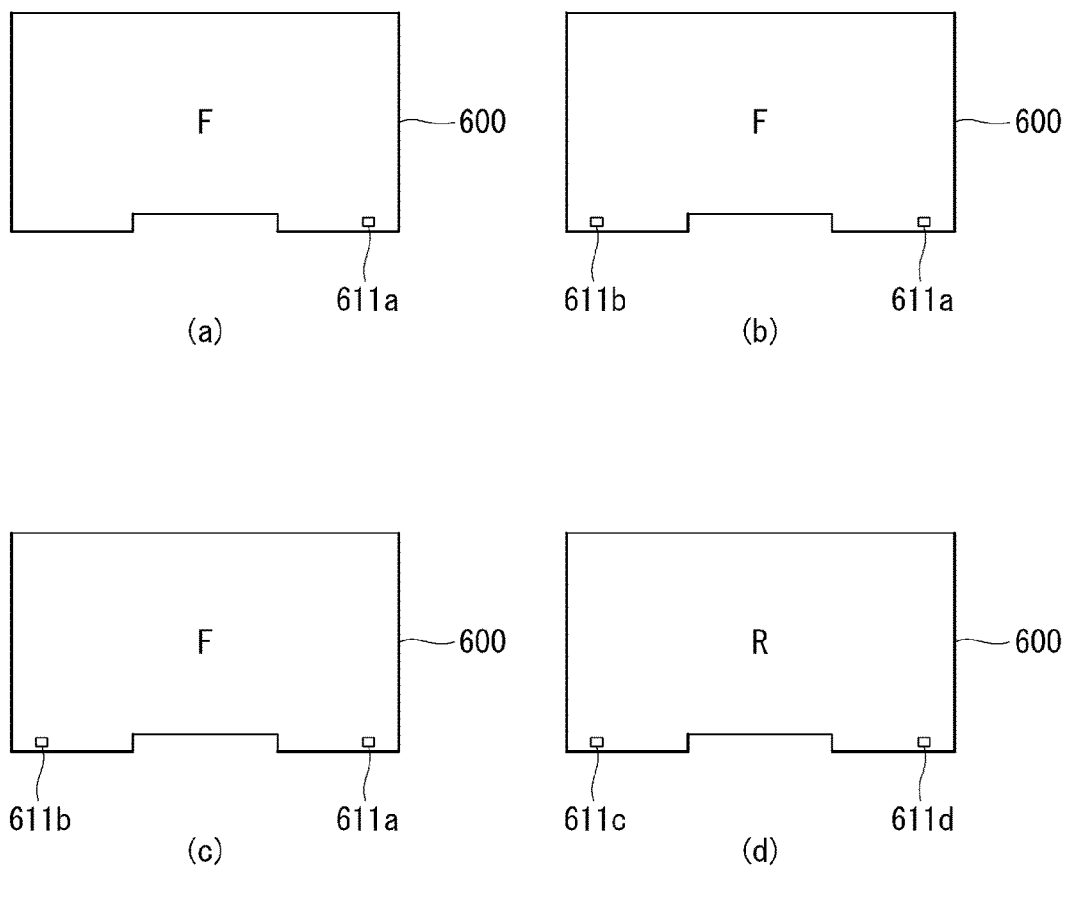
FIG. 45 illustrates various examples when a misassembly preventing portion is formed on a plate in accordance with an embodiment of the disclosure.

Referring to FIG. 45, at least one of the first to fourth misassembly prevention portions 611*a* to 611*d* may be disposed. Namely, as shown in (a) of FIG. 45, only one of the first to fourth misassembly prevention portions 611*a* to 611*d* may be disposed. As shown in (b) of FIG. 45, only two of the first to fourth misassembly prevention portions 611*a* to 611*d* may be disposed. As shown in (c) and (d) of FIG. 45, all the first to fourth misassembly prevention portions 611*a* to 611*d* may be disposed.

Corresponding to the first to fourth misassembly prevention portions 611*a* to 611*d*, the support portion 710 of the stand 700 may include first and second receiving members (not shown), and the support adjustment member 730 of the stand 700 may include third and fourth receiving members (not shown).

Accordingly, the stand 700 can be assembled at an exact location of the plate 600. Namely, even if a plurality of users assembles the stand 700 with the plate 600, all they can assemble the stand 700 at the exact location. Even if the misassembly prevention portion 611 is positioned on the plate 600, the misassembly prevention portion 611 may not be seen from the outside as the stand 700 is assembled with the plate 600. Namely, the misassembly prevention portion 611 may be positioned in a formation area of the stand 700 to overlap the stand 700.

The misassembly prevention portion 611 may be used to accurately assemble the stand 700 mounted below the plate 600 and may have any shape as long as the shape can be recognized by the user.

Figure 46:
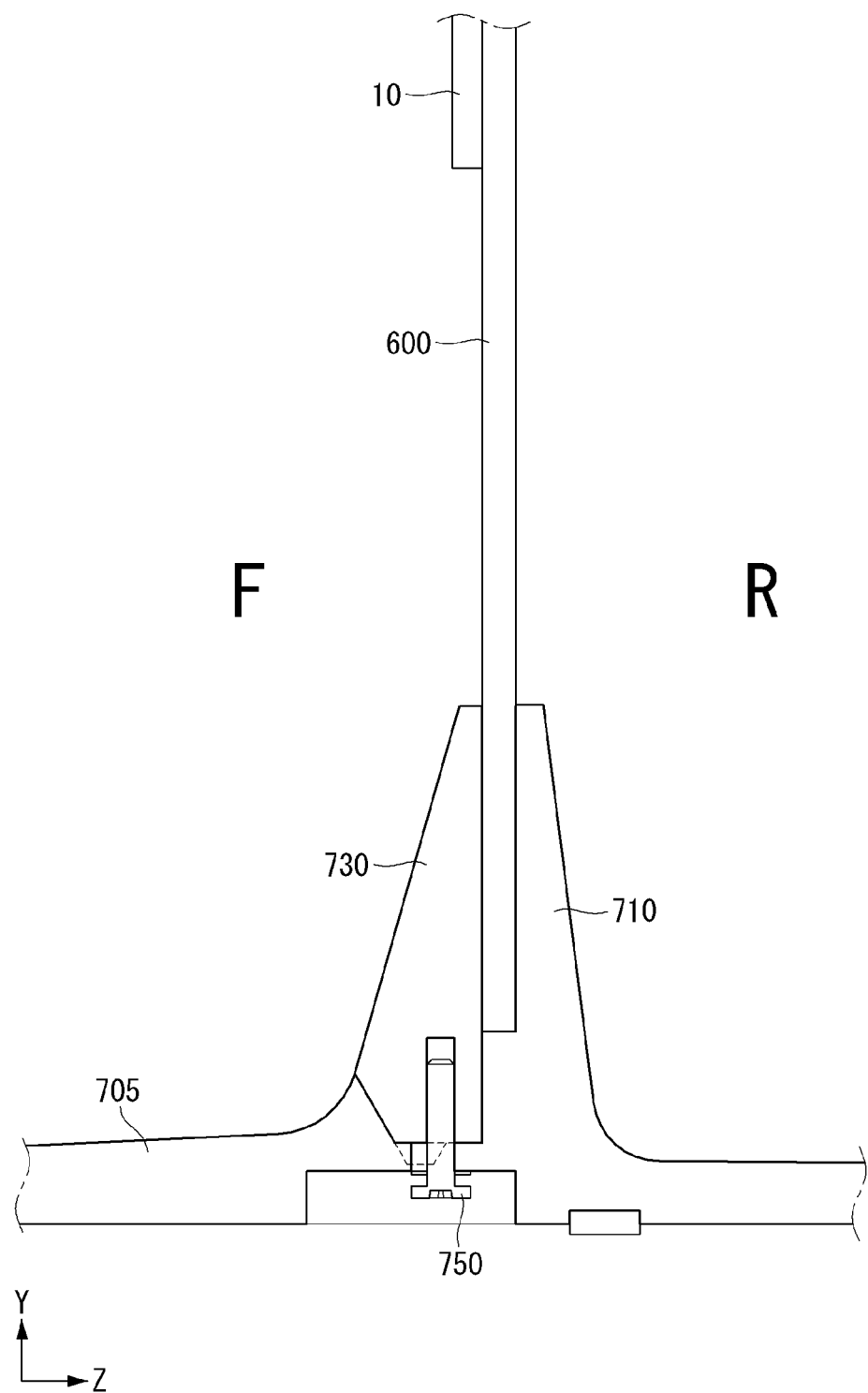
FIGS. 46 and 47 illustrate examples of misassembly of a stand and a plate in accordance with an embodiment of the disclosure.

Referring to FIG. 46, when the misassembly prevention portion 611 is not formed, the user cannot accurately recognize that the stand 700 is incorrectly assembled with the plate 600 because the front and the back of the stand 700 are reversed, even if the support adjustment member 730 is positioned on the front surface of the plate 600 and the support portion 710 is positioned on the rear surface of the plate 600.

When the stand 700 is incorrectly assembled with the plate 600 as described above, the center of gravity may be changed. Further, because the plate 600 is not firmly fastened to the stand 700, there may be a high possibility that plate 600 is collapsed depending on external circumstances.

Figure 47:
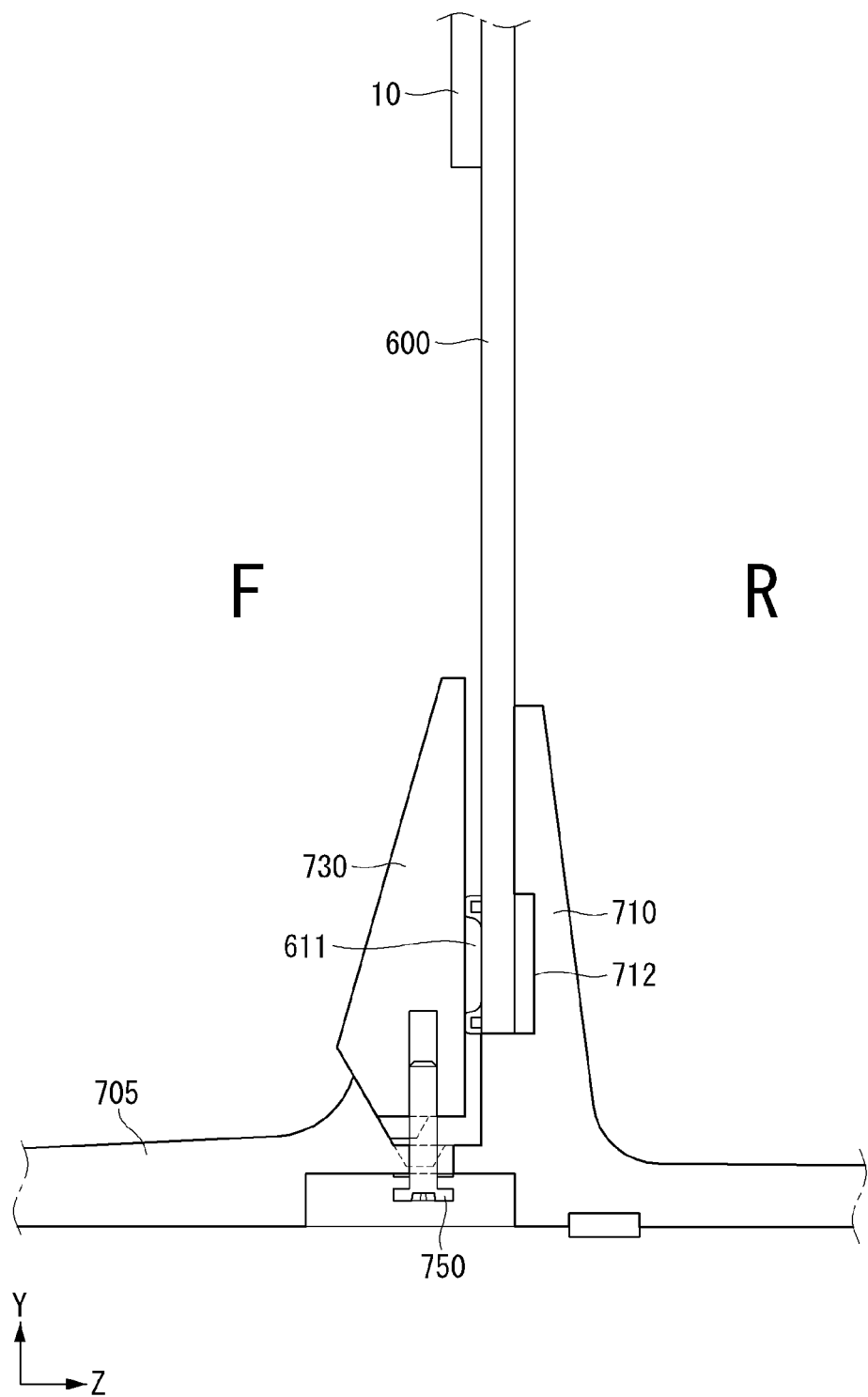

Referring to FIG. 47, when the misassembly prevention portion 611 is disposed on the lower side of the front surface of the plate 600, the receiving member 712 corresponding to the misassembly prevention portion 611 may be positioned on the front surface of the stand 700.

When the misassembly prevention portion 611 is disposed on the lower side of the front surface of the plate 600 and the support adjustment member 730 not having the receiving member 712 is assembled with the stand 700, a gap may be generated between the front surface of the plate 600 and the support adjustment member 730. Thus, the user can accurately recognize that the stand 700 is incorrectly assembled with the plate 600 because the front and the back of the stand 700 are reversed. Namely, the user can easily recognize that the support adjustment member 730 cannot be assembled with the stand 700 or is incorrectly assembled with the stand 700 due to the interference of the misassembly prevention portion 611.

As described above, when the misassembly prevention portion 611 is formed on the plate 600, and the receiving member 712 is formed on the support portion 711, the user can easily recognize that the stand 700 is incorrectly assembled with the plate 600. Thus, the user can correctly and quickly assemble the stand 700 with the plate 600.

Figure 48:
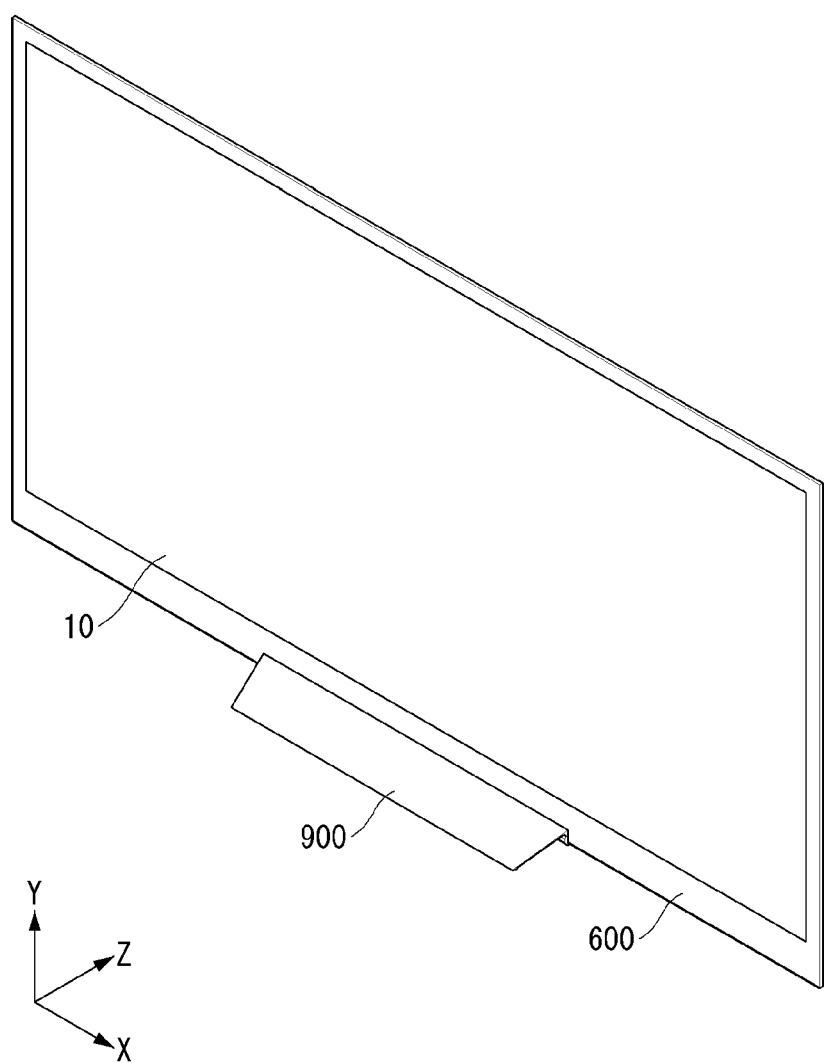
FIG. 48 illustrates an example of mounting a stand on a plate in accordance with an embodiment of the disclosure.

Referring to FIG. 48, a stand 900 may be positioned below the display panel 100 (see FIG. 1).

The stand 900 may be mounted on the lower part of the plate 600 positioned behind the head 10 or behind the display panel 100 (see FIG. 1). For example, the stand 900 may be positioned below the central region of the plate 600. However, embodiments are not limited thereto. For example, as shown in FIG. 28, the stand 900 may include a first stand 700*a* (see FIG. 28) and a second stand 700*b* (see FIG. 28).

The stand 900 may be extended in the front-back direction Z which is the thickness direction of the display panel 100. The stand 900 may be positioned at the center of the lower part of the plate 600 and can support the lower part of the plate 600. Hence, the stand 900 can firmly support the plate 600 so that the plate 600 does not swing back and forth in the front-back direction Z.

Figure 49:
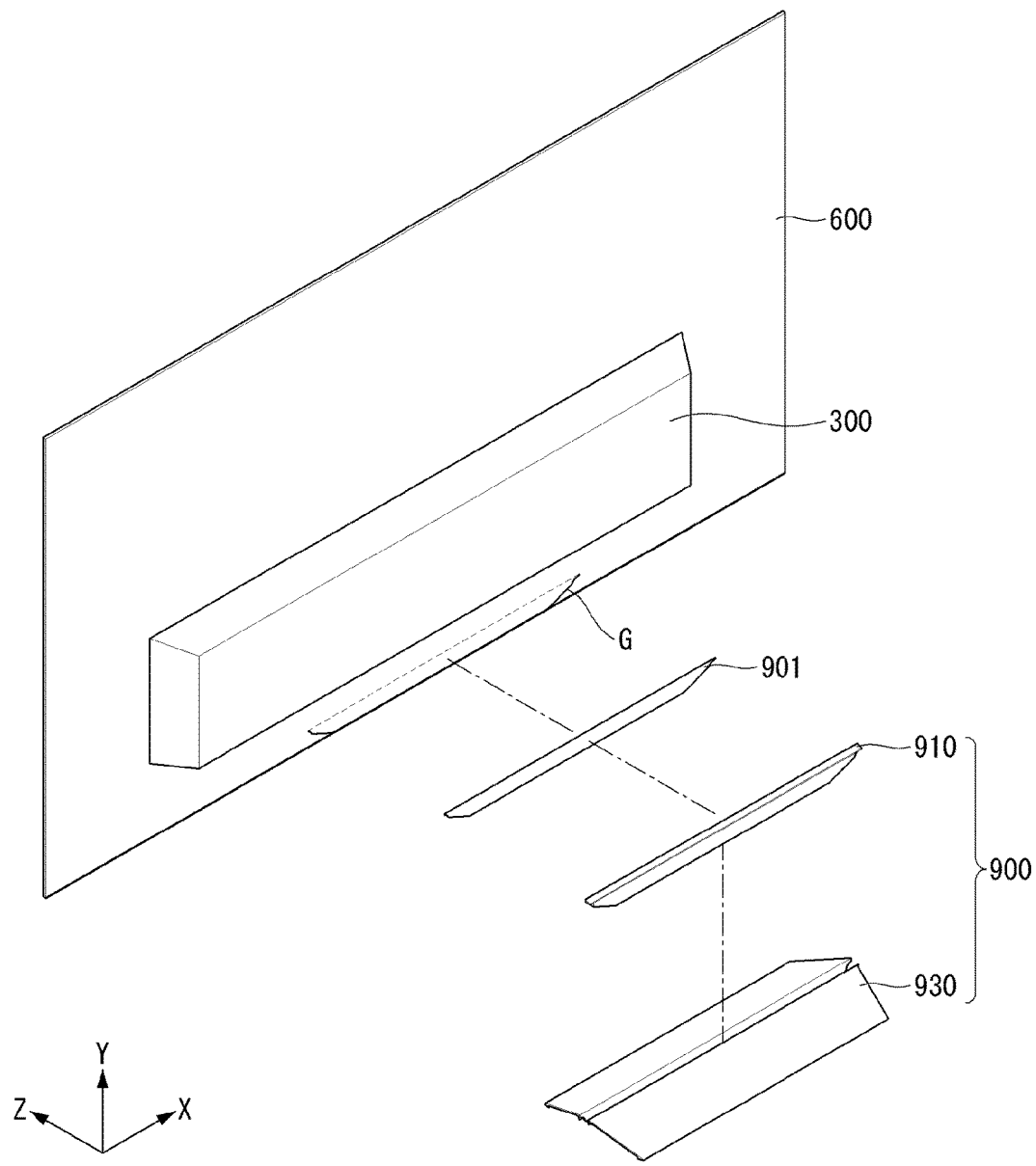
FIG. 49 illustrates an example of disassembling a stand according to an embodiment of the disclosure.

Referring to FIG. 49, the housing 300 may be disposed on the rear surface of the plate 600. The housing 300 may be electrically connected to the head 10, but may be physically coupled or separated to the head 10. The housing 300 may transmit at least one driving signal to the head 10.

FIG. 49 illustrates that the housing 300 is disposed on the rear surface of the plate 600, by way of example. However, embodiments are not limited thereto. For example, the housing 300 may not be disposed on the rear surface of the plate 600. Namely, the housing 300 may be disposed below the plate 600 or around the plate 600. The description thereof has been described in detail with reference to FIGS. 4 and 5, and thus will be omitted.

A guide line G may be formed below the center of the rear surface of the plate 600 or on the lower side of the rear surface of the plate 600. The guide line G may be formed below the housing 300.

The guide line G may be positioned on each of the left and right sides of the lower part of the plate 600. The guide line G can guide the stand 900 to be correctly fastened to the plate 600.

The embodiment of the disclosure illustrated that the guide line G is disposed on the rear surface of the plate 600, but is not limited thereto. The guide line G may be disposed on the front surface of the plate 600. Namely, the guide line G may be disposed on at least one of the front surface and the rear surface of the plate 600.

The stand 900 may be aligned on the guide line G and fastened to the lower end of the center of the plate 600.

The stand 900 may include a stand supporter 910 and a stand base 930. The stand supporter 910 may be inserted into the stand base 930 and fastened to or detached from the stand base 930.

The stand supporter 910 may have a predetermined thickness in the front-back direction Z that is the thickness direction and a predetermined width in the horizontal direction X intersecting the thickness direction Z of the plate 600.

The stand base 930 may have a predetermined width that is extended in the thickness direction Z of the plate 600 and the horizontal direction X. The stand base 930 may be inserted into the plate 600 and the stand supporter 910 in the vertical direction Y and fastened to them.

An adhesive member 901 may be disposed between the stand 900 and the guide line G of the plate 600.

The adhesive member 901 may have a predetermined thickness and may be extended along the lower end of the plate 600.

Figure 50:
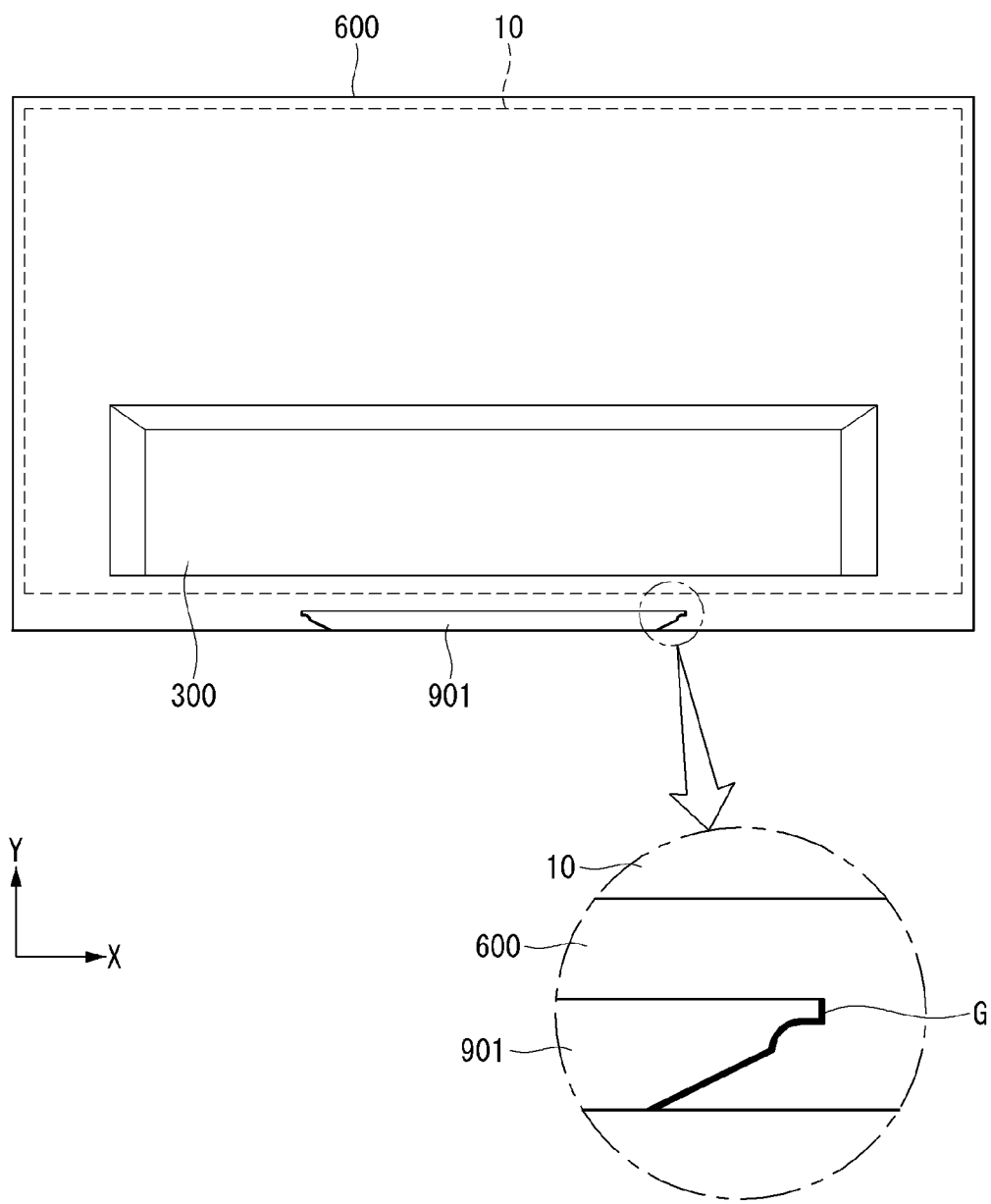
FIG. 50 illustrates that an adhesive member is attached to a plate along a guide line in accordance with an embodiment of the disclosure.

Referring to FIG. 50, the adhesive member 901 may be attached to the lower part of the rear surface of the plate 600 on which the guide line G is formed. The adhesive member 901 may be attached to the plate 600 and can temporarily fix or fasten the stand 900 to the plate 600. Only one surface of the adhesive member 901 may have adhesive properties. For example, the adhesive member 901 may be an adhesive sticker.

After one surface of the adhesive member 901 is adhered to the plate 600 along the guide line G, the stand 900 may be temporarily fixed to the plate 600 using the other surface of the adhesive member 901.

Alternatively, both surfaces of the adhesive member 901 may have adhesive properties. For example, the adhesive member 901 may be a double-sided tape. After one surface of the adhesive member 901 is adhered to the plate 600 along the guide line G, the stand 900 may be temporarily fixed, fixed, or fastened to the plate 600 using the other surface of the adhesive member 901.

Namely, the adhesive member 901 that is aligned on the guide line G and is attached to the plate 600 may be disposed between the plate 600 and the stand 900, thereby temporarily fixing or fastening the stand 900 to the plate 600 at an exact location.

The adhesive member 901 may be fastened to the front surface of the plate 600 along the guide line G. The adhesive member 901 may be attached to the plate 600 in accordance with the guide line G disposed on at least one of the front surface and the rear surface of the plate 600.

Figure 51A:
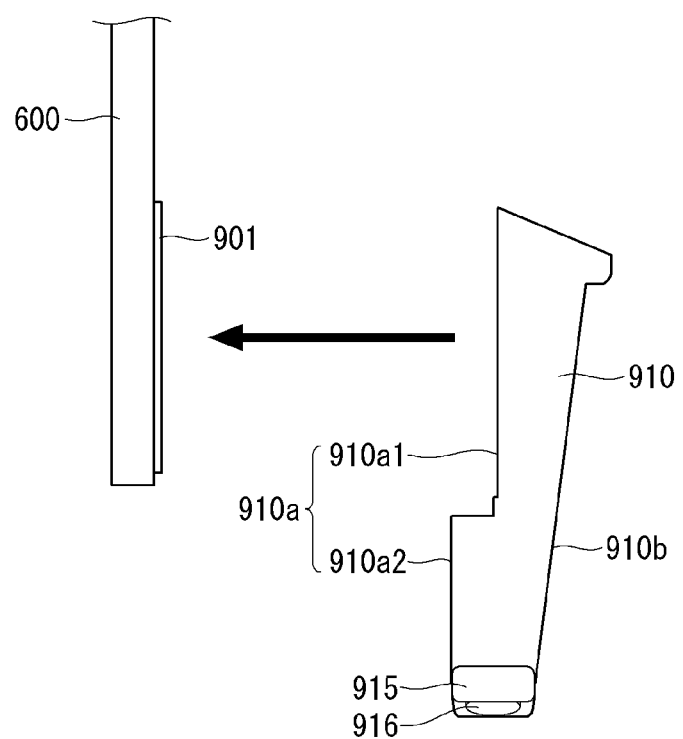
FIGS. 51A and 51B illustrate that a sand supporter is attached to an adhesive member in accordance with an embodiment of the disclosure.
Figure 51B:
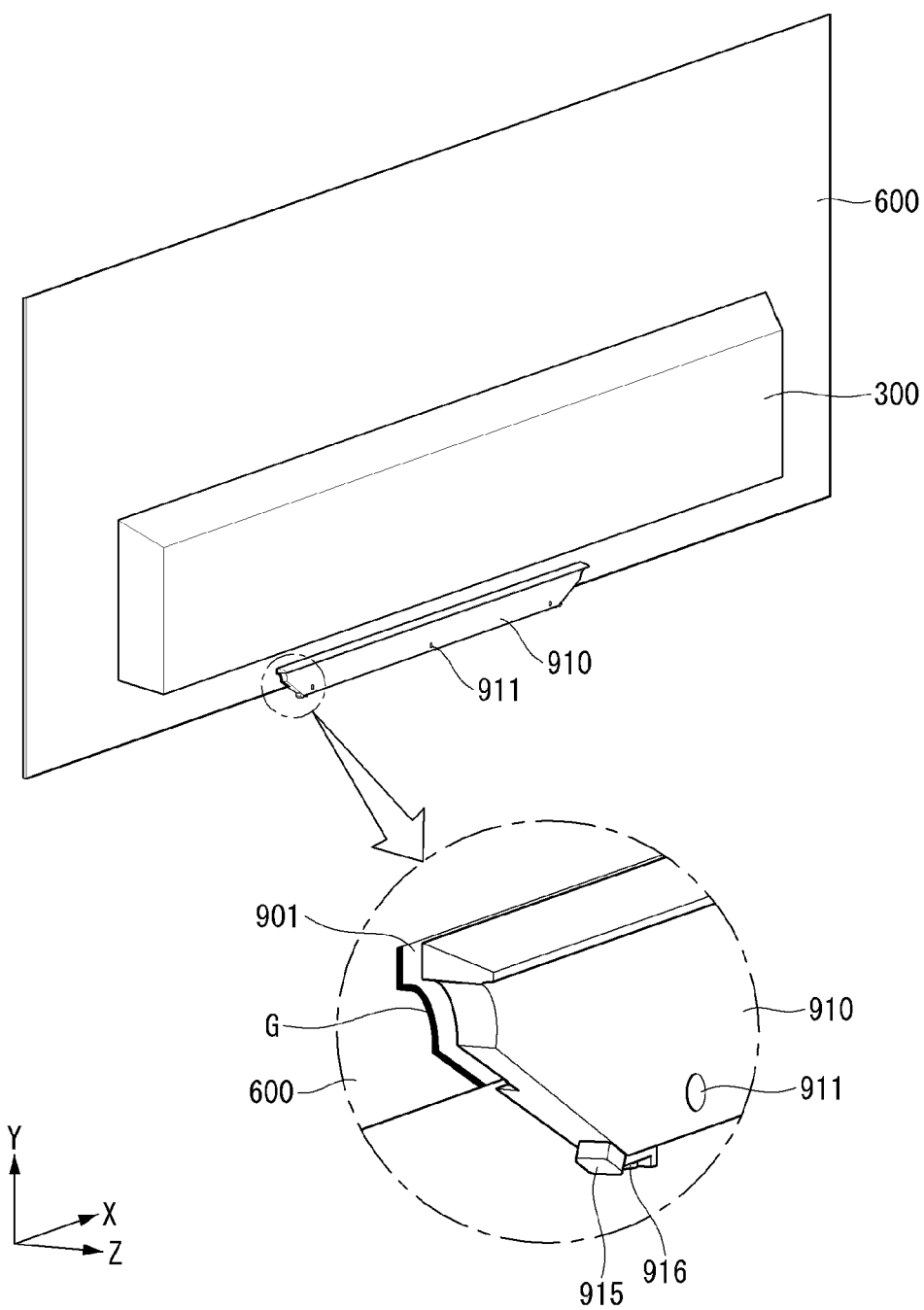

Referring to FIGS. 51A and 51B, the stand supporter 910 may be temporarily fixed or fastened to the plate 600 through the adhesive member 901 attached to the rear surface of the plate 600. The stand supporter 910 may be aligned on the plate 600 along the guide line G and can be temporarily fixed or fastened to the lower end of the plate 600 at an exact location through the adhesive member 901.

The stand supporter 910 may be formed to contact the rear surface and the bottom surface of the plate 600 and can support the plate 600. The stand supporter 910 may have a first surface 910a formed toward the rear surface of the plate 600 and a second surface 910b inclined at a predetermined angle. The stand supporter 910 may be configured such that an upper region 910a1 of the first surface 910a contacts the rear surface of the plate 600, and a lower region 910a2 of the first surface 910a not contacting the rear surface of the plate 600 contacts the stand base 930. The lower region 910a2 of the first surface 910a of the stand supporter 910 may be extended toward the front direction of the plate 600 by the thickness of the plate 600.

At least one supporter fastening hole 911 may be disposed in the lower region of the stand supporter 910. The plurality of supporter fastening holes 911 may be formed in the horizontal direction. The plurality of supporter fastening holes 911 may be spaced apart from each other at regular intervals. An inner surface of the supporter fastening hole 911 may be threaded so that a fixing member 970 (see FIG. 57) can be inserted into the supporter fastening hole 911.

The stand supporter 910 may form stand guides 915. The stand guides 915 may be formed at both lower edges of the stand supporter 910. The stand guide 915 may be fastened to the stand supporter 910 through a guide fixing member 916.

The guide fixing member 916 may pass through the stand supporter 910 and may be fastened to the stand supporter 910. The guide fixing member 916 may have a long bar shape having a screw-shaped groove (or a screw thread). For example, the guide fixing member 916 may be a screw, a bolt, or etc. The stand guide 915 will be described in detail later.

Figure 52A:
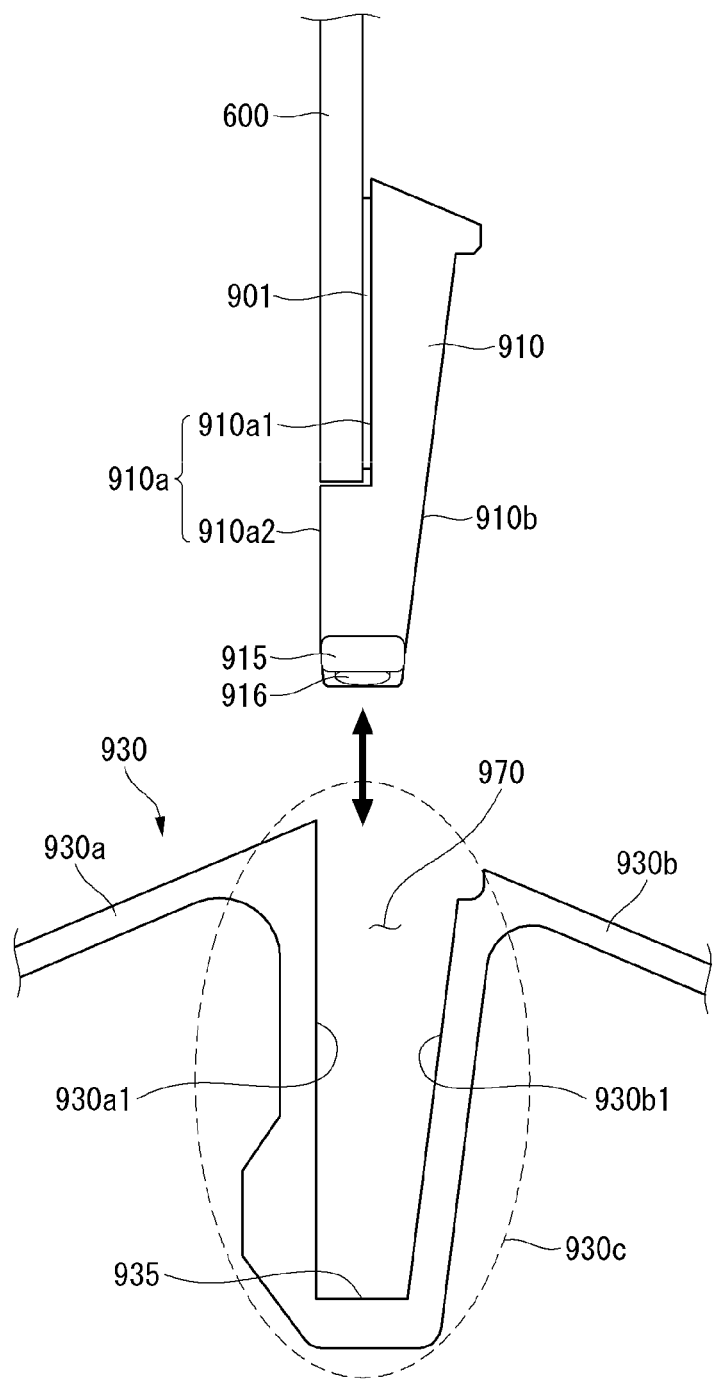
FIGS. 52A and 52B illustrate that a stand supporter is inserted into a stand base in accordance with an embodiment of the disclosure.
Figure 52B:
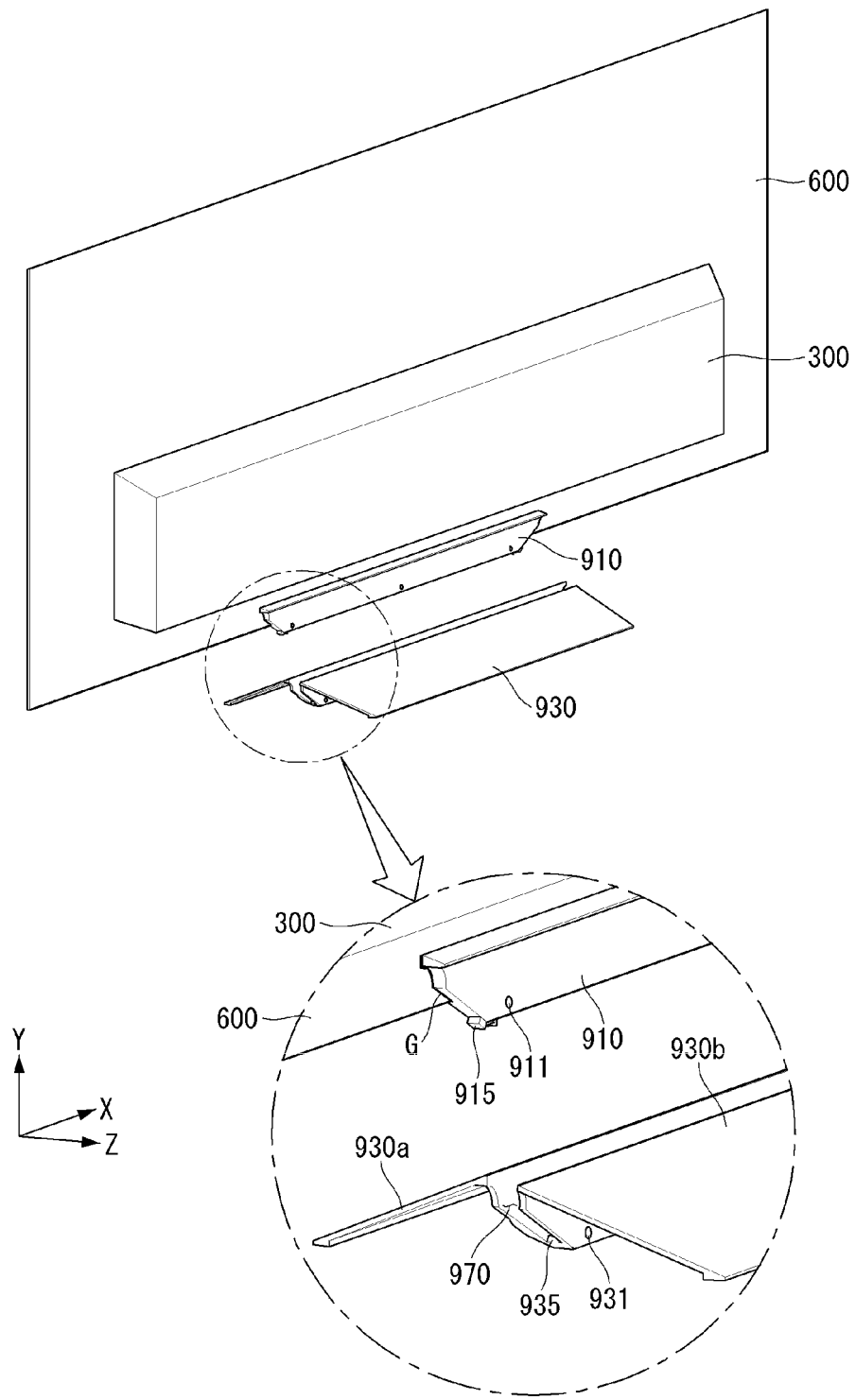

Referring to FIGS. 52A and 52B, the stand base 930 may be inserted into the stand supporter 910 temporarily fixed or fastened to the plate 600 in the vertical direction Y.

The stand base 930 may include a body 930c into which the stand supporter 910 and the plate 600 can be inserted, and first and second bases 930a and 930b that are extended from an upper end of the body 930c in the thickness direction Z.

The first base 930a may be referred to as a first wing plate, and the second base 930b may be referred to as a second wing plate.

The body 930c may have a concave inner space 970 into which the stand supporter 910 and the plate 600 can be inserted. The inner space 970 of the stand base 930 may have a first inner surface 930a1, a second inner surface 930b1, and an inner bottom surface 935.

The first inner surface 930a1 may be formed in the vertical direction Y. The first inner surface 930a1 may contact the front surface of the plate 600 and the lower region 910a2 of the first surface 910a of the stand supporter 910.

The second inner surface 930b1 may be formed as an inclined surface inclined in an oblique direction. Namely, the second inner surface 930b1 may be formed as an inclined surface that faces the rear surface of the plate 600. The second inner surface 930b1 may be in contact with the second surface 910b of the stand supporter 910. As the second inner surface 930b1 is formed as the inclined surface as described above, the second surface 910b of the stand supporter 910 may be formed as an inclined surface corresponding to the inclined second inner surface 930b1. The stand supporter 910 may be inserted into the inner space 970 along the inclined second inner surface 930b1. Thus, the stand base 930 can stably mount the stand supporter 910.

The inner bottom surface 935 may be formed between the first inner surface 930a1 and the second inner surface 930b1. The inner bottom surface 935 may be disposed at the bottom of the inner space 970. The inner bottom surface 935 can stably support the stand supporter 910 inserted in the inner space 970.

The first base 930a may be extended from one upper end of the body 930c toward the front of the plate 600. Namely, the first base 930a may be extended from the upper end of the first inner surface 930a1 toward the front of the plate 600. The first base 930a may be extended toward the front of the plate 600 and may have a width extended along the horizontal direction X. For example, the first base 930a may be formed of a rectangular plate.

The first base 930a may be extended from the upper end of the first inner surface 930a1 and may have a gradually decreasing height as it is away from the first inner surface 930a1. Thus, one side of the first base 930a may be in contact with the ground, and the other side may be connected to one upper end of the body 930c.

The second base 930b may be extended from other upper end of the body 930c toward the rear of the plate 600. Namely, the second base 930b may be extended from the upper end of the second inner surface 930b1 toward the rear of the plate 600. The second base 930b may be extended toward the rear of the plate 600 and may have a width extended along the horizontal direction X. For example, the second base 930b may be formed of a rectangular plate.

The second base 930b may be extended from the upper end of the second inner surface 930b1 and may have a gradually decreasing height as it is away from the second inner surface 930b1. Thus, one side of the second base 930b may be connected to one upper end of the body 930c, and the other side may be in contact with the ground.

The stand base 930 may be configured such that the body 930c between the first base 930a and the second base 930b is spaced apart from the ground. The stand base 930 may have elasticity. Because the stand base 930 has an elastic force between the first base 930a and the second base 930b as described above, the stand 900 can stably support the weight of the plate 600 even if the plate 600 mounted with the display panel 100 (see FIG. 3) with the wide screen is mounted on the stand 900.

At least one base fastening hole 931 may be formed in the lower part of the stand base 930.

Figure 53:
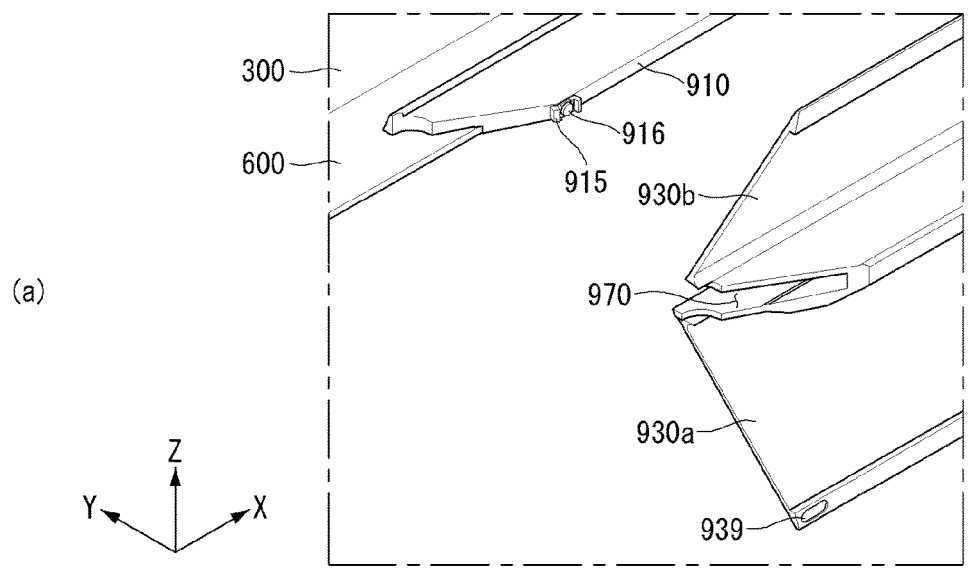
FIG. 53 illustrates an operation of inserting a stand base into a stand supporter mounted with a stand guide in accordance with an embodiment of the disclosure.
Figure 53:
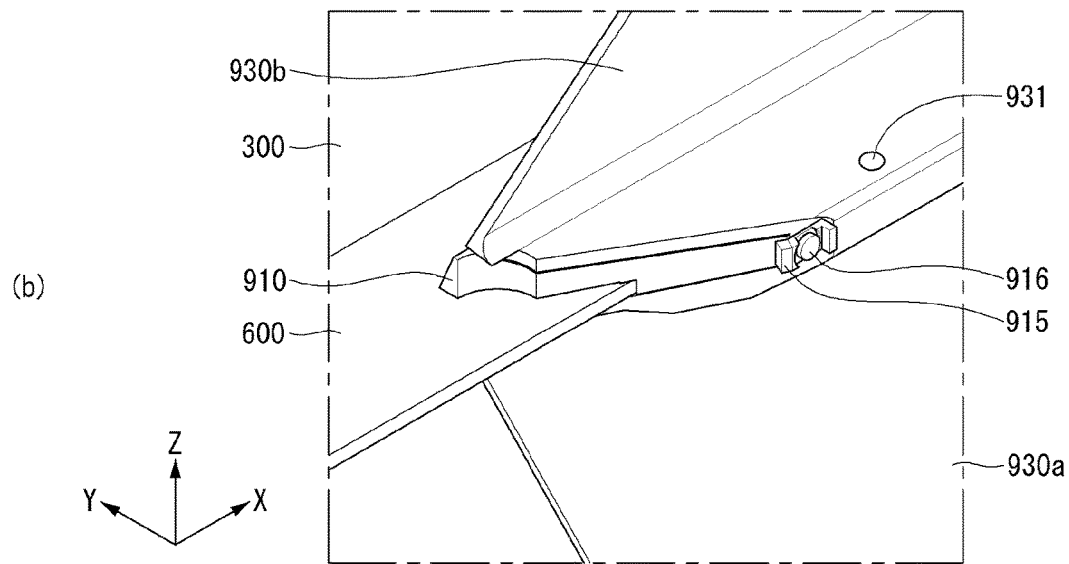
Figure 54:
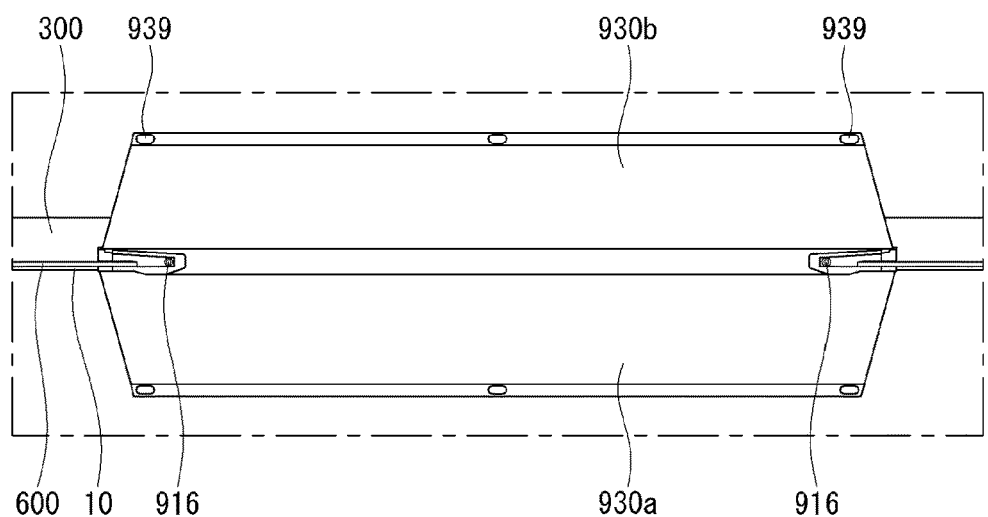
FIG. 54 illustrates a lower part of a stand base inserted into a stand supporter in accordance with an embodiment of the disclosure.

Referring to FIGS. 53 and 54, the stand base 930 may be inserted into the stand supporter 910 temporarily fixed or fastened to the plate 600 in the vertical direction Y. In FIG. 53, (a) illustrates a state before the stand base 930 is inserted into the stand supporter 910, and (b) illustrates a state after the stand base 930 is inserted into the stand supporter 910.

The stand guide 915 may be fastened to the stand supporter 910 through the guide fixing member 916.

The stand guide 915 may be bent at least once and fastened to the stand supporter 910. The stand guide 915 may have a width substantially equal to a width of the lower part of the stand supporter 910. Both ends of the stand guide 915 may protrude. The stand guide 915 may have a hole (not shown) through which the guide fixing member 916 between both side ends of the stand guide 915 can pass.

The stand guides 915 may be respectively formed at both lower edges of the stand supporter 910. For example, the stand guides 915 may be respectively formed at the left and right edges of the stand supporter 910.

The stand base 930 may be configured such that the inner bottom surface 935 of the body 930c (see FIG. 52A) is positioned between the stand guides 915 formed at the left and right edges of the stand supporter 910.

The stand guides 915 can guide the stand base 930 to be easily inserted into the stand supporter 910 in the vertical direction Y. Thus, the stand guides 915 can accurately and quickly guide the stand base 930 at an exact position of the stand supporter 910.

A non-skid portion 939 may be formed at one lower end of the first base 930a or other lower end of the second base 930b and can prevent the stand 900 from sliding arbitrarily. One or more non-skid portions 939 may be disposed at regular intervals in the horizontal direction X.

The base fastening hole 931 may be formed in the stand base 930. At least one base fastening hole 931 may be formed. The base fastening hole 931 may be formed to correspond to the supporter fastening hole 911.

Figure 55:
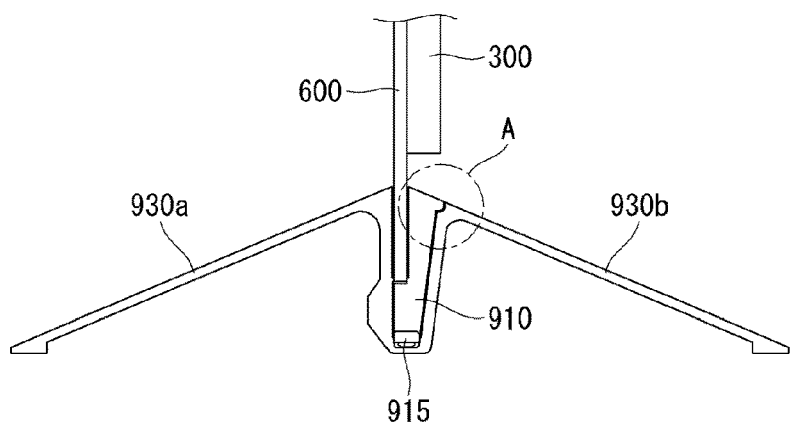
FIGS. 55 and 56 illustrate a gap preventing protrusion and a gap preventing groove according to an embodiment of the disclosure.
Figure 56:
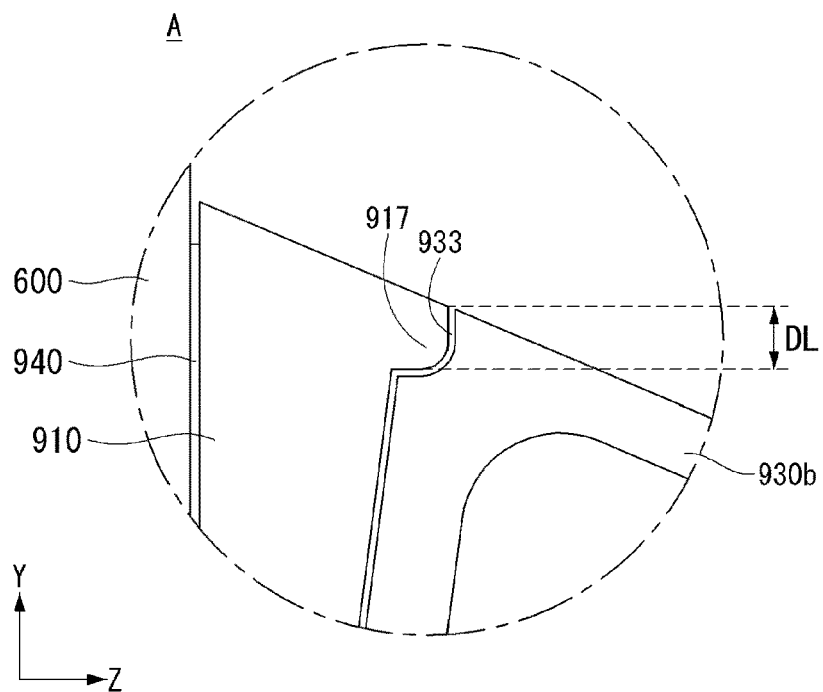

Referring to FIGS. 55 and 56, a gap preventing protrusion 917 may be formed at an upper end of the stand supporter 910 and extended toward the rear of the plate 600. The gap preventing protrusion 917 may be extended toward the rear of the plate 600 and mounted on an upper end of the second inner surface 930b1 of the body 930c. The stand base 930 may include a gap preventing groove 933 at a location corresponding to the gap preventing protrusion 917.

The gap preventing groove 933 may be recessed at the upper end of the second inner surface 930b1 so that the gap preventing protrusion 917 can be mounted. As described above, because the gap preventing protrusion 917 is formed to correspond to the gap preventing groove 933, a gap can be visually seen to be small even if the gap is generated between the stand supporter 910 and the stand base 930.

A thickness DL of the gap preventing protrusion 917 may be 1.5 mm to 2.1 mm.

When the thickness DL of the gap preventing protrusion 917 is equal to or less than 1.5 mm, the gap preventing protrusion 917 may be easily damaged in a process for coupling the stand supporter 910 and the stand base 930. When the thickness DL of the gap preventing protrusion 917 is equal to or greater than 2.1 mm, a stepped portion may be generated between the stand supporter 910 and the stand base 930, which may result in a bad appearance. Hence, the thickness DL of the gap preventing protrusion 917 may be 1.5 mm to 2.1 mm, thereby preventing the damage or the stepped portion from being generated. Further, when a gap is generated between the stand supporter 910 and the stand base 930, the gap can be visually seen to be small.

Figure 57:
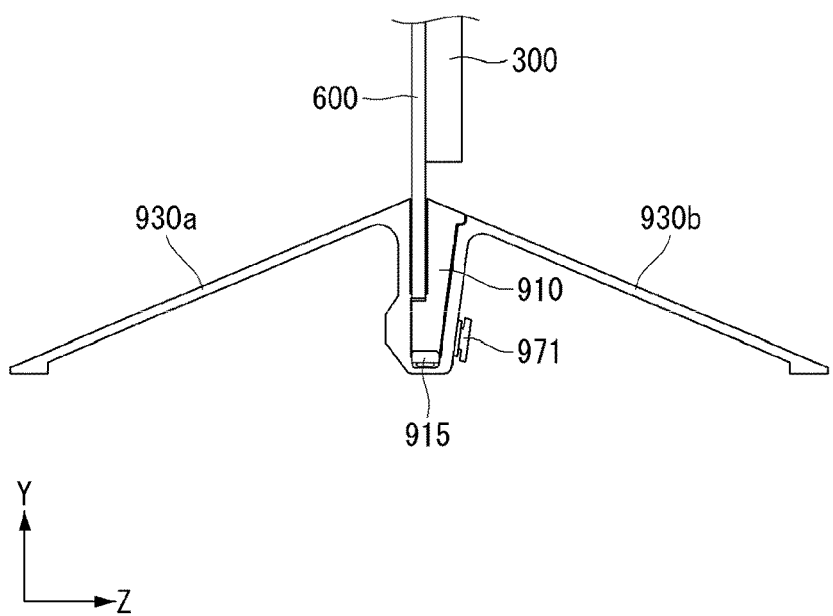
FIG. 57 illustrates that a stand supporter and a stand base are fastened to each other by a fixing member in accordance with an embodiment of the disclosure.
Figure 58:
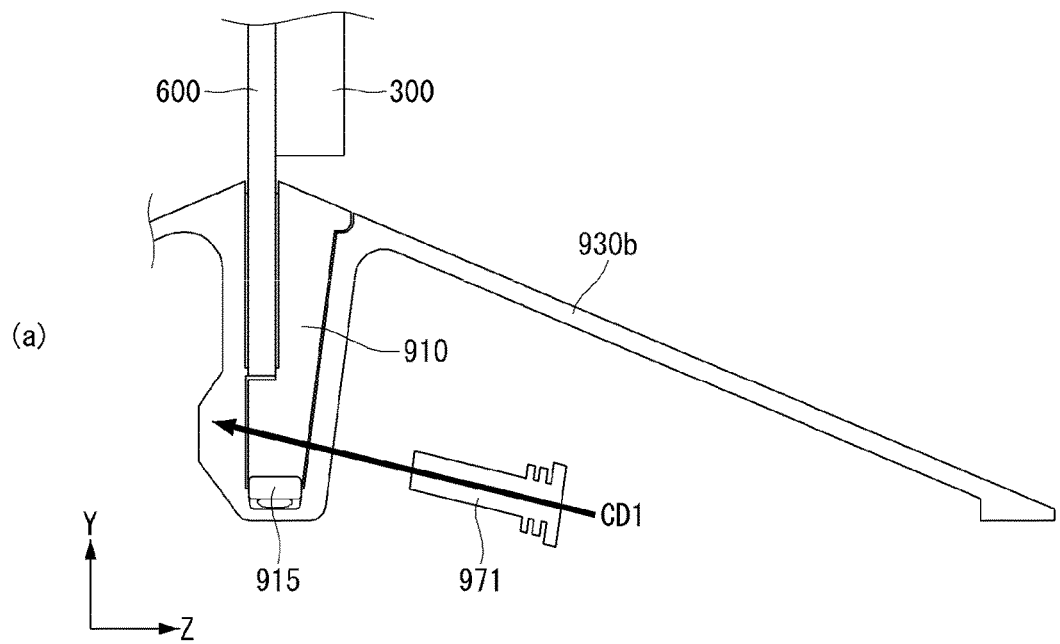
FIG. 58 illustrates a state before and after a fixing member is fastened to a stand in a first direction in accordance with an embodiment of the disclosure.
Figure 58:
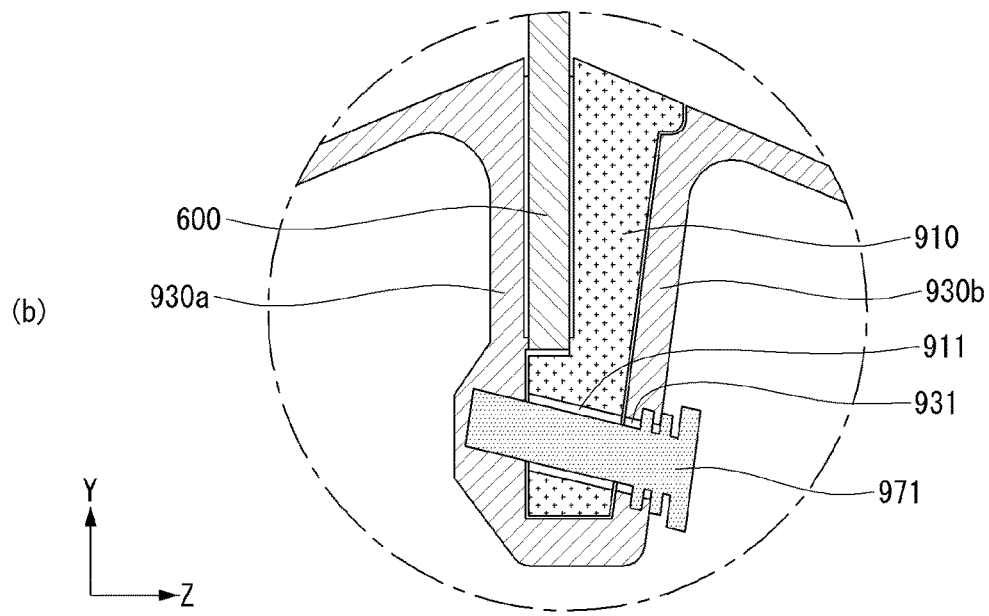

Referring to FIGS. 57 and 58, the stand base 930 may be inserted into the stand supporter 910 and fastened to the stand supporter 910. The stand base 930 may be fixed to the stand supporter 910 through a fixing member 971.

The base fastening hole 931 may be formed to penetrate the second inner surface 930b1 (see FIG. 52A) of the body 930c (see FIG. 52A) in a first direction CD1. The base fastening hole 931 may have a concave groove recessed in the first direction CD1 on the first inner surface 930a1 (see FIG. 52A) of the body 930c. The supporter fastening hole 911 may be formed to penetrate the stand supporter in the first direction CD1. In embodiments disclosed herein, the first direction CD1 may be a direction inclined by about 10° to 20° with respect to the horizontal direction X. Namely, the first direction CD1 may be an oblique direction intersecting an inclined surface that faces the rear surface of the plate 600.

A screw-shaped groove (or a screw thread) may be formed on the inner surface of the base fastening hole 931 and the inner surface of the supporter fastening hole 911.

The fixing member 970 may pass through the base fastening hole 931 of the stand base 930 and the supporter fastening hole 911 of the stand supporter 910 and fix the stand base 930 to the stand supporter 910.

The fixing member 970 may have a long bar shape having a screw-shaped groove (or a screw thread). For example, the fixing member 970 may be a screw, a bolt, or etc.

The fixing member 970 may pass through the base fixing hole 931 formed in the second inner surface 930b1 of the body 930c in the first direction CD1 and the supporter fastening hole 911 of the stand supporter 910 and then may be fastened to the base fixing hole 931 formed in the first inner surface 930a1 of the body 930c. Thus, the stand base 930 can press the stand supporter 910 while gradually reducing the width or the size of the internal space 970 using the fixing member 971. Hence, the stand 900 can be gradually pressed by the fixing member 970 to firmly fix the plate 600.

The embodiment of the disclosure illustrated that the base fastening hole 931 formed in the first inner surface 930a1 does not penetrate the first inner surface 930a1 as described above. However, embodiments are not limited thereto. For example, the base fastening hole 931 may penetrate the first inner surface 930a1.

Figure 59:
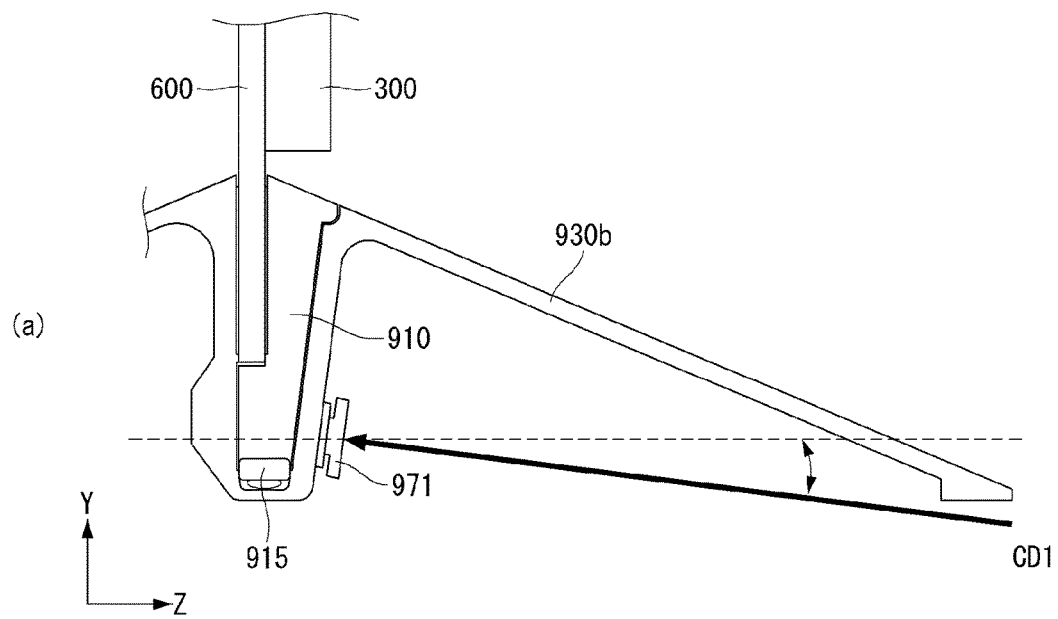
FIG. 59 illustrates that a fixing member is fastened to a stand in a first direction or a second direction in accordance with an embodiment of the disclosure.
Figure 59:
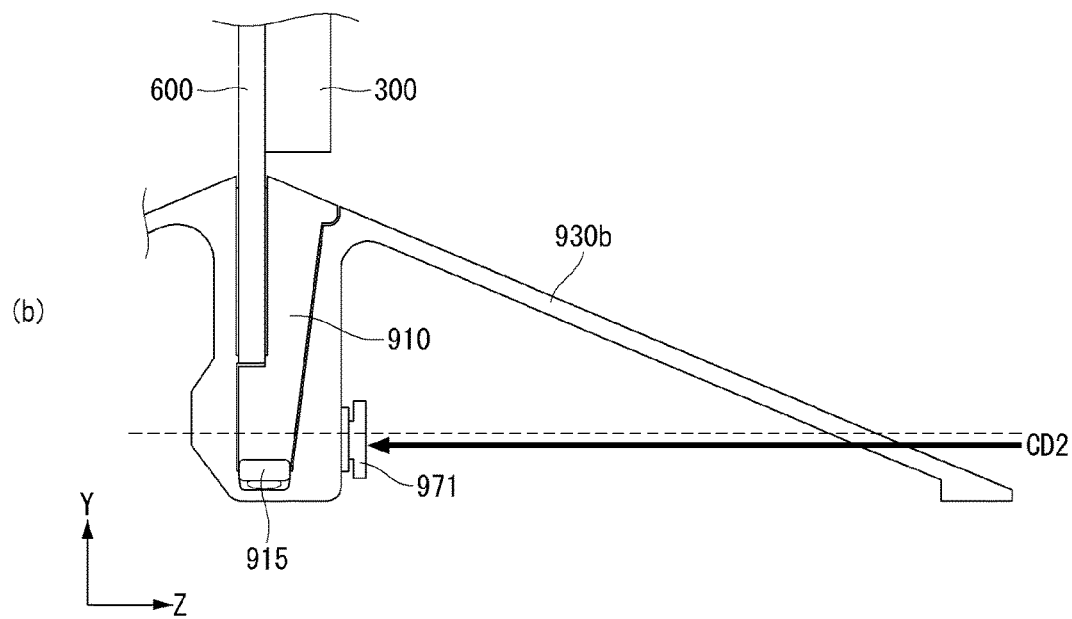

Referring to (a) of FIG. 59, the fixing member 970 may be fastened to the base fastening hole 931 in the first direction CD1. Namely, because the first base 930a and the second base 930b each have the gradually decreasing height as they are away from the body 930c, the fixing member 970 and the base fastening hole 931 may be inclined in the first direction CD1 and fastened to each other. In embodiments disclosed herein, the second base 930b may be inclined in a predetermined oblique direction from the body 930c. In this instance, the predetermined oblique direction may be substantially the same direction as the first direction CD1. Namely, the predetermined oblique direction may be a direction inclined by about 10° to 20° with respect to the horizontal direction X.

As described above, the base fastening hole 931 and the supporter fastening hole 911 of the stand 900 may be inclined along the first direction CD1 and may be fastened to the fixing member 970 in the first direction CD1. Hence, the user cannot be disturbed by the second base 930b when fastening the fixing member 970 to the base fastening hole 931. As a result, the user can more easily press the stand base 930 to the stand supporter 910, thereby fixing the plate 600.

Referring to (b) of FIG. 59, the fixing member 970 may be fastened to the base fastening hole 931 in a second direction CD2. The second direction CD2 may be the horizontal direction X, unlike the first direction CD1. Thus, the base fastening hole 931 and the supporter fastening hole 911 may be formed in the stand 900 in the second direction CD2, and the fastening member 970 may be fastened to the base fastening hole 931 in the second direction CD2.

The user may be disturbed by the second base 930*b* inclined in the first direction CD1 when fastening the fixing member 970 to the base fastening hole 931 formed in the second direction CD2 with a tool. Namely, because the user may be disturbed by the inclined second base 930*b* when fastening the fixing member 970 using the tool, the user cannot easily fasten the fixing member 970 to the base fastening hole 931.

Figure 60:
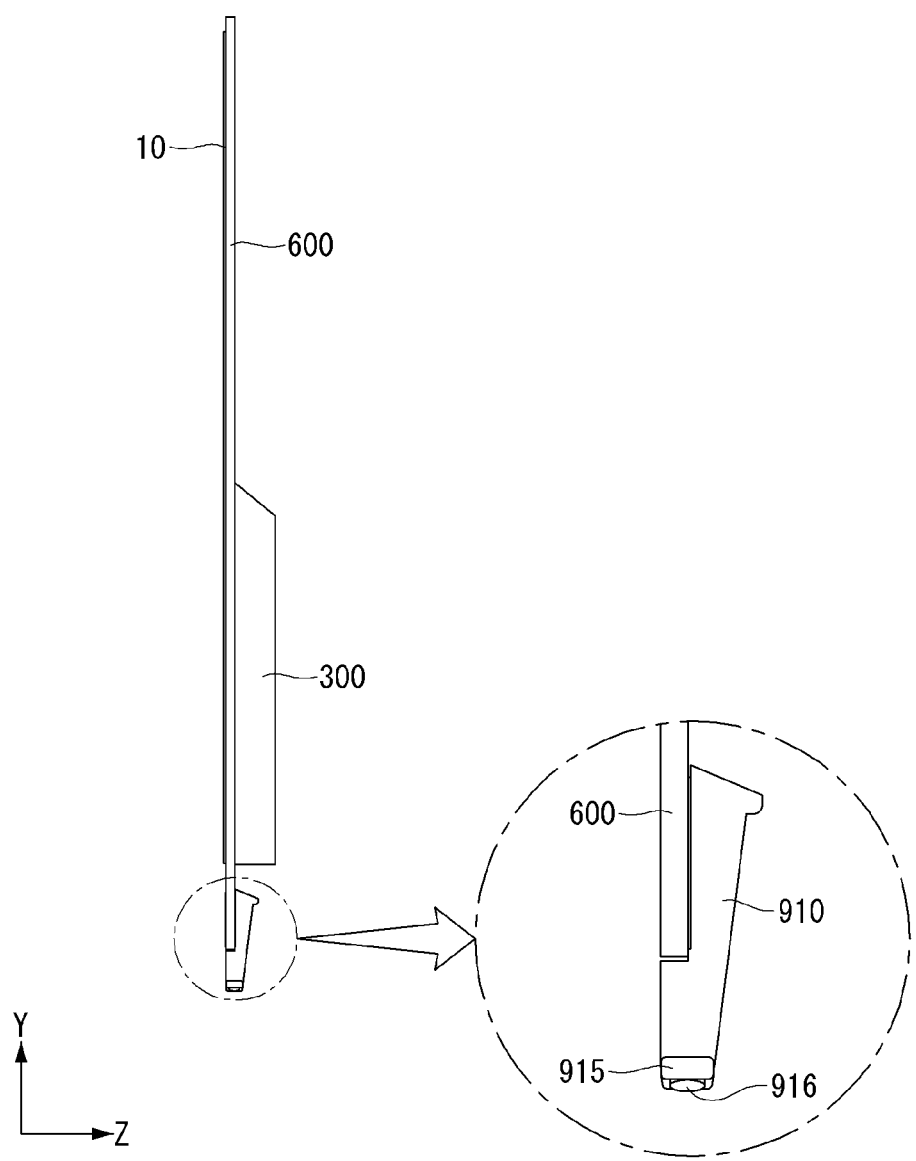
FIG. 60 illustrates another example of a stand supporter according to an embodiment of the disclosure.

Referring to FIG. 60, one surface of the stand supporter 910 may be fastened to the rear surface of the plate 600.

The stand supporter 910 may be fastened to the rear surface of the plate 600. The stand supporter 910 may be guided along the guide line G and may be detachably attached to the plate 600.

For example, the stand supporter 910 may be formed of gel or silicon. Because the stand supporter 910 is formed of gel or silicon, the stand supporter 910 can be easily attached to and detached from the plate 600. Because the stand supporter is simply attached to the plate 600 until the stand supporter 910 is fastened to the stand base 930, the assembly process can be simplified.

Namely, when the stand supporter 910 is formed of gel or silicone, the stand supporter 910 can be easily attached to and detached from the plate 600 even if there is no adhesive member 901 between the plate 600 and the stand supporter 910. Hence, the assembly process of the components can be simplified, and the assembly time can be reduced.

Figure 61:
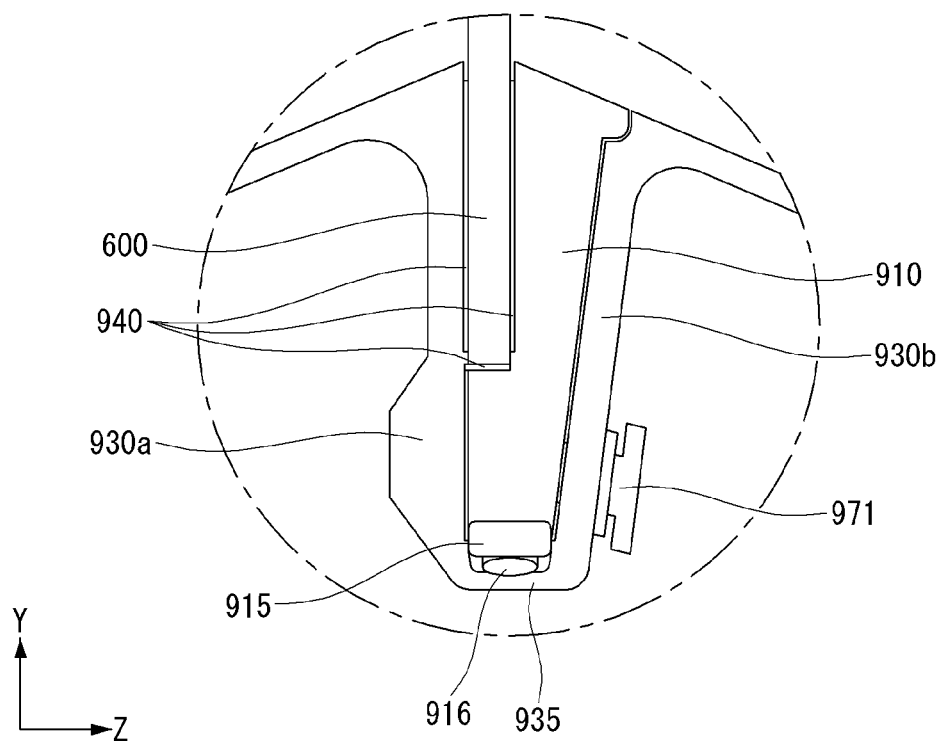
FIG. 61 illustrates a buffer member according to an embodiment of the disclosure.

Referring to FIG. 61, the stand 900 (see FIG. 49) may be fastened to the center of the lower end of the rear surface of the plate 600. A buffer member 940 may be formed between the stand 900 and the plate 600.

The buffer member 940 may be formed on at least one of the front surface and the rear surface of the plate 600.

The buffer member 940 may be formed between the first inner surface 930*a*1 (see FIG. 52A) of the body 930*c* (see FIG. 52A) and the front surface of the plate 600 and may be formed between the rear surface of the plate 600 and the second inner surface 930*b*1 (see FIG. 52A) of the body 930*c*.

The buffer member 940 may include a buffer material such as gel or silicon. The buffer member 940 between the plate 600 and the stand 900 can buffer a vibration or an impact generated by the swing of the plate 600, thereby preventing the plate 600 from being damaged.

FIG. 61 illustrates that the buffer member 940 is formed between the rear surface of the plate 600 and the second inner surface 930*b*1 of the body 930*c*, by way of example. However, embodiments are not limited thereto. For example, the adhesive member 901 (see FIG. 50) may be disposed instead of the buffer member 940.

Alternatively, the adhesive member 901 (see FIG. 50) may be formed between the rear surface of the plate 600 and the buffer member 940, or may be formed between the buffer member 940 and the stand supporter 910. Hence, the adhesive member 901 can prevent the above components from being arbitrarily separated from each other while attaching and detaching the above components.

In one aspect, there is provided a display device comprising a display panel, a module cover positioned at a rear of the display panel and coupled to the display panel, a plate positioned at a rear of the module cover, an adhesive member attached to at least a part of a front surface of the plate, a bracket positioned between the module cover and the plate and attached to the adhesive member, and a coupling unit positioned between the module cover and the bracket and fixing the module cover to the bracket.

According to another aspect of the present disclosure, the coupling unit may include a fixing pin on a front surface of the bracket, and a fastening groove positioned on a rear surface of the module cover and coupled to the fixing pin.

According to another aspect of the present disclosure, the bracket may include an opening penetrating a portion of the bracket, and a pipe wall protruding toward a front of the bracket around the opening. The fixing pin may include a pin neck facing the front surface of the bracket, and a pin head extended from the pin neck and spaced apart from the pin neck toward the front of the bracket.

According to another aspect of the present disclosure, the pin neck may be positioned outside the pipe wall, and a front end of the pipe wall may be bent and positioned between the pin head and the pin neck.

According to another aspect of the present disclosure, the fixing pin may further include a fixing hole in a lower surface of the fixing pin. A front end of the pipe wall may be bent, and an outer circumferential surface of the pipe wall may contact a front surface of the pin neck.

According to another aspect of the present disclosure, the pin head may have a first diameter, the pin neck may have a second diameter less than the first diameter, and the fixing hole may have a third diameter less than the second diameter.

According to another aspect of the present disclosure, the fixing pin may include a first fixing pin and a second fixing pin. The first fixing pin may be positioned at one of a left upper end and a right upper end of the front surface of the bracket, and the second fixing pin may be positioned at the other of the left upper end and the right upper end of the front surface of the bracket.

According to another aspect of the present disclosure, the bracket may include an upper bracket positioned at an upper side of the front surface of the plate and extended in a left-right direction, and a lower bracket disposed near a lower corner of the front surface of the plate. The fixing pin may include first to fourth fixing pins. The first fixing pin may be disposed on one of left and right sides of the upper bracket, and the second fixing pin may be disposed on the other of the left and right sides of the upper bracket. The third fixing pin may be disposed on one side of the lower bracket positioned on a lower left side or a lower right side of the plate, and the fourth fixing pin may be disposed on the other side of the lower bracket positioned on the lower left side or the lower right side of the plate.

According to another aspect of the present disclosure, the display device may further comprise a coupling auxiliary member between the module cover and the bracket, the coupling auxiliary member having magnetic properties.

According to another aspect of the present disclosure, at least one coupling auxiliary member may be attached to a rear surface of the module cover or a front surface of the bracket.

According to another aspect of the present disclosure, the adhesive member may include an upper adhesive member positioned between the upper bracket and the plate and attaching the upper bracket to the upper side of the front surface of the plate, and a lower adhesive member positioned between the lower bracket and the plate and attaching the lower bracket to the lower corner of the front surface of the plate.

According to another aspect of the present disclosure, the display device may further comprise a reinforced film at the rear of the module cover, the reinforced film being attached to the front surface or a rear surface of the plate.

In another aspect, there is provided a display device comprising a display panel, a module cover positioned at a rear of the display panel and coupled to the display panel, a plate positioned at a rear of the module cover and fixed to the module cover, and a stand fixed to a lower end of the plate, the stand including a body extended in a thickness direction of the plate, a support portion positioned adjacent to a front surface of the plate and extended from an upper surface of the body in an upward direction of the stand, a support guide portion positioned adjacent to a rear surface of the plate, protruding from the upper surface of the body in an upward direction of the stand, and having an inclined surface viewing the rear surface of the plate, and a support adjustment member inserted between the plate and the inclined surface of the support guide portion, the support adjustment member having a first surface facing the rear surface of the plate, and a second surface facing the inclined surface of the support guide portion.

According to another aspect of the present disclosure, the second surface may be closely adhered to an inclined surface of the support adjustment member.

According to another aspect of the present disclosure, the support portion and the first surface of the support adjustment member may be pressed to the plate.

According to another aspect of the present disclosure, the support adjustment member may include a guide protrusion extended from the second surface of the support adjustment member.

According to another aspect of the present disclosure, a fastening adjustment groove may be formed between the support portion and the support guide portion and may be closely adhered to a lower surface of the support adjustment member.

According to another aspect of the present disclosure, a guide groove may be positioned in a contact area of the fastening adjustment groove and the support guide portion and may be recessed in a downward direction, and the guide protrusion may be inserted into the guide groove.

According to another aspect of the present disclosure, a fixed fastening groove corresponding to the fastening adjustment groove may be formed on a lower surface of the body.

According to another aspect of the present disclosure, a fastening adjustment hole may be formed in the fixed fastening groove to penetrate the fixed fastening groove and the fastening adjustment groove, and a fixing member may pass through the fastening adjustment hole and may be fastened to the support adjustment member.

According to another aspect of the present disclosure, the fastening adjustment hole may be extended, and the fixing member may be movable in the fastening adjustment hole.

According to another aspect of the present disclosure, the display device may further comprise a buffer member positioned between a rear surface of the support portion and the front surface of the plate and extended along the rear surface of the support portion in the upward direction, or positioned between the rear surface of the plate and a front surface of the support adjustment member and extended along the front surface of the support adjustment member in the upward direction.

In yet another aspect, there is provided a display device comprising a display panel, a module cover positioned at a rear of the display panel and coupled to the display panel, a plate positioned at a rear of the module cover and fixed to the module cover, and a stand fixed to a lower end of the plate, the stand including a front stand extended toward the front in a thickness direction of the plate, a rear stand fastened to a rear surface of the front stand and extended toward the rear in the thickness direction of the plate, a front support extended from an upper surface of the front stand in an upward direction and positioned adjacent to the front surface of the plate, a rear support extended from an upper surface of the rear stand in the upward direction and positioned adjacent to a rear surface of the plate, a fixing member positioned at a lower part of the rear stand and passing through the rear stand in an oblique direction viewing the plate, and a compression member positioned inside the rear support, one surface of the compression member being pressed to the rear surface of the plate by a rotation operation of the fixing member.

According to another aspect of the present disclosure, the display device may comprise a compression adjustment portion capable of accommodating the compression member inside the rear support, wherein a compression adjustment hole may be formed to penetrate a lower surface of the compression adjustment portion and a lower surface of the rear stand in the oblique direction, and the fixing member may pass through the compression adjustment hole and may be fastened to the compression member.

According to another aspect of the present disclosure, the compression member may move inside the compression adjustment portion in an up-down direction.

According to another aspect of the present disclosure, a fastening groove may be formed on a lower side of the rear surface of the front stand, and a fastening protrusion may be formed on a lower side of a front surface of the rear stand. The fastening groove may be recessed toward the front, and the fastening protrusion may be inserted into the fastening groove.

In still yet another aspect, there is provided a display device comprising a display panel, a module cover positioned at a rear of the display panel and coupled to the display panel, a plate positioned at a rear of the module cover and fixed to the module cover, and a stand fixed to a lower end of the plate, the stand including a body facing a front surface and a rear surface of a lower part of the plate, a first wing plate extended from an upper part of the body facing the front surface of the plate toward a front and a lower part of the plate, and a second wing plate extended from the upper part of the body facing the rear surface of the plate toward a rear and the lower part of the plate.

According to another aspect of the present disclosure, the display may comprise a stand supporter inserted between the body and the plate and contacting the plate.

According to another aspect of the present disclosure, the body may include a first inner surface facing the plate and a second inner surface facing the stand supporter. The stand supporter may include one surface facing the plate and other surface facing the second inner surface. The second inner surface and the other surface may be inclined in the same direction as an inclined direction of the first wing plate or the second wing plate.

According to another aspect of the present disclosure, the body may include a first inner surface facing the plate and a second inner surface facing the stand supporter. The stand supporter may include an upper region positioned opposite a side of the lower part of the plate and a lower region positioned below the upper region and facing a lower end of the plate According to another aspect of the present disclosure, the upper region and the lower region facing the second inner surface and may be inclined in the same direction as an inclined direction of the first wing plate or the second wing plate.

According to another aspect of the present disclosure, the display device may comprise a fixing member that fastens the body to the stand supporter and penetrates the second inner surface and the lower region.

According to another aspect of the present disclosure, the other surface of the stand supporter may contact the second inner surface.

According to another aspect of the present disclosure, at least one of an adhesive member and a buffer member may be disposed between the plate and the stand supporter.

According to another aspect of the present disclosure, a guide line may be formed below the plate and may align the stand on the plate.

According to another aspect of the present disclosure, the stand may include a base fastening hole penetrating the second inner surface and a supporter fastening hole penetrating the lower region of the stand supporter. The fixing member may be inserted into the base fastening hole and the supporter fastening hole.

According to another aspect of the present disclosure, the stand may include a protrusion protruding toward the second wing plate at an upper end of the stand supporter, and a groove positioned between the second inner surface and the second wing plate and concavely formed on the body The foregoing embodiments are merely examples and are not to be considered as limiting the present disclosure. The present teachings can be readily applied to other types of methods and apparatuses. The features, structures, methods, and other characteristics of the embodiments described herein may be combined in various ways to obtain additional and/or alternative embodiments.

Certain embodiments or other embodiments of the invention described above are not mutually exclusive or distinct from each other. Any or all elements of the embodiments of the invention described above may be combined or combined with each other in configuration or function.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
    a display panel;
    a module cover at a rear of the display panel, the module cover being coupled to the display panel;
    a plate at a rear of the module cover;
    an adhesive member attached to at least a part of a front surface of the plate;
    a bracket between the module cover and the plate, the bracket being attached to the adhesive member and including an opening and a pipe wall formed around the opening; and
    a coupling unit between the module cover and the bracket, the coupling unit including a fixing pin fixing the module cover to the bracket,
    wherein the fixing pin includes a pin neck coupled with the pipe wall and a pin head extended from the pin neck.

2. The display device of claim 1, wherein the coupling unit includes
    a fastening hole on a rear surface of the module cover, the fastening hole being coupled to the fixing pin.

3. The display device of claim 2, wherein:
    the pipe wall protrudes toward a front of the bracket;
    the pin neck faces the front surface of the bracket; and
    the pin head is spaced apart from the pin neck toward the front of the bracket.

4. The display device of claim 3, wherein the pin neck is positioned outside the pipe wall, and
    wherein a front end of the pipe wall is bent and is positioned between the pin head and the pin neck.

5. The display device of claim 3, wherein the fixing pin further includes a fixing hole in a lower surface of the fixing pin, and
    wherein a front end of the pipe wall is bent, and an outer circumferential surface of the pipe wall contacts a front surface of the pin neck.

6. The display device of claim 5, wherein the pin head has a first diameter,
    wherein the pin neck has a second diameter less than the first diameter, and
    wherein the fixing hole has a third diameter less than the second diameter.

7. The display device of claim 3, wherein the fixing pin includes a first fixing pin and a second fixing pin,
    wherein the first fixing pin is positioned at one of a left upper end and a right upper end of the front surface of the bracket, and
    wherein the second fixing pin is positioned at the other of the left upper end and the right upper end of the front surface of the bracket.

8. The display device of claim 3, wherein the bracket includes:
    an upper bracket positioned at an upper side of the front surface of the plate and extended in a left-right direction;
    a first lower bracket disposed near a left lower corner of the front surface of the plate; and
    a second lower bracket disposed near a right lower corner of the front surface of the plate,
    wherein the fixing pin includes first to fourth fixing pins,
    wherein the first fixing pin is disposed adjacent to one of left and right sides of the upper bracket,
    wherein the second fixing pin is disposed adjacent to the other of the left and right sides of the upper bracket,
    wherein the third fixing pin is disposed on the first lower bracket, and
    wherein the fourth fixing pin is disposed on the second lower bracket.

9. The display device of claim 8, wherein the adhesive member includes:
    an upper adhesive member positioned between the upper bracket and the plate and attaching the upper bracket to the front surface of the plate;
    a first lower adhesive member positioned between the first lower bracket and the plate and attaching the first lower bracket to the front surface of the plate; and,
    a second lower adhesive member positioned between the second lower bracket and the plate and attaching the second lower bracket to the front surface of the plate.

10. The display device of claim 1, further comprising a coupling auxiliary member between the module cover and the bracket, the coupling auxiliary member having magnetic properties.

11. The display device of claim 10, wherein the coupling auxiliary member is attached to a rear surface of the module cover or a front surface of the bracket.

12. The display device of claim 1, further comprising a reinforced film at the rear of the module cover, the reinforced film being attached to the front surface or a rear surface of the plate.

* * * * *